(12) United States Patent
Akimoto

(10) Patent No.: US 12,211,883 B2
(45) Date of Patent: Jan. 28, 2025

(54) METHOD FOR MANUFACTURING IMAGE DISPLAY DEVICE AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 410 days.

(21) Appl. No.: 17/585,963

(22) Filed: Jan. 27, 2022

(65) Prior Publication Data

US 2022/0149113 A1 May 12, 2022

Related U.S. Application Data

(63) Continuation of application No. PCT/JP2020/028891, filed on Jul. 28, 2020.

(30) Foreign Application Priority Data

Jul. 30, 2019 (JP) ................... 2019-139858

(51) Int. Cl.
*H01L 33/00* (2010.01)
*H01L 27/15* (2006.01)
(Continued)

(52) U.S. Cl.
CPC .......... *H01L 27/156* (2013.01); *H01L 33/007* (2013.01); *H01L 33/0093* (2020.05);
(Continued)

(58) Field of Classification Search
CPC ......... H01L 2933/058; H01L 2933/066; H01L 33/44; H01L 33/507; H01L 2933/0025;
(Continued)

(56) References Cited

U.S. PATENT DOCUMENTS

2008/0102545 A1 5/2008 Yamagata et al.
2008/0121415 A1 5/2008 Oh
(Continued)

FOREIGN PATENT DOCUMENTS

CN 109887950 A 6/2019
JP 2002-057283 A 2/2002
(Continued)

OTHER PUBLICATIONS

Lee et al. Integration of GaAs, GaN, and Si-CMOS on a common 200 mm Si substrate through multilayer transfer process. Applied Physics Express, 9 (086501) (Year: 2016).*
(Continued)

*Primary Examiner* — Galina G Yushina
(74) *Attorney, Agent, or Firm* — Foley & Lardner LLP

(57) ABSTRACT

A method for manufacturing an image display device includes: providing a second substrate that includes a first substrate, and a semiconductor layer grown on the first substrate, the semiconductor layer including a light-emitting layer; providing a third substrate including: a circuit including a circuit element formed on a light-transmitting substrate, a first insulating film covering the circuit, and a conductive layer including a light-reflective part formed on the first insulating film; bonding the semiconductor layer to the third substrate; forming a light-emitting element from the semiconductor layer; forming a second insulating film covering the conductive layer, the light-emitting element, and the first insulating film; forming a via extending through the first and second insulating films; and electrically connecting the light-emitting element and the circuit element by the via.

10 Claims, 30 Drawing Sheets

(51) Int. Cl.
    *H01L 33/22*     (2010.01)
    *H01L 33/42*     (2010.01)
    *H01L 33/50*     (2010.01)
    *H01L 33/60*     (2010.01)
    *H01L 33/62*     (2010.01)

(52) U.S. Cl.
CPC .............. *H01L 33/22* (2013.01); *H01L 33/42* (2013.01); *H01L 33/50* (2013.01); *H01L 33/60* (2013.01); *H01L 33/62* (2013.01); *H01L 2933/0016* (2013.01); *H01L 2933/0041* (2013.01); *H01L 2933/0058* (2013.01); *H01L 2933/0066* (2013.01)

(58) Field of Classification Search
CPC ... H01L 25/167; H01L 25/0752; H01L 33/24; H01L 27/156; H01L 33/007; H01L 33/0093; H01L 33/22; H01L 33/42; H01L 33/50; H01L 33/60; H01L 33/62; H01L 2933/0016; H01L 2933/041; G09F 9/33
See application file for complete search history.

(56) References Cited

U.S. PATENT DOCUMENTS

| | | | |
|---|---|---|---|
| 2008/0210945 A1* | 9/2008 | Miyairi | H01L 21/02532 438/479 |
| 2010/0210046 A1* | 8/2010 | Kao | H01L 33/385 257/E33.056 |
| 2014/0231842 A1 | 8/2014 | Akimoto et al. | |
| 2018/0012951 A1 | 1/2018 | Sato | |
| 2018/0175268 A1 | 6/2018 | Moon et al. | |
| 2019/0066592 A1 | 2/2019 | Kim | |
| 2019/0131343 A1* | 5/2019 | Templier | H01L 25/0756 |
| 2019/0355766 A1* | 11/2019 | Zhang | H01L 27/1262 |
| 2020/0098952 A1 | 3/2020 | Kajiyama et al. | |

FOREIGN PATENT DOCUMENTS

| | | |
|---|---|---|
| JP | 2002-141492 A | 5/2002 |
| JP | 2007-242645 A | 9/2007 |
| JP | 2008-134594 A | 6/2008 |
| JP | 2008-147608 A | 6/2008 |
| JP | 2014-160736 A | 9/2014 |
| JP | 2016-139560 A | 8/2016 |
| JP | 2018-026442 A | 2/2018 |
| JP | 2018-101785 A | 6/2018 |
| JP | 2018-205456 A | 12/2018 |
| JP | 2019-522894 A | 8/2019 |
| TW | 201913329 A | 4/2019 |
| WO | WO-2016/121698 A1 | 8/2016 |
| WO | WO-2018/132070 A1 | 7/2018 |
| WO | WO-2018/175338 A1 | 9/2018 |
| WO | WO-2019/049360 A1 | 3/2019 |

OTHER PUBLICATIONS

International Search Report dated Oct. 27, 2020 as issued in PCT/JP2020/028891 and English translation (13 pages).

* cited by examiner

METHOD FOR MANUFACTURING IMAGE DISPLAY DEVICE AND IMAGE DISPLAY DEVICE

CROSS-REFERENCE TO RELATED APPLICATIONS

The present application is a bypass continuation of PCT Application No. PCT/JP2020/028891, filed Jul. 28, 2020, which claims priority to Japanese Application No. 2019-139858, filed Jul. 30, 2019. The contents of these applications are hereby incorporated by reference in their entireties.

BACKGROUND

Embodiments of the invention relate to a method for manufacturing an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality, such as full high definition, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a reduction in yield may occur.

In known technology, a semiconductor layer that includes a light-emitting layer is grown on a Si substrate. An electrode is formed at the semiconductor layer. Subsequently, bonding is performed to a circuit board in which a drive circuit is formed (see, e.g., Japanese Patent Publication No. 2002-141492).

SUMMARY

One embodiment of the invention provides a method for manufacturing an image display device in which a transfer process of a light-emitting element is shortened, and yield is increased.

According to one embodiment of the invention, a method for manufacturing an image display device includes a process of preparing a second substrate that includes a semiconductor layer including a light-emitting layer grown on a first substrate, a process of preparing a third substrate that includes a circuit including a circuit element formed on a light-transmitting substrate, a first insulating film covering the circuit, and a conductive layer including a light-reflective part formed on the first insulating film, a process of bonding the semiconductor layer to the third substrate, a process of forming a light-emitting element from the semiconductor layer, a process of forming a second insulating film covering the conductive layer, the light-emitting element, and the first insulating film, a process of forming a via extending through the first and second insulating films, and a process of electrically connecting the light-emitting element and the circuit element by the via. The light-emitting element is located on the part. In a plan view, an outer perimeter of the light-emitting element, when projected onto the light-reflective part, is located within an outer perimeter of the light-reflective part.

According to another embodiment of the invention, an image display device includes a light-transmitting substrate including a first surface, a circuit element located on the first surface, a first wiring layer electrically connected to the circuit element, a first insulating film covering the circuit element and the first wiring layer on the first surface, a conductive layer including a light-reflective part located on the first insulating film, a first light-emitting element located on the part and electrically connected to the part, a second insulating film covering the first insulating film, the conductive layer, and at least a portion of the first light-emitting element, a second wiring layer that is located on the second insulating film and electrically connected to a surface of the first light-emitting element including a light-emitting surface opposite to a surface of the first light-emitting element at the first insulating film side, and a first via that extends through the first and second insulating films and electrically connects the first wiring layer and the second wiring layer. In a plan view, an outer perimeter of the first light-emitting element, when projected onto the light-reflective part, is located within an outer perimeter of the light-reflective part.

According to another embodiment of the invention, an image display device includes a flexible substrate including a first surface, a circuit element located on the first surface, a first wiring layer electrically connected to the circuit element, a first insulating film covering the circuit element and the first wiring layer on the first surface, a conductive layer including a light-reflective part located on the first insulating film, a first light-emitting element located on the part and electrically connected to the part, a second insulating film covering the first insulating film, the conductive layer, and at least a portion of the first light-emitting element, a second wiring layer that is located on the second insulating film and electrically connected to a surface of the first light-emitting element including a light-emitting surface opposite to a surface of the first light-emitting element at the first insulating film side, and a first via that extends through the first and second insulating films and electrically connects the first wiring layer and the second wiring layer. In a plan view, an outer perimeter of the first light-emitting element, when projected onto the light-reflective part, is located within an outer perimeter of the light-reflective part.

According to another embodiment of the invention, an image display device includes a light-transmitting substrate including a first surface, multiple transistors located on the first surface, a first wiring layer electrically connected to the multiple transistors, a first insulating film covering the multiple transistors and the first wiring layer on the first surface, a conductive layer including a light-reflective part located on the first insulating film, a first semiconductor layer that is located on the part, is electrically connected to the part and is of a first conductivity type, a light-emitting layer located on the first semiconductor layer, a second semiconductor layer that is located on the light-emitting layer and is of a second conductivity type that is different from the first conductivity type, a second insulating film that covers the first insulating film, the light-emitting layer, and the first semiconductor layer and covers at least a portion of the second semiconductor layer, a second wiring layer connected to a light-transmitting electrode located on multiple light-emitting surfaces of the second semiconductor layer that are exposed from the second insulating film to correspond respectively to the multiple transistors, and multiple vias that extend through the first and second insulating films and electrically connect a wiring portion of the first wiring layer and a wiring portion of the second wiring layer. In a plan view, an entire outer perimeter of the first semiconductor layer, the light-emitting layer, and the second semiconductor layer, when projected onto the light-reflective part, is located within an outer perimeter of the light-reflective part.

According to certain embodiments of the invention, a method for manufacturing an image display device may be realized in which a transfer process of a light-emitting element is shortened, and yield is increased.

DETAILED DESCRIPTION

Figure 1:
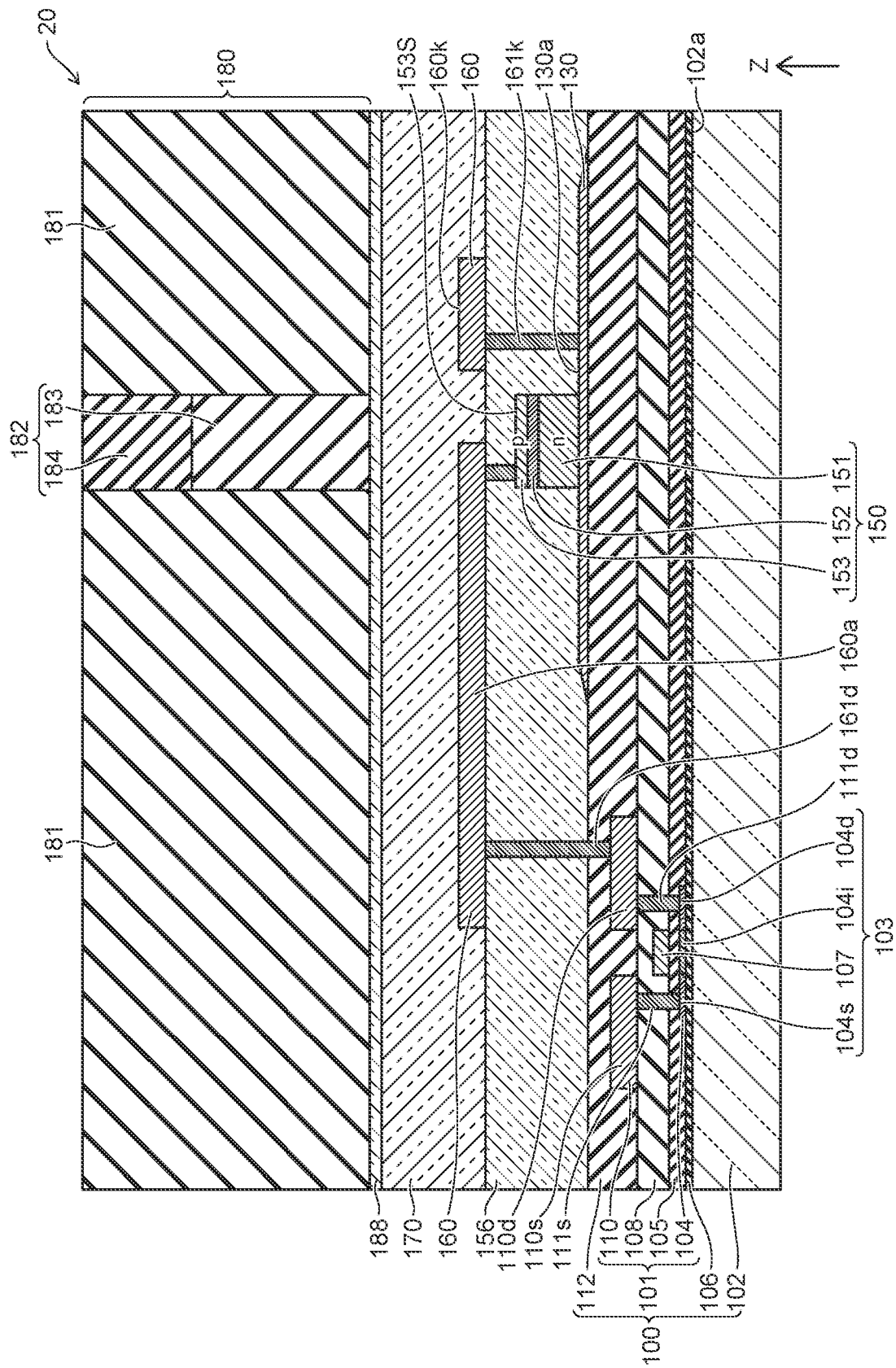
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are marked with the same reference numerals, and a detailed description is omitted as appropriate.

First Embodiment

FIG. 1 is a schematic cross-sectional view illustrating a portion of an image display device according to an embodiment.

The configuration of a subpixel 20 of the image display device of the embodiment is schematically shown in FIG. 1. A pixel 10 that is included in an image displayed in the image display device includes multiple subpixels 20.

Hereinbelow, the description may use an XYZ three-dimensional coordinate system. The subpixels 20 are arranged on a two-dimensional plane. The two-dimensional plane in which the subpixels 20 are arranged is taken as an XY plane. The subpixels 20 are arranged along an X-axis direction and a Y-axis direction. FIG. 1 illustrates an auxiliary cross section along line AA' of FIG. 4 described below, and is a cross-sectional view in which cross sections of multiple planes perpendicular to the XY plane are linked as one. In the other drawings as well, as in FIG. 1, in a cross-sectional view of multiple planes perpendicular to the XY plane, the X-axis and the Y-axis are not illustrated, and a Z-axis that is perpendicular to the XY plane is shown. That is, in these drawings, the plane perpendicular to the Z-axis is taken as the XY plane.

The subpixel 20 includes a light-emitting surface 153S that is substantially parallel to the XY plane. The light-emitting surface 153S radiates light mainly toward the positive direction of the Z-axis orthogonal to the XY plane.

As shown in FIG. 1, the subpixel 20 of the image display device includes a substrate 102, a transistor 103, a first wiring layer 110, a first inter-layer insulating film 112, a light-emitting element 150, a second inter-layer insulating film 156, a conductive layer 130, multiple vias 161d and 161k, and a second wiring layer 160.

According to the embodiment, the substrate 102 at which the circuit element including the transistor 103 is formed is a light-transmitting substrate, e.g., a glass substrate. The substrate 102 includes a first surface 102a, and a thin film transistor (Thin Film Transistor, TFT) is formed as the transistor 103 on the first surface 102a. The light-emitting element 150 is driven by the TFT formed on the glass substrate. The process of forming the circuit element that includes the TFT on a large glass substrate is advantageous in that the process is established for manufacturing a liquid crystal panel, an organic EL panel, etc., and an existing plant can be utilized.

The subpixel 20 further includes a color filter 180. The color filter (the wavelength conversion member) 180 is located on a surface resin layer 170 with a transparent thin film adhesive layer 188 interposed. The surface resin layer 170 is located on the inter-layer insulating film 156 and the wiring layer 160.

The transistor 103 is formed on a TFT lower layer film 106 formed on the first surface 102a of the substrate 102. The TFT lower layer film 106 is provided to ensure the flatness when forming the transistor 103 and to protect a TFT channel 104 of the transistor 103 from contamination, etc., when heating. The TFT lower layer film 106 is, for example, $SiO_2$, etc.

Other than the drive transistor 103 of the light-emitting element 150, other circuit elements such as transistors, capacitors, etc., are formed in the substrate 102, and a circuit 101 is configured using wiring portions, etc. For example, the transistor 103 corresponds to a drive transistor 26 shown in FIG. 3 described below; also, a select transistor 24, a capacitor 28, etc., are circuit elements.

In the example, the circuit 101 includes the TFT channel 104, an insulating layer 105, an insulating film 108, vias 111s and 111d, and the wiring layer 110. The substrate 102, the TFT lower layer film 106, the circuit 101, the inter-layer insulating film 112, and other components may be inclusively called a circuit board 100.

In the example, the transistor 103 is a p-channel TFT. The transistor 103 includes the TFT channel 104 and a gate 107. It is favorable for the TFT to be formed by a low-temperature polysilicon (Low Temperature Poly Silicon, LTPS) process. The TFT channel 104 is a region of polycrystalline Si formed on the substrate 102 in which a region that is formed as amorphous Si is polycrystallized and activated by annealing by laser irradiation. The TFT that is formed by the LTPS process has a sufficiently high mobility.

The TFT channel 104 includes regions 104s, 104i, and 104d. The regions 104s, 104i, and 104d each are located on the TFT lower layer film 106. The region 104i is located between the regions 104s and 104d. The regions 104s and 104d are doped with a p-type impurity such as boron ions ($B^+$), boron fluoride ions ($BF_2^+$), etc., and have ohmic connections with the vias 111s and 111d.

The gate 107 is located on the TFT channel 104 with the insulating layer 105 interposed. The insulating layer 105 is provided to insulate the TFT channel 104 and the gate 107 and to insulate from the adjacent other circuit elements. The current that flows between the regions 104s and 104d can be controlled by a channel that is formed in the region 104i when a potential that is less than that of the region 104s is applied to the gate 107.

The insulating layer 105 is, for example, $SiO_2$. The insulating layer 105 may be a multilevel insulating layer that includes $SiO_2$, $Si_3N_4$, etc., according to the covered region.

The gate 107 is, for example, polycrystalline Si. The polycrystalline Si film of the gate 107 can be made by a general CVD process.

In the example, the gate 107 and the insulating layer 105 are covered with the insulating film 108. The insulating film 108 is, for example, $SiO_2$, $Si_3N_4$, etc. The insulating film 108 functions as a planarization film for forming the wiring layer 110. The insulating film 108 is, for example, a multilayer insulating film that includes $SiO_2$, $Si_3N_4$, etc.

The vias 111s and 111d are provided to extend through the insulating film 108. The first wiring layer (the first wiring layer) 110 is formed on the insulating film 108. The first wiring layer 110 includes multiple wiring portions that may have different potentials, and includes wiring portions 110s and 110d. For the wiring layers in FIG. 1 and subsequent cross-sectional views, the reference numeral of the wiring layer to be marked with a reference numeral is displayed at a position beside one wiring portion included in the wiring layer.

The vias 111s and 111d are located respectively between the wiring portions 110s and 110d and the regions 104s and 104d and electrically connect the wiring portions 110s and 110d and the regions 104s and 104d.

In the example, the wiring portion 110s electrically connects the region 104s that is a source region of the transistor 103 to a power supply line 3 shown in FIG. 3 described below. As described below, the wiring portion 110d is electrically connected to a p-type semiconductor layer 153 at the light-emitting surface 153S side of the light-emitting element 150 by the via 161d and a wiring portion 160a.

For example, the wiring layer 110 and the vias 111s and 111d are formed of Al, an alloy of Al, a stacked film of Al and Ti, etc. For example, in the stacked film of Al and Ti, Al is stacked on a thin film of Ti, and Ti is further stacked on the Al.

The inter-layer insulating film 112 is located on the insulating film 108 and the wiring layer 110. The inter-layer insulating film (the first insulating film) 112 is, for example, an organic insulating film of PSG (Phosphorus Silicon Glass), BPSG (Boron Phosphorus Silicon Glass), etc. The inter-layer insulating film 112 is provided to realize a uniform bond in wafer bonding. The inter-layer insulating film 112 also functions as a protective film that protects the surface of the circuit board 100.

The conductive layer 130 is located on the inter-layer insulating film 112. The conductive layer 130 includes a light-reflecting plate (a part) 130a. The light-reflecting plate 130a is located in each subpixel, and the multiple light-reflecting plates 130a are not connected to each other by the conductive layer 130. In the example as described below, the multiple light-reflecting plates 130a are connected to a ground line by the via 161k and a wiring portion 160k.

The conductive layer 130, including the light-reflecting plate 130a, is formed of a material that has a high conductivity. The conductive layer 130 and the light-reflecting plate 130a include, for example, Ti, Al, an alloy of Ti and Sn, etc. Cu, V, or the like, or a noble metal that has a higher light reflectance such as Ag, Pt, etc., may be included. Because the light-reflecting plate 130a is formed of such a metal material or the like that has a high conductivity, the light-emitting element 150 and the circuit 101 are electrically connected with a low resistance.

The outer perimeter of the light-emitting element 150, when projected onto the XY plane, is located within the outer perimeter of the light-reflecting plate 130a, when the light-emitting element 150 is projected from above along the Z-axis, i.e., when projected onto the XY plane. By appropriately selecting the material of the light-reflecting plate 130a, the luminous efficiency can be increased by reflecting the downward-scattered light of the light-emitting element 150 toward the light-emitting surface 153S side.

The light-reflecting plate 130a can prevent the downward-scattered light of the light-emitting element 150 from reaching the transistor 103 by reflecting the downward-scattered light of the light-emitting element 150 toward the light-emitting surface 153S side. By the light-reflecting plate 130a shielding the downward-scattered light of the light-emitting element 150, the light that reaches the transistor 103 can be suppressed, and malfunction of the transistor 103 also can be prevented.

The light-emitting element 150 includes an n-type semiconductor layer (a first semiconductor layer) 151, a light-emitting layer 152, and the p-type semiconductor layer (the second semiconductor layer) 153. The n-type semiconductor layer 151, the light-emitting layer 152, and the p-type semiconductor layer 153 are stacked in this order from the inter-layer insulating film 112 side toward the light-emitting surface 153S side.

Although the light-emitting element 150 has, for example, a substantially square or rectangular shape when projected onto the XY plane, the corners may be rounded. The light-emitting element 150 may have, for example, an elliptical shape or a circular shape when projected onto the XY plane. The degree of freedom of the layout is increased by appropriately selecting the shape, arrangement, and the like of the light-emitting element in a plan view.

It is favorable for the light-emitting element 150 to include, for example, a nitride semiconductor such as $In_XAl_YGa_{1-X-Y}N$ ($0 \leq X$, $0 \leq Y$, and $X+Y<1$), etc. According to one embodiment of the invention, the light-emitting element 150 is a semiconductor part of a so-called blue light-emitting diode, and the wavelength of the light emitted by the light-emitting element 150 is, for example, about 467 nm±20 nm. The wavelength of the light emitted by the light-emitting element 150 may be a bluish-violet light emission of about 410 nm±20 nm. The wavelength of the light emitted by the light-emitting element 150 is not limited to the values described above, and can be set to an appropriate value.

The second inter-layer insulating film 156 covers the first inter-layer insulating film 112, the conductive layer 130, and the light-emitting element 150. For example, the inter-layer insulating film 156 is formed of a transparent organic insulating material, etc. A silicon resin such as SOG (Spin On Glass) or the like, a novolak phenolic resin, etc., are used as the transparent resin material. The inter-layer insulating film 156 may be, for example, a $SiO_2$ film formed by ALD (Atomic-layer-deposition), CVD, etc. The inter-layer insulating film 156 protects the light-emitting element 150, the conductive layer 130, etc., from the surrounding environment such as dust, humidity, etc., by covering the light-emitting element 150, the conductive layer 130, etc. The inter-layer insulating film 156 also has the function of insulating the light-emitting element 150, the conductive layer 130, etc., from other conductive substances by covering the light-emitting element 150, the conductive layer 130, etc. It is sufficient for the surface of the inter-layer insulating film 156 to be flat enough that the wiring layer 160 can be formed on the inter-layer insulating film 156.

The via 161k is provided to extend through the second inter-layer insulating film 156. One end of the via 161k is connected to the light-reflecting plate 130a.

The via 161d is provided to extend through the inter-layer insulating films 112 and 156. One end of the via 161d is connected to the wiring portion 110d.

The wiring layer 160 is located on the inter-layer insulating film 156. The wiring layer 160 includes the wiring portions 160a and 160k. The wiring portion 160a is connected to the p-type semiconductor layer 153 via a contact hole made in the inter-layer insulating film 156. That is, the wiring portion 160a is electrically connected to the p-type semiconductor layer 153 at a portion of the surface including the light-emitting surface 153S. The light-emitting surface 153S and the surface including the light-emitting surface 153S are, for example, coplanar.

The wiring portion 160a is connected to another end of the via 161d. Accordingly, the p-type semiconductor layer 153 is electrically connected to the region 104d that is the drain electrode of the transistor 103 via the wiring portion 160a, the via 161d, and the wiring portion 110d.

The wiring portion 160k is connected to another end of the via 161k. The wiring portion 160k is connected to a ground line 4 shown in FIG. 3 described below. Accordingly, the n-type semiconductor layer 151 is connected to the ground line 4 via the light-reflecting plate 130a, the via 161k, and the wiring portion 160k.

The surface resin layer 170 covers the second inter-layer insulating film 156 and the second wiring layer 160. The surface resin layer 170 is a transparent resin, protects the inter-layer insulating film 156 and the wiring layer 160, and provides a planarized surface for bonding the color filter 180.

The color filter 180 includes a light-shielding part 181 and a color conversion part 182. The color conversion part 182 is located directly above the light-emitting surface 153S of the light-emitting element 150 to correspond to the shape of the light-emitting surface 153S. In the color filter 180, the part other than the color conversion part 182 is the light-shielding part 181. The light-shielding part 181 is a so-called black matrix that reduces blur due to color mixing of the light emitted from adjacent color conversion parts 182, etc., and makes it possible to display a sharp image.

The color conversion part 182 is one layer or two layers. A two-layer part is shown in FIG. 1. Whether the color conversion part 182 is one layer or two layers is determined by the color, i.e., the wavelength, of the light emitted by the subpixel 20. When the light emission color of the subpixel 20 is red or green, it is favorable for the color conversion part 182 to be the two layers of a color conversion layer 183 and a filter layer 184 described below. When the light emission color of the subpixel 20 is blue, it is favorable to be one layer.

When the color conversion part 182 is two layers, the first layer that is more proximate to the light-emitting element 150 is the color conversion layer 183, and the second layer is the filter layer 184. That is, the filter layer 184 is stacked on the color conversion layer 183.

The color conversion layer 183 is a layer that converts the wavelength of the light emitted by the light-emitting element 150 into the desired wavelength. When the subpixel 20 emits red, light of the wavelength of the light-emitting element 150, i.e., 467 nm±20 nm, is converted into, for example, light of a wavelength of about 630 nm±20 nm. When the subpixel 20 emits green, light of the wavelength of the light-emitting element 150, i.e., 467 nm±20 nm, is converted into, for example, light of a wavelength of about 532 nm±20 nm.

The filter layer 184 shields the wavelength component of the blue light emission that remains without undergoing color conversion by the color conversion layer 183.

When the color of the light emitted by the subpixel 20 is blue, the subpixel 20 may output the light via the color conversion layer 183, or may output the light as-is without having passed through the color conversion layer 183. When the wavelength of the light emitted by the light-emitting element 150 is about 467 nm±20 nm, the subpixel 20 may output the light without having passed through the color conversion layer 183. When the wavelength of the light emitted by the light-emitting element 150 is 410 nm±20 nm, it is favorable to provide a one-layer color conversion layer 183 to convert the wavelength of the output light into about 467 nm±20 nm.

The subpixel 20 may include the filter layer 184 even when the subpixel 20 is blue. By providing the filter layer 184 in the blue subpixel 20, a micro external light reflection that occurs at the surface of the light-emitting element 150 is suppressed.

(Modification)

Modifications of the configuration of the subpixel will now be described.

Figure 2A:
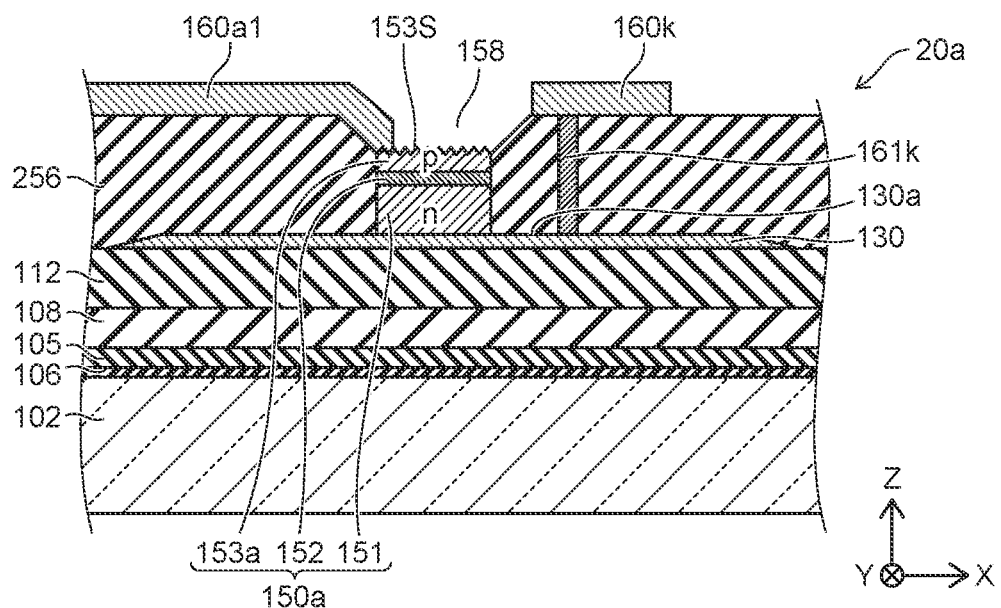
FIG. 2A is a schematic cross-sectional view illustrating a portion of a modification of the image display device of the first embodiment.
Figure 2B:
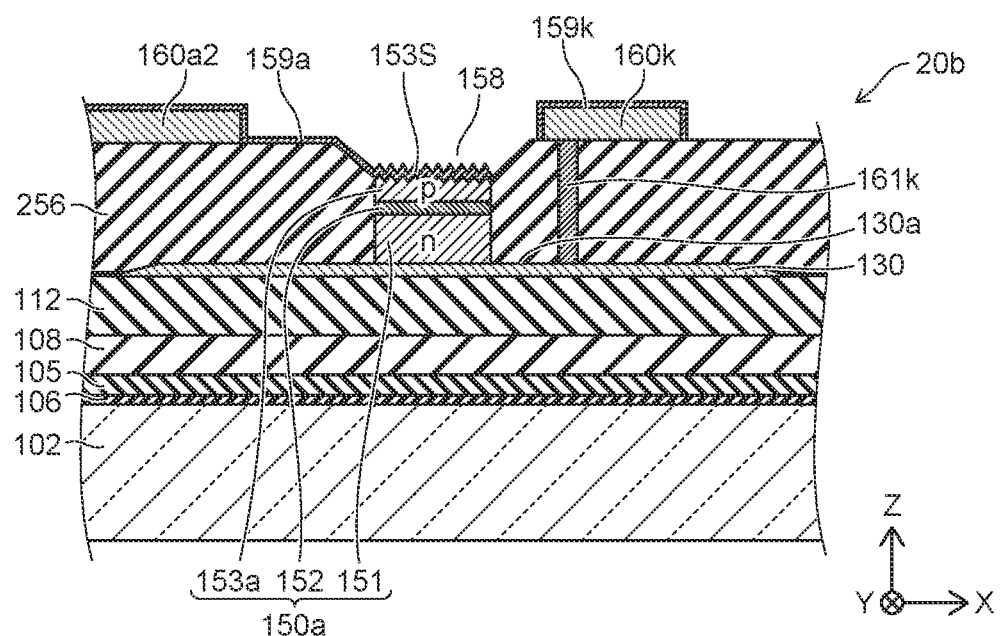
FIG. 2B is a schematic cross-sectional view illustrating a portion of a modification of the image display device of the first embodiment.

FIGS. 2A and 2B are schematic cross-sectional views illustrating portions of modifications of the image display device of the embodiment.

In FIG. 2A and subsequent cross-sectional views of the subpixel, the surface resin layer 170 and the color filter 180 are not illustrated to avoid complexity. Unless specified otherwise, the surface resin layer 170, the color filter 180, etc., are located on the second inter-layer insulating films 156 and 256 and the second wiring layer 160 in subsequent drawings. This is similar for the other embodiments and the modifications of the other embodiments described below as well.

In subpixels 20a and 20b of FIGS. 2A and 2B, the connection method between a light-emitting element 150a and wiring portions 160a1 and 160a2 is different from that of the first embodiment described above. The same components are marked with the same reference numerals, and a detailed description is omitted as appropriate.

As shown in FIG. 2A, the subpixel 20a includes the light-emitting element 150a and the wiring portion 160a1. According to the modification, the conductive layer 130, the first inter-layer insulating film 112, and at least a portion of the light-emitting element 150a are covered with the second inter-layer insulating film (the second insulating film) 256. It is favorable for the second inter-layer insulating film 256 to be a white resin. The inter-layer insulating film 256 that is a white resin can substantially increase the luminous efficiency of the light-emitting element 150a by reflecting the emitted light in the lateral direction of the light-emitting element 150a and the returning light caused by the interface of the color filter 180, etc.

The second inter-layer insulating film 256 may be a black resin. By setting the inter-layer insulating film 256 to be a black resin, the scattering of the light in the subpixel 20a is suppressed, and the stray light is more effectively suppressed. An image display device in which the stray light is suppressed can display a sharper image.

The second inter-layer insulating film 256 includes an opening 158. The opening 158 is formed by removing a portion of the inter-layer insulating film 256 above the light-emitting element 150a. The wiring portion 160a1 extends to a p-type semiconductor layer 153a exposed through the opening 158 and is connected to the p-type semiconductor layer 153a. Similarly to the wiring portion 160a of FIG. 1, the wiring portion 160a1 is connected to the via 161d, and the p-type semiconductor layer 153a is connected to the drain electrode of the transistor 103 via the wiring portion 160a1, the via 161d, and the wiring portion 110d.

The p-type semiconductor layer 153a includes the light-emitting surface 153S that is exposed through the opening 158. The light-emitting surface 153S is the surface of the p-type semiconductor layer 153a at the side opposite to the surface contacting the light-emitting layer 152. It is favorable for the light-emitting surface 153S to be roughened. When the light-emitting surface 153S is a rough surface, the light extraction efficiency of the light-emitting element 150a can be increased.

In the subpixel 20b as shown in FIG. 2B, light-transmitting electrodes 159a and 159k are located respectively on the wiring portions 160a2 and 160k. The light-transmitting electrode 159a extends to the uncovered light-emitting surface 153S of the p-type semiconductor layer 153a. The light-transmitting electrode 159a is located over the light-emitting surface 153S. The light-transmitting electrode 159a electrically connects the wiring portion 160a2 and the p-type semiconductor layer 153a. Similarly to the wiring portion 160a of FIG. 1, the wiring portion 160a2 is connected to the via 161d, and the p-type semiconductor layer 153a is connected to the drain electrode of the transistor 103 via the light-transmitting electrode 159a, the wiring portion 160a1, the via 161d, and the wiring portion 110d.

By providing the light-transmitting electrode 159a on the light-emitting surface 153S, the connection area between the light-transmitting electrode 159a and the p-type semiconductor layer 153a can be increased, and the luminous efficiency can be increased. When the light-emitting surface 153S is a rough surface, the connection area between the light-emitting surface 153S and the light-transmitting electrode 159a can be increased, and the contact resistance can be reduced.

The embodiment can include any of the configurations of the subpixels 20, 20a, and 20b of the description above.

Figure 3:
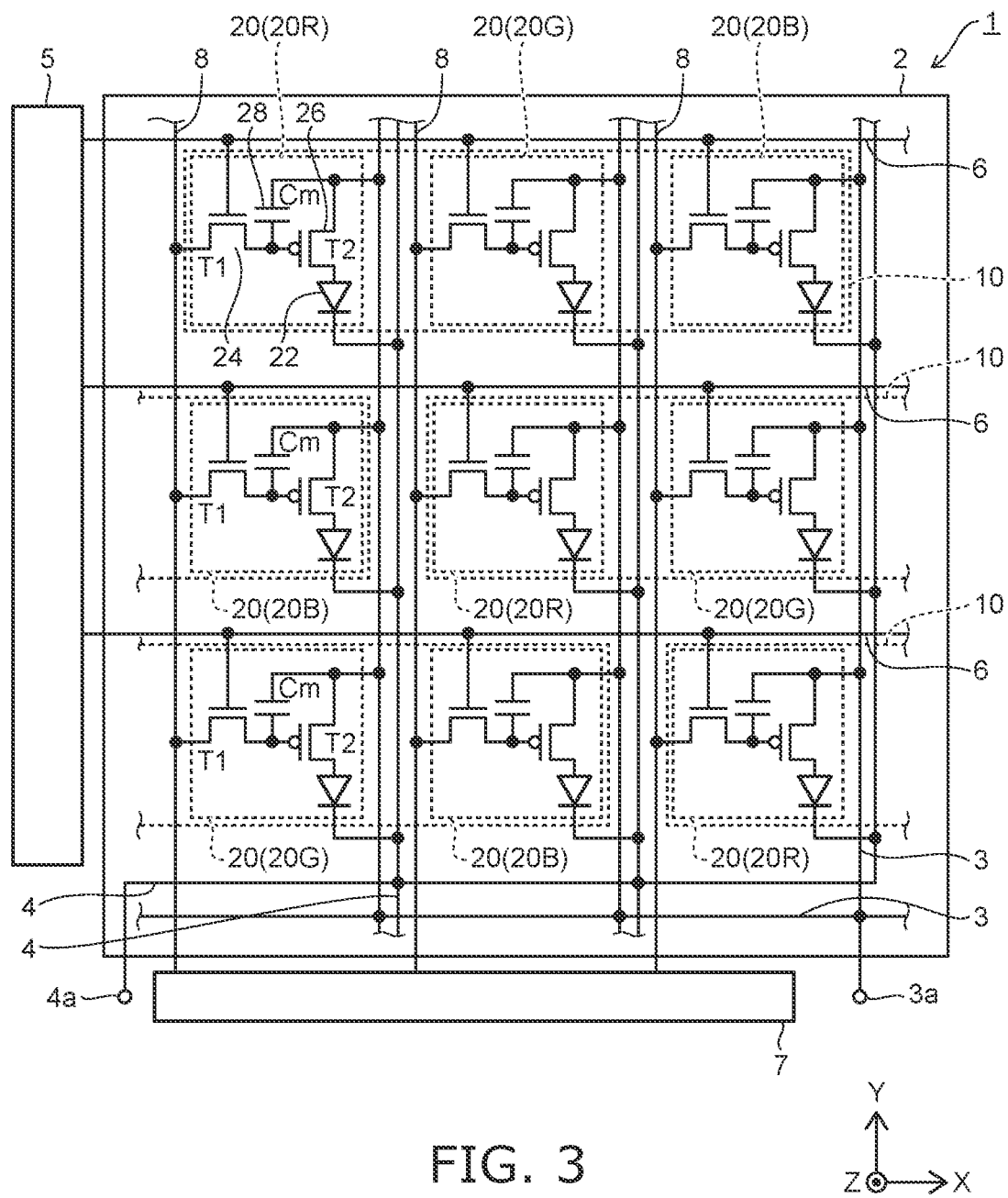
FIG. 3 is a schematic block diagram illustrating the image display device of the first embodiment.

FIG. 3 is a schematic block diagram illustrating the image display device according to the embodiment.

As shown in FIG. 3, the image display device 1 of the embodiment includes a display region 2. The subpixels 20 are arranged in the display region 2. For example, the subpixels 20 are arranged in a lattice shape. For example, n subpixels 20 are arranged along the X-axis, and m subpixels 20 are arranged along the Y-axis.

The pixel 10 includes multiple subpixels 20 that emit light of different colors. A subpixel 20R emits red light. A subpixel 20G emits green light. A subpixel 20B emits blue light. The light emission color and luminance of one pixel 10 are determined by the three types of the subpixels 20R, 20G, and 20B emitting light of the desired luminances.

One pixel 10 includes the three subpixels 20R, 20G, and 20B; for example, the subpixels 20R, 20G, and 20B are arranged in a straight line along the X-axis as in the example shown in FIG. 3. In the pixels 10, subpixels of the same color may be arranged in the same column, or subpixels of different colors may be arranged in each column as in the example.

The image display device 1 further includes the power supply line 3 and the ground line 4. The power supply line 3 and the ground line 4 are wired in a lattice shape along the arrangement of the subpixels 20. The power supply line 3 and the ground line 4 are electrically connected to each subpixel 20, and electrical power is supplied to each subpixel 20 from a direct current power supply connected between a power supply terminal 3a and a GND terminal 4a. The power supply terminal 3a and the GND terminal 4a are located respectively at end portions of the power supply line 3 and the ground line 4, and are connected to a direct current power supply circuit located outside the display region 2. The power supply terminal 3a supplies a positive voltage when referenced to the GND terminal 4a.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the Y-axis direction at the outer edge of the display region 2. The row selection circuit 5 is electrically connected to the subpixel 20 of each column via the scanning line 6, and supplies a select signal to each subpixel 20.

The signal voltage output circuit 7 is located along the X-axis direction at the outer edge of the display region 2. The signal voltage output circuit 7 is electrically connected to the subpixel 20 of each row via the signal line 8, and supplies a signal voltage to each subpixel 20.

The subpixel 20 includes a light-emitting element 22, the select transistor 24, the drive transistor 26, and the capacitor 28. In FIG. 3, the select transistor 24 may be displayed as T1; the drive transistor 26 may be displayed as T2, and the capacitor 28 may be displayed as Cm.

The light-emitting element 22 is connected in series with the drive transistor 26. According to the embodiment, the drive transistor 26 is a p-channel TFT, and an anode electrode that is connected to a p-type semiconductor layer of the light-emitting element 22 is connected to a drain electrode that is a major electrode of the drive transistor 26. The series circuit of the light-emitting element 22 and the drive transistor 26 is connected between the power supply line 3 and the ground line 4. The drive transistor 26 corresponds to the transistor 103 of FIG. 1, etc., and the light-emitting element 22 corresponds to the light-emitting elements 150 and 150a of FIG. 1, etc. The current that flows in the light-emitting element 22 is determined by the voltage that is applied between the gate and source of the drive transistor 26, and the light-emitting element 22 emits light of a luminance corresponding to the current that flows.

The select transistor 24 is connected between the signal line 8 and the gate electrode of the drive transistor 26 via a major electrode. The gate electrode of the select transistor 24 is connected to the scanning line 6. The capacitor 28 is connected between the power supply line 3 and the gate electrode of the drive transistor 26.

The row selection circuit 5 selects one row from the arrangement of m rows of the subpixels 20 and supplies the select signal to the scanning line 6. The signal voltage output circuit 7 supplies a signal voltage that has an analog voltage value necessary for each subpixel 20 of the selected row. The signal voltage is applied between the gate and source of the drive transistor 26 of the subpixels 20 of the selected row. The signal voltage is maintained by the capacitor 28. The drive transistor 26 causes a current that corresponds to the signal voltage to flow in the light-emitting element 22. The light-emitting element 22 emits light of a luminance that corresponds to the current flowing in the light-emitting element 22.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. An image is displayed in the display region 2 by each pixel 10 emitting the light emission color and luminance determined by the light emission color and luminance emitted by the subpixels 20 of the colors of RGB.

Figure 4:
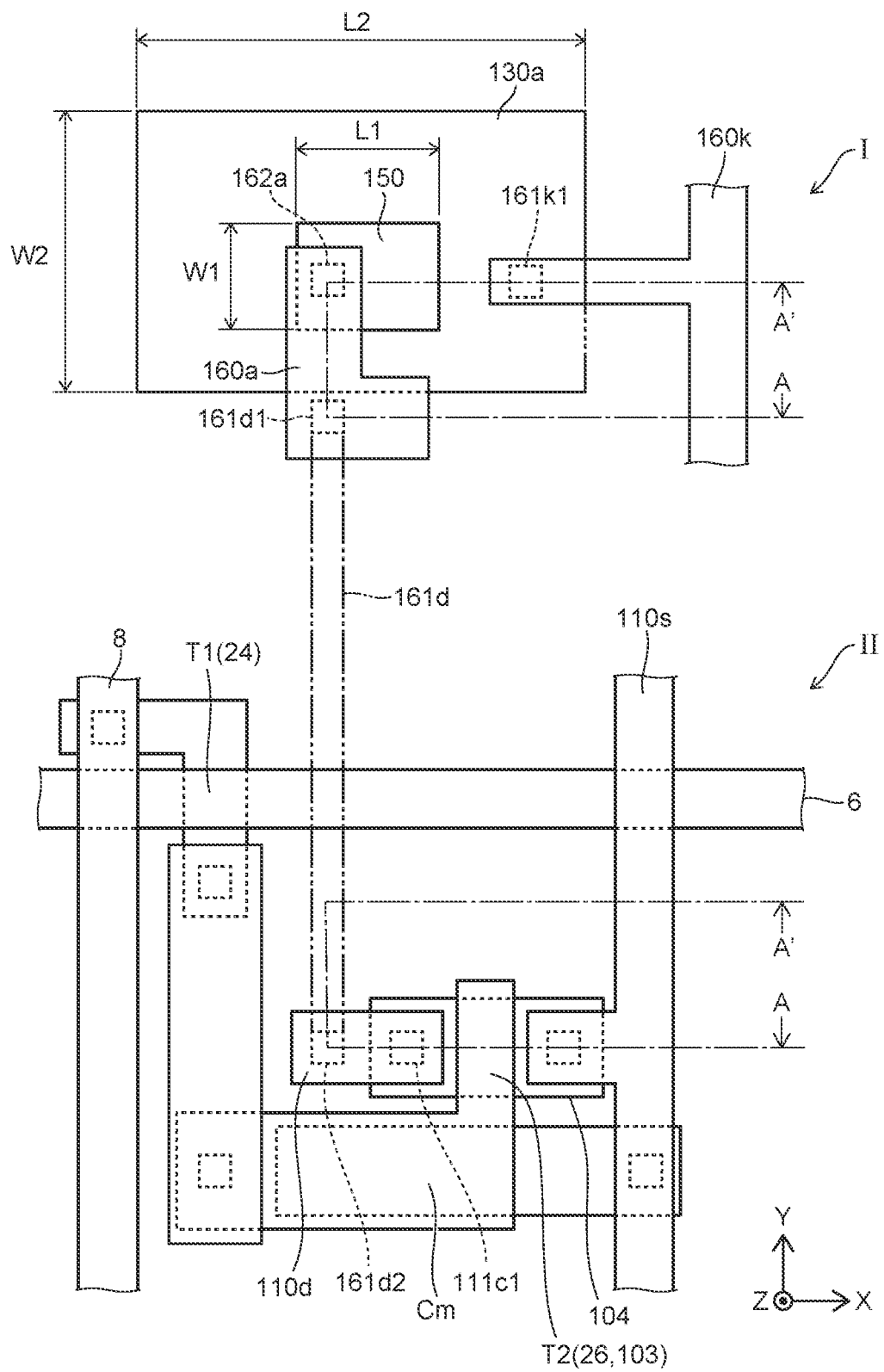
FIG. 4 is a schematic plan view illustrating a portion of the image display device of the first embodiment.

FIG. 4 is a schematic plan view illustrating a portion of the image display device of the embodiment.

According to the embodiment as described in reference to FIG. 1, the light-emitting element 150 (in FIG. 3, the light-emitting element 22) and the drive transistor 103 (in FIG. 3, the drive transistor 26) are stacked in the Z-axis direction, and the anode electrode of the light-emitting element 150 and the drain electrode of the drive transistor 103 are electrically connected by the via 161d. Also, the cathode electrode of the light-emitting element 150 and the ground line 4 shown in FIG. 3 are electrically connected by the via 161k shown in FIG. 1.

A plan view of a Ith layer is schematically displayed in the upper portion of FIG. 4, and a plan view of a IIth layer is schematically displayed in the lower portion. In FIG. 4, the Ith layer is labeled "I", and the second layer is labeled "II". The Ith layer is a layer in which the light-emitting element 150 is formed. In other words, the Ith layer shows the components further toward the positive side of the Z-axis than the first inter-layer insulating film 112 in FIG. 1, and the components are the layers from the n-type semiconductor layer 151 to the second wiring layer 160. The second inter-layer insulating film 156 is not shown in FIG. 4.

The IIth layer shows the components further toward the positive side of the Z-axis than the TFT lower layer film 106 in FIG. 1, and the components are the layers from the transistor 103 to the first inter-layer insulating film 112. The substrate 102, the insulating layer 105, the insulating film 108, and the first inter-layer insulating film 112 are not shown in FIG. 4.

The cross-sectional view of FIG. 1 is an auxiliary cross section along line AA' shown by the zigzagging lines of the single dot-dash lines in each of the Ith layer and the IIth layer.

As shown in FIG. 4, the light-emitting element 150 is connected to the via 161k shown in FIG. 1 by the light-reflecting plate 130a. The via 161k is connected to the wiring portion 160k via a contact hole 161k1.

The light-emitting element 150 is connected to the wiring portion 160a via a contact hole 162a located in the p-type semiconductor layer 153, and the wiring portion 160a is connected to the via 161d via a contact hole 161d1.

The via 161d that extends through the two inter-layer insulating films 112 and 156 is schematically shown by a double dot-dash line in the drawings.

The via 161d is connected to the wiring portion 110d via a contact hole 161d2 located in the first inter-layer insulating film 112. The wiring portion 110d is connected to the via 111d shown in FIG. 1 via a contact hole 111c1 made in the insulating film 108, and is connected to the drain electrode of the transistor 103.

Thus, the light-emitting element 150 and the transistor 103 can be electrically connected by electrically connecting the light-emitting element 150 and the wiring portion 110d that are formed respectively in the Ith layer and the IIth layer that are different layers by the via 161d extending through the inter-layer insulating films 112 and 156.

The arrangement of the light-reflecting plate 130a and the light-emitting element 150 when the light-reflecting plate 130a reflects the downward-scattered light of the light-emitting element 150 toward the light-emitting surface 153S side will now be described using FIG. 4.

The light-reflecting plate 130a is a rectangle having a length L2 in the X-axis direction and a length W2 in the Y-axis direction when projected onto the XY plane. On the other hand, the light-emitting element 150 includes a rectangular bottom surface having a length L1 in the X-axis direction and a length W1 in the Y-axis direction when projected onto the XY plane.

The lengths of the components are set so that W2>W1. The light-reflecting plate 130a is located directly under the light-emitting element 150, and the outer perimeter of the light-reflecting plate 130a includes the outer perimeter of the light-emitting element 150. It is sufficient for the outer perimeter of the light-reflecting plate 130a to include the outer perimeter of the light-emitting element 150; the shape of the light-reflecting plate 130a is not limited to rectangular and can be any appropriate shape according to the layout on the circuit board 100, etc.

The light-emitting element 150 emits light upward, and the downward light emission, the reflected light at the interface between the inter-layer insulating film 112 and the surface resin layer 170, the scattered light, etc., exist. Because the conductive layer 130 includes the light-reflecting plate 130a that is light-reflective, the downward-scattered light of the light-emitting element 150 is reflected upward by the light-reflecting plate 130a. Therefore, the proportion of the light radiated from the light-emitting element 150 that has a light distribution toward the light-emitting surface 153S side increases, and the luminous efficiency of the light-emitting element 150 increases substantially. Also, by thus setting the light-reflecting plate 130a, the light that reaches the region below the light-emitting element 150 is suppressed; therefore, the effects of the light on the circuit element can be reduced even when the circuit element is located at the vicinity directly below the light-emitting element 150.

The conductive layer 130 is not limited to being connected to the ground line 4 by the light-reflecting plate 130a, and may be connected to another potential such as the potential of the power supply line 3, etc., by a circuit configuration and/or a circuit layout.

A method for manufacturing the image display device 1 of the embodiment will now be described.

FIGS. 5A to 9B are schematic cross-sectional views illustrating the method for manufacturing the image display device of the embodiment and modifications of the method for manufacturing the image display device.

Figure 5A:
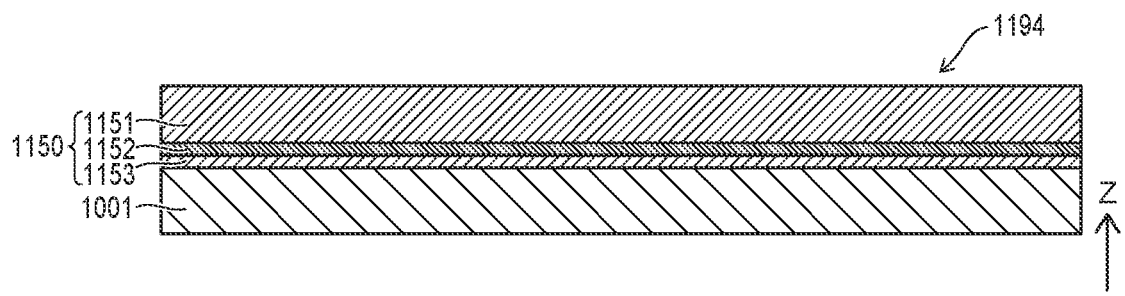
FIG. 5A is a schematic cross-sectional view illustrating a method for manufacturing the image display device of the first embodiment.

As shown in FIG. 5A, a semiconductor growth substrate (a second substrate) 1194 is prepared according to the method for manufacturing the image display device 1 of the embodiment. The semiconductor growth substrate 1194 includes a semiconductor layer 1150 grown on a crystal growth substrate (a first substrate) 1001. The crystal growth substrate 1001 is, for example, a Si substrate, a sapphire substrate, etc. It is favorable to use a Si substrate.

In the semiconductor growth substrate 1194, a p-type semiconductor layer 1153, a light-emitting layer 1152, and an n-type semiconductor layer 1151 are stacked on the crystal growth substrate 1001 in this order from the crystal growth substrate 1001 side. For example, vapor deposition (Chemical Vapor Deposition, CVD) is used to grow the semiconductor layer 1150, and it is favorable to use metal-organic chemical vapor deposition (Metal Organic Chemical Vapor Deposition, MOCVD). The semiconductor layer 1150 is, for example, $In_XAl_YGa_{1-X-Y}N$ ($0 \leq X$, $0 \leq Y$, and $X+Y<1$), etc.

Figure 5B:
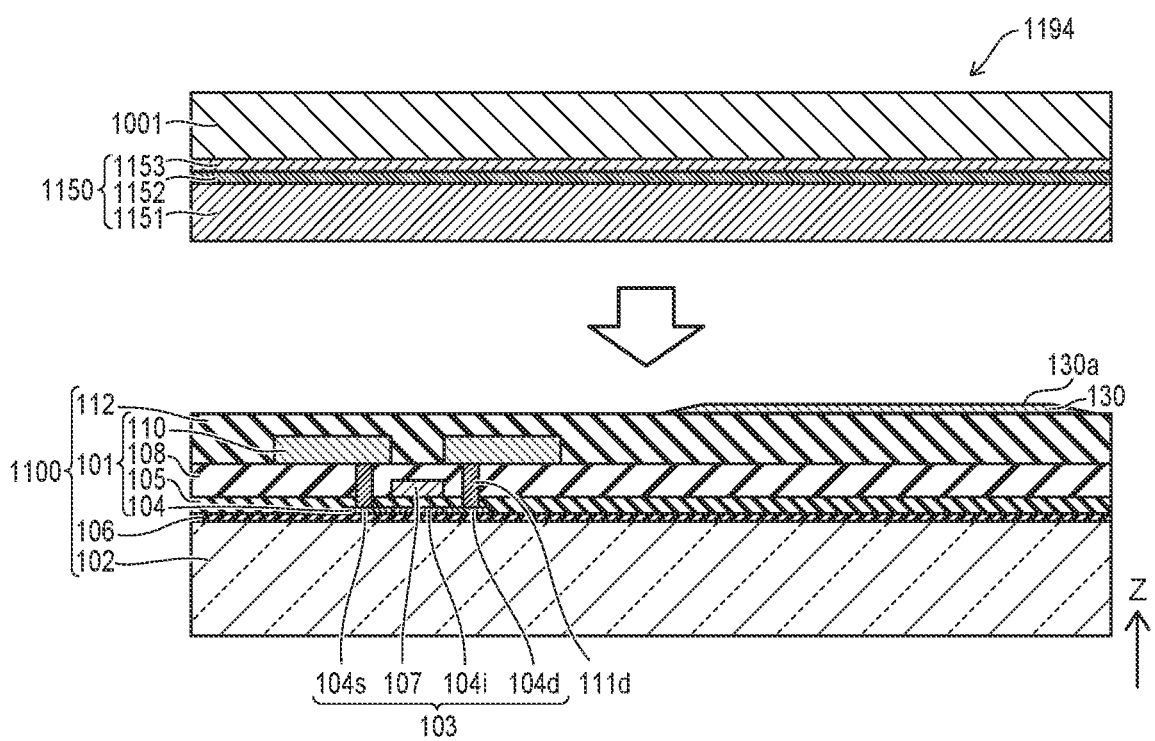
FIG. 5B is a schematic cross-sectional view illustrating the method for manufacturing the image display device of the first embodiment.

A circuit board 1100 is prepared as shown in FIG. 5B. The circuit board (the third substrate) 1100 includes the circuit 101 described with reference to FIG. 1, etc. The conductive layer 130 is formed on the first inter-layer insulating film (the first insulating film) 112 of the circuit board 1100. For example, the conductive layer 130 is formed by sputtering via a mask having an opening at the location at which the light-reflecting plate 130a is to be formed, etc.

The semiconductor growth substrate 1194 is vertically inverted, and is bonded with the circuit board 1100 on which the conductive layer 130 is formed. More specifically, the bonding surface of the semiconductor growth substrate 1194 is the exposed surface of the n-type semiconductor layer 1151. The bonding surface of the circuit board 1100 is the exposed surface of the inter-layer insulating film 112 on which the conductive layer 130 is formed and the surface of the conductive layer 130. These surfaces are caused to face each other, and the two are bonded.

In the wafer bonding that bonds the two substrates, for example, the two substrates are heated, and the two substrates are bonded by thermal compression bonding. A low melting-point metal and/or a low melting-point alloy may be used when performing thermal compression bonding. The low melting-point metal is, for example, Sn, In, etc.; the low melting-point alloy can be, for example, an alloy having Zn, In, Ga, Sn, Bi, etc., as a major component.

In the wafer bonding, other than the description above, the bonding surfaces of the substrates may be cleaned by plasma processing in a vacuum and closely adhered after planarizing the bonding surfaces by chemical mechanical polishing (Chemical Mechanical Polishing, CMP), etc.

Two types of modifications relating to the wafer bonding process are shown in FIGS. 6A to 7B. In the wafer bonding process, the processes of FIGS. 6A to 6C can be used instead of the processes of FIGS. 5A and 5B. Also, the processes of FIGS. 7A and 7B may be used instead of the processes of FIGS. 5A and 5B.

Figure 6A:
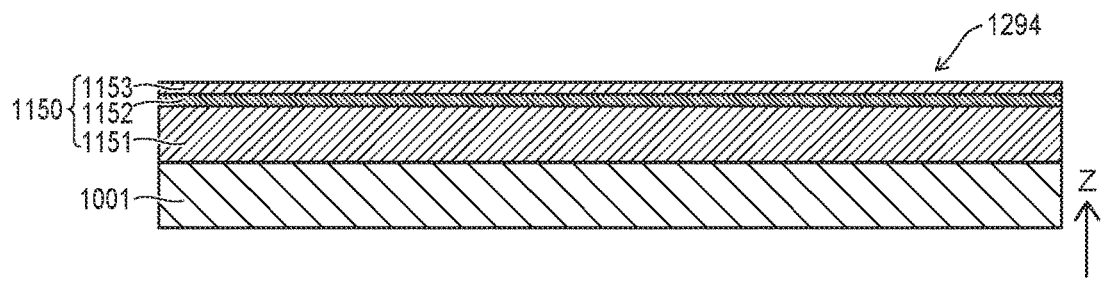
FIG. 6A is a schematic cross-sectional view illustrating the method for manufacturing the image display device of the first embodiment.
Figure 6B:
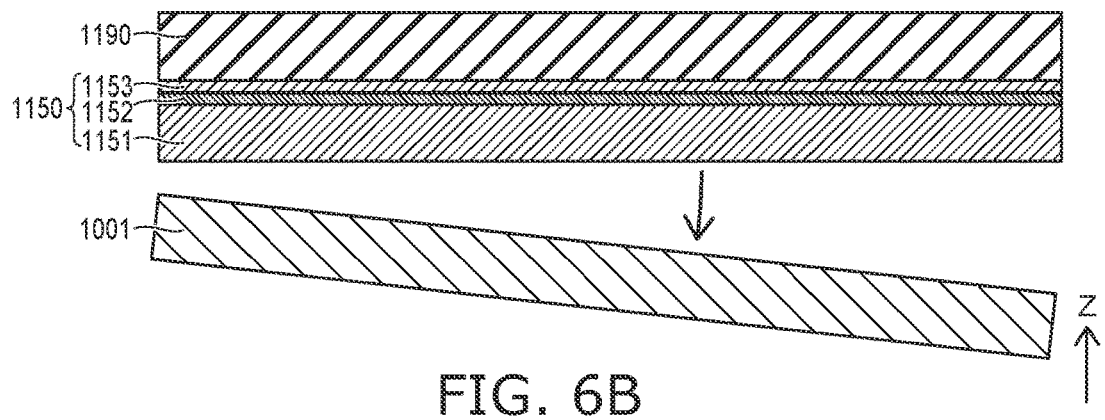
FIG. 6B is a schematic cross-sectional view illustrating the method for manufacturing the image display device of the first embodiment.
Figure 6C:
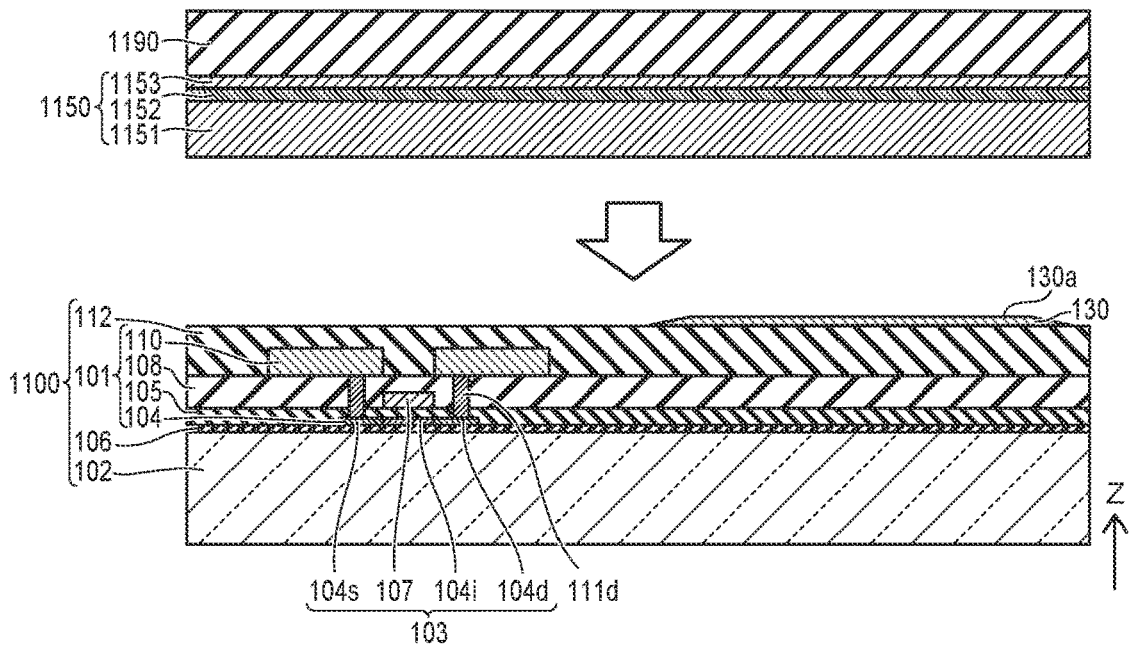
FIG. 6C is a schematic cross-sectional view illustrating the method for manufacturing the image display device of the first embodiment.

In FIGS. 6A to 6C, after forming the semiconductor layer 1150 on the crystal growth substrate 1001, the semiconductor layer 1150 is transferred to a support substrate 1190 that is different from the crystal growth substrate 1001.

A semiconductor growth substrate 1294 is prepared as shown in FIG. 6A. In the semiconductor growth substrate 1294, the semiconductor layer 1150 includes the n-type semiconductor layer 1151, the light-emitting layer 1152, and the p-type semiconductor layer 1153 grown on the crystal growth substrate 1001 in this order from the crystal growth substrate 1001 side.

In the initial state of the crystal growth, crystal defects that are caused by mismatch of the crystal lattice constants occur easily, and such a crystal is of the n-type. Therefore, it is advantageous to stack on the crystal growth substrate 1001 from the n-type semiconductor layer 1151 as in the example because the margin of the production processes is increased, and the yield is easily increased.

As shown in FIG. 6B, after forming the semiconductor layer 1150 on the crystal growth substrate 1001, the support substrate 1190 is bonded to the exposed surface of the p-type semiconductor layer 1153. For example, the support substrate 1190 is formed of Si, quartz, etc. After the support substrate 1190 is bonded to the semiconductor layer 1150, the crystal growth substrate 1001 is removed. For example, wet etching and/or laser lift-off is used to remove the crystal growth substrate 1001.

The circuit board 1100 is prepared as shown in FIG. 6C. The semiconductor layer 1150 is bonded with the circuit board 1100 on which the conductive layer 130 is formed via the exposed surface of the n-type semiconductor layer 1151. Subsequently, the support substrate 1190 is removed by laser lift-off, etc.

Figure 7A:
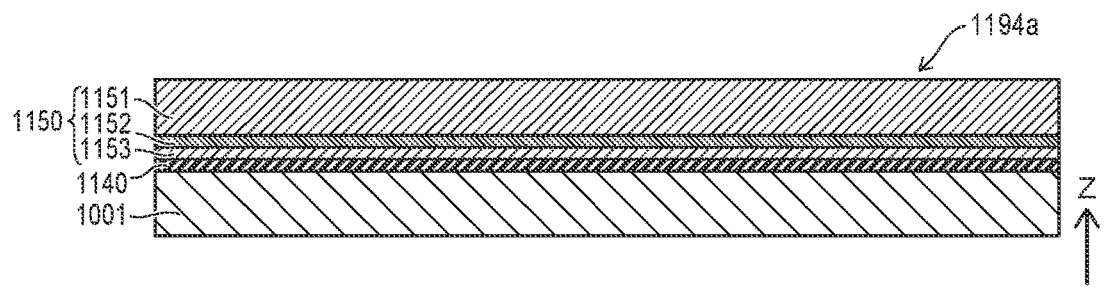
FIG. 7A is a schematic cross-sectional view illustrating the method for manufacturing the image display device of the first embodiment.
Figure 7B:
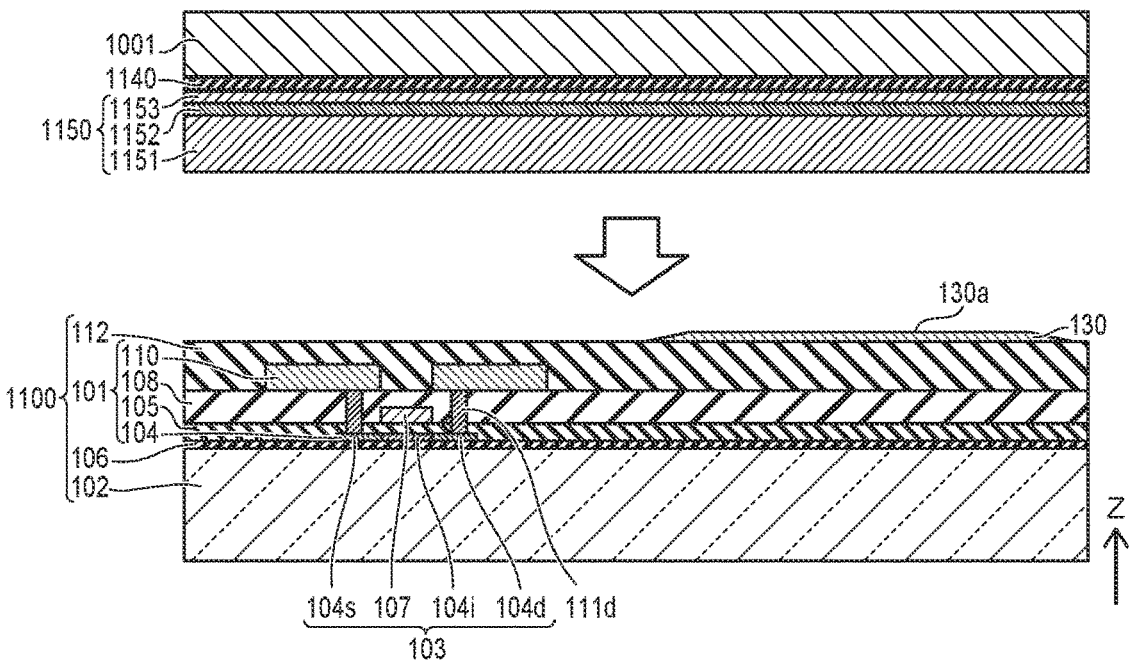
FIG. 7B is a schematic cross-sectional view illustrating the method for manufacturing the image display device of the first embodiment.

In the example shown in FIGS. 7A and 7B, after providing a buffer layer 1140 on the crystal growth substrate 1001, the semiconductor layer 1150 is formed on the buffer layer 1140.

A semiconductor growth substrate 1194a is prepared as shown in FIG. 7A. In the semiconductor growth substrate 1194a, the semiconductor layer 1150 is formed on the crystal growth substrate 1001 with the buffer layer 1140 interposed. The semiconductor layer 1150 includes the p-type semiconductor layer 1153, the light-emitting layer 1152, and the n-type semiconductor layer 1151 stacked on the crystal growth substrate 1001 in this order from the crystal growth substrate 1001 side. The buffer layer 1140 is formed at one surface of the crystal growth substrate 1001. It is favorable for the buffer layer 1140 to include a nitride such as AlN, etc. By performing crystal growth of the semiconductor layer 1150 via the buffer layer 1140, the mismatch at the interface between the GaN crystal and the crystal growth substrate 1001 can be relaxed.

The circuit board 1100 is prepared as shown in FIG. 7B. The semiconductor growth substrate 1194a is vertically inverted, and is bonded to the circuit board 1100 on which the conductive layer 130 is formed via the exposed surface of the n-type semiconductor layer 1151. After the wafer bonding, the crystal growth substrate 1001 is removed by laser lift-off, etc.

In the example, the buffer layer 1140 remains after removing of the crystal growth substrate 1001; therefore, the buffer layer 1140 is removed in a subsequent process. For example, the removal of the buffer layer 1140 may be performed after the process of forming the light-emitting element 150, or may be performed before forming the light-emitting element 150. For example, the wet etching or the like is used to remove the buffer layer 1140.

The description continues now by returning to the manufacturing process after the wafer bonding.

Figure 8A:
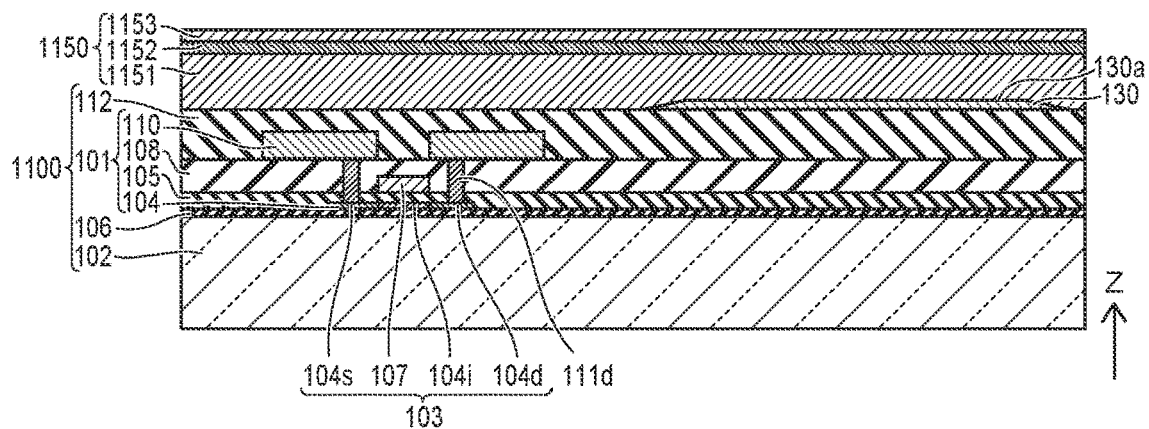
FIG. 8A is a schematic cross-sectional view illustrating the method for manufacturing the image display device of the first embodiment.

As shown in FIG. 8A, after the circuit board 1100 on which the conductive layer 130 is formed is bonded to the semiconductor layer 1150 by the wafer bonding, the crystal growth substrate 1001 is removed by wet etching, laser lift-off, etc.

Figure 8B:
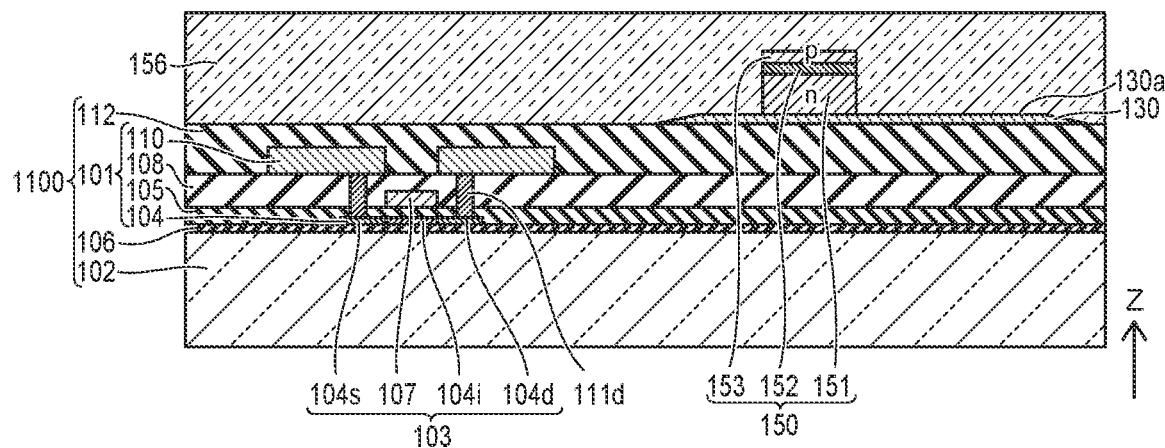
FIG. 8B is a schematic cross-sectional view illustrating the method for manufacturing the image display device of the first embodiment.

As shown in FIG. 8B, the semiconductor layer 1150 is formed into the necessary shape by etching. For example, a dry etching process is used to form the light-emitting element 150, and anisotropic plasma etching (Reactive Ion Etching, RIE) is favorably used. Subsequently, the second inter-layer insulating film 156 is formed to cover the first inter-layer insulating film 112, the conductive layer 130, and the light-emitting element 150.

Figure 9A:
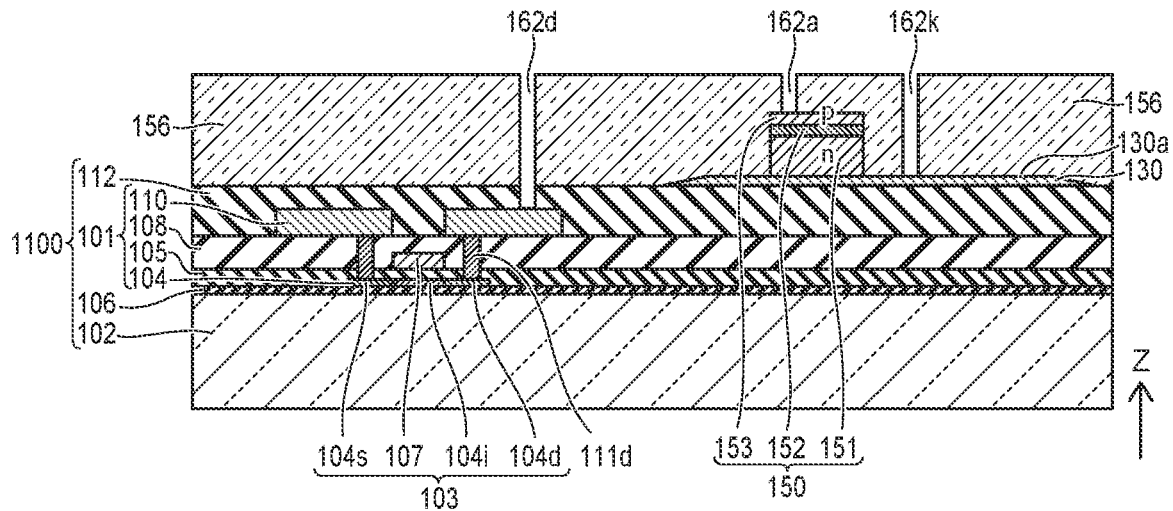
FIG. 9A is a schematic cross-sectional view illustrating the method for manufacturing the image display device of the first embodiment.

As shown in FIG. 9A, the contact hole 162a is formed in the second inter-layer insulating film 156. A via hole 162k that extends through the inter-layer insulating film 156 is formed. A via hole 162d that extends through the inter-layer insulating films 112 and 156 is formed. For example, RIE or the like is used to form the contact holes and/or the via holes. As described above, even if the surface of the second inter-layer insulating film 156 is not flat, it is sufficient for the second inter-layer insulating film 156 to be able to cover the light-emitting element 150. When the surface of the second inter-layer insulating film 156 is not flat, the depths of the via holes 162k and 162d can be shallow; therefore, the dimensions of the opening diameters of the via holes can be reduced, and an increase of the yield can be realized.

Figure 9B:
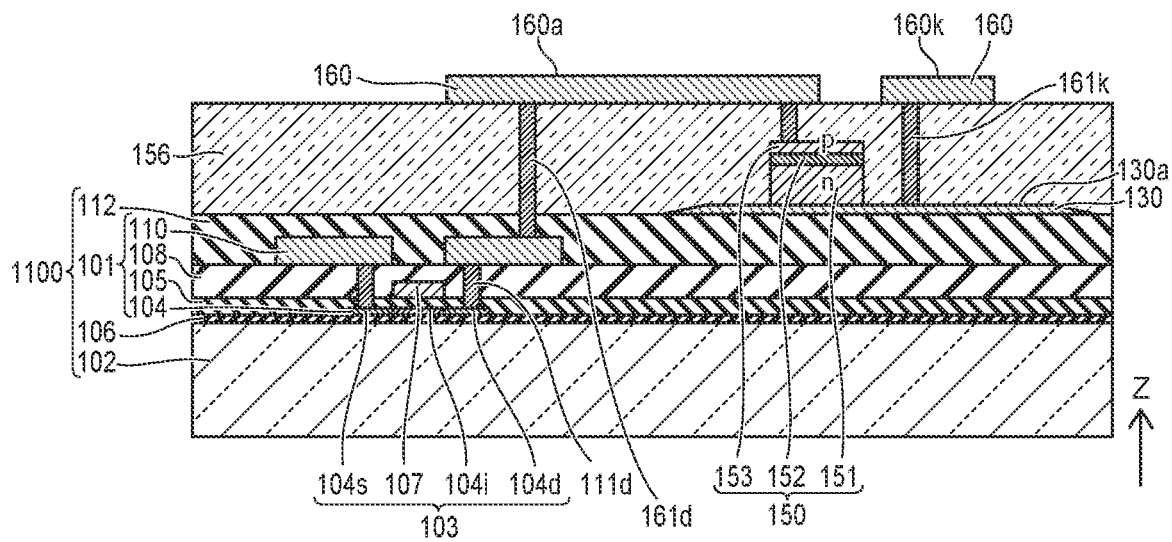
FIG. 9B is a schematic cross-sectional view illustrating the method for manufacturing the image display device of the first embodiment.

As shown in FIG. 9B, the vias 161d and 161k, etc., are formed by filling a conductive material into the contact hole 162a and the via holes 162d and 162k shown in FIG. 9A. Subsequently, the second wiring layer 160 is formed, and the wiring portions 160a and 160k are formed. Or, the second wiring layer 160 may be formed simultaneously with forming the vias 161d and 161k by filling the conductive material into the via holes 162d and 162k.

As described above, it is sufficient for the inter-layer insulating film 156 to ensure the insulation properties by covering the light-emitting element 150, etc. It is sufficient for the flatness of the surface of the inter-layer insulating film 156 to be such that the second wiring layer 160 can be formed on the inter-layer insulating film 156, and a planarizing process may not be performed. When a planarizing process of the inter-layer insulating film 156 is not performed, it is advantageous in that the number of processes can be reduced, and the thickness of the inter-layer insulating film 156 can be thin in locations other than the location at which the light-emitting element 150 is formed. The depths of the via holes 162k and 162d can be shallow in the locations where the thickness of the inter-layer insulating film 156 is thin. By making the depth of the via hole shallow, a sufficient opening diameter can be ensured over the depth to which the via hole is formed; therefore, the electrical connection by the via is easier to ensure. Therefore, the reduction of the yield due to defects of the electrical characteristics can be suppressed.

Figure 10A:
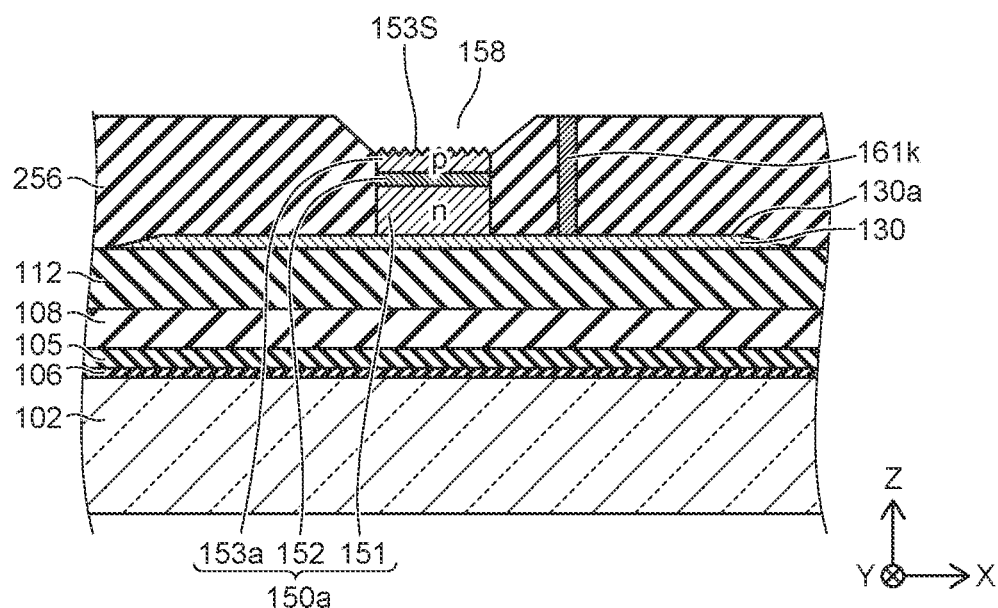
FIG. 10A is a schematic cross-sectional view illustrating a manufacturing method of a modification of the image display device of the first embodiment.
Figure 10B:
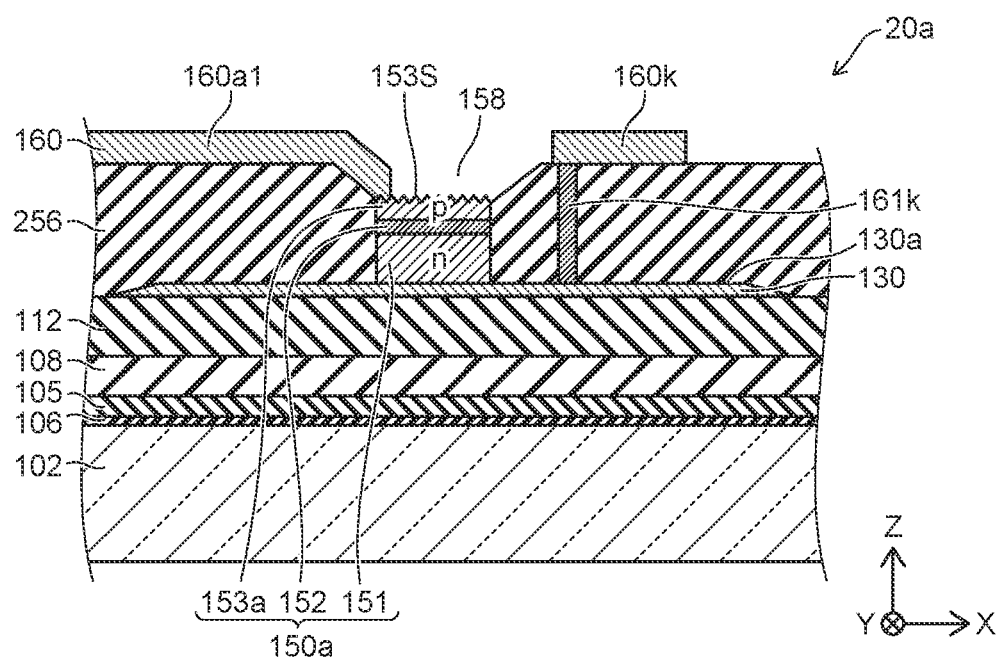
FIG. 10B is a schematic cross-sectional view illustrating the manufacturing method of the modification of the image display device of the first embodiment.

FIGS. 10A and 10B are schematic cross-sectional views illustrating a manufacturing method of a modification of the image display device of the embodiment.

FIGS. 10A and 10B show manufacturing processes for forming the subpixel 20a shown in FIG. 2A. The modification includes the same processes as the first embodiment up to the formation of the second inter-layer insulating film 256 (156) and the formation of the via holes. In the following description, the processes of FIGS. 10A and 10B are performed in the process of FIG. 9A and subsequent processes.

As shown in FIG. 10A, the light-emitting surface 153S of the p-type semiconductor layer 153a is exposed by forming the opening 158 by etching the second inter-layer insulating film 256. The etching may be wet etching or may be dry etching. Subsequently, the exposed light-emitting surface 153S of the p-type semiconductor layer 153a is roughened to increase the luminous efficiency.

As shown in FIG. 10B, the wiring layer 160 is formed to include the opening 158, and the wiring portions 160a1 and 160k are formed by photolithography. The wiring portion 160a1 is formed to be connected to the exposed surface including the light-emitting surface 153S of the p-type semiconductor layer 153a.

Thus, the subpixel 20a of the modification is formed.

Figure 11A:
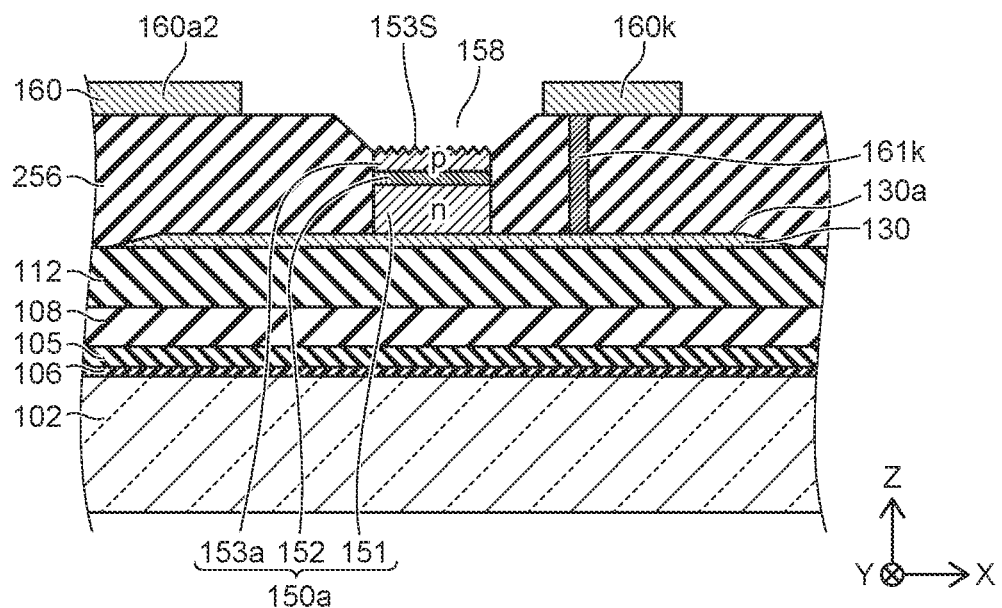
FIG. 11A is a schematic cross-sectional view illustrating a manufacturing method of a modification of the image display device of the first embodiment.
Figure 11B:
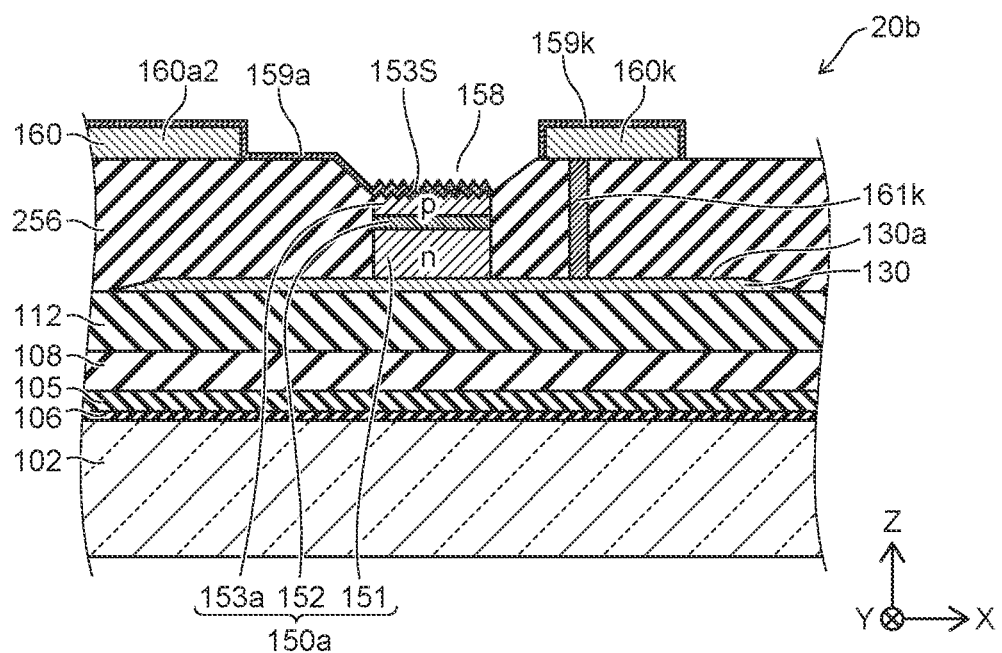
FIG. 11B is a schematic cross-sectional view illustrating the manufacturing method of the modification of the image display device of the first embodiment.

FIGS. 11A and 11B are schematic cross-sectional views illustrating a manufacturing method of a modification of the image display device of the embodiment.

FIGS. 11A and 11B show manufacturing processes for forming the subpixel 20b shown in FIG. 2B. The modification includes the same processes as the modification described above up to the formation of the opening 158. Accordingly, in the following description, the processes of FIGS. 11A and 11B are performed in FIG. 10A and subsequent drawings.

As shown in FIG. 11A, the light-emitting surface 153S is roughened after forming the opening 158 to expose the light-emitting surface 153S of the p-type semiconductor layer 153a. The wiring layer 160 that includes the wiring portions 160a2 and 160k is formed simultaneously with the formation of the via 161k extending through the inter-layer insulating film 256 or after the formation of the via 161k. The wiring portion 160a2 is not connected to the surface including the light-emitting surface 153S.

As shown in FIG. 11B, the light-transmitting conductive film that covers the wiring layer 160, the second inter-layer insulating film 256, and the light-emitting surface 153S is formed. It is favorable for the light-transmitting conductive film to include an ITO film, a ZnO film, etc. The light-transmitting conductive film includes the light-transmitting electrodes 159a and 159k. The light-transmitting electrode 159a is formed on the wiring portion 160a2 and is formed also on the light-emitting surface 153S of the p-type semiconductor layer 153. Accordingly, the wiring portion 160a2 and the p-type semiconductor layer 153 are electrically connected to each other. It is favorable for the light-transmitting electrode 159a to be connected to the light-emitting surface 153S by being provided to cover the entire surface of the exposed light-emitting surface 153S.

Thus, the subpixel 20b of the modification is formed.

A portion of the circuit other than the subpixel 20 is formed in the circuit board 1100. For example, the row selection circuit 5 shown in FIG. 3 is formed in the circuit board 1100 together with the drive transistors, the select transistors, etc. That is, there are cases where the row selection circuit 5 is simultaneously embedded by the manufacturing processes described above. On the other hand, it is desirable for the signal voltage output circuit 7 to be embedded in a semiconductor device that is manufactured by manufacturing processes in which higher integration by fine patterning is possible. For example, the signal voltage output circuit 7 is mounted to another substrate together with a CPU and/or other circuit components, and is connected with the wiring portions of the circuit board 1100 before embedding the color filter described below or after embedding the color filter.

For example, the circuit board 1100 includes the substrate 102 that is made of a glass substrate that includes the circuit 101, and the substrate 102 is substantially rectangular. The circuit 101 is formed in the circuit board 1100 for one or multiple image display devices. Or, in the case of a larger screen size, etc., the circuit 101 for configuring one image display device may be formed by being subdivided into multiple circuit boards 1100, and one image display device may be configured by combining all of the subdivided circuits.

The semiconductor layer 1150 that has substantially the same dimensions as the crystal growth substrate 1001 is formed on the crystal growth substrate 1001. For example, the crystal growth substrate 1001 can be a rectangle that has the same dimensions as the rectangular circuit board 1100. The crystal growth substrate is not limited to the same shape as the circuit board 1100 or a similar shape, and may have another shape. For example, the crystal growth substrate 1001 may have a substantially circular wafer shape having a diameter that includes the circuit 101 formed in the rectangular circuit board 1100, etc.

Figure 12:
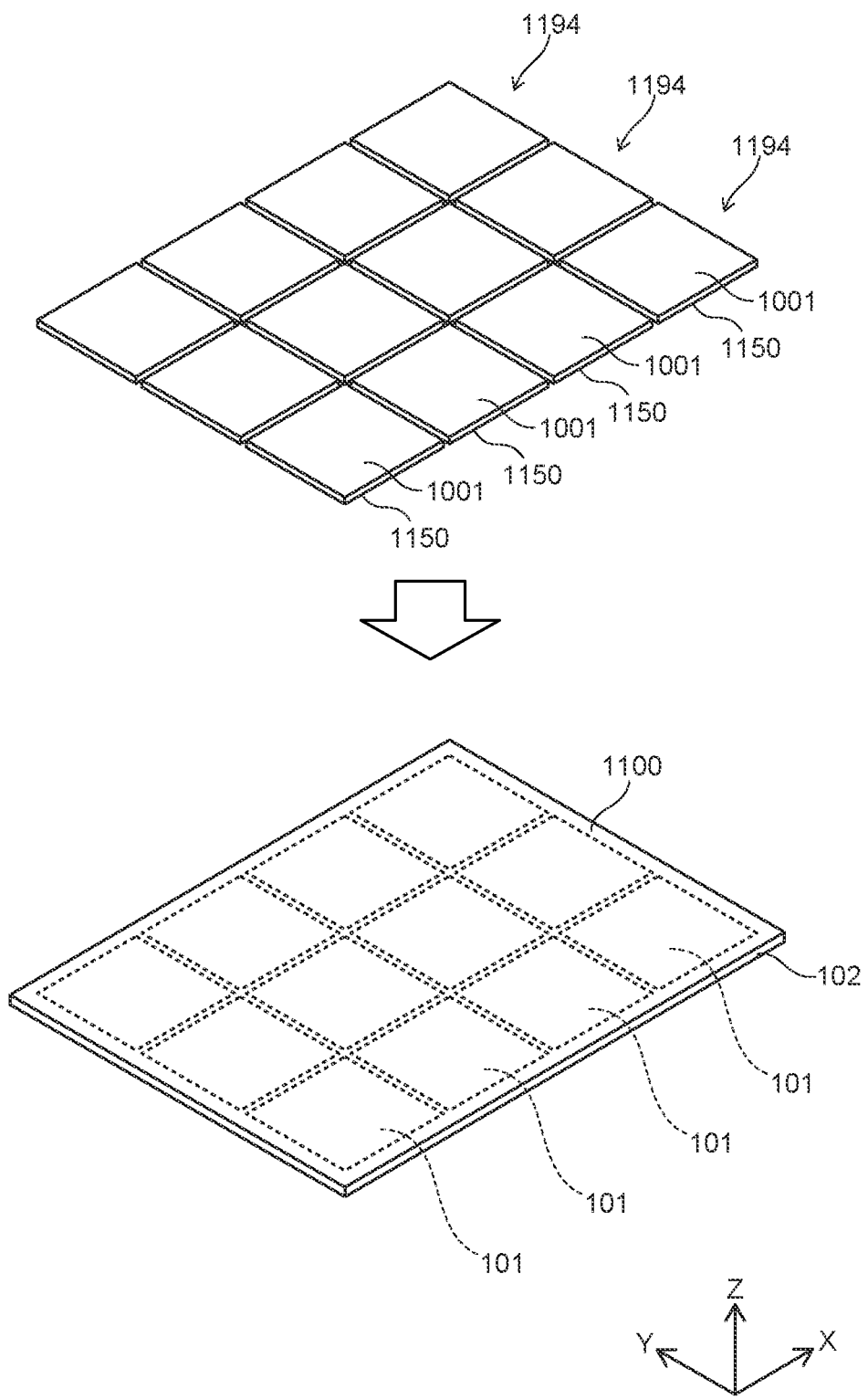
FIG. 12 is a schematic perspective view illustrating the method for manufacturing the image display device of the first embodiment.

FIG. 12 is a perspective view illustrating the method for manufacturing the image display device of the embodiment.

As shown in FIG. 12, the multiple semiconductor growth substrates 1194 may be prepared, and semiconductor layers 1150 that are formed on the multiple crystal growth substrates 1001 may be bonded to one circuit board 1100.

For example, multiple circuits 101 are arranged in a lattice shape in one substrate 102 in the circuit board 1100. The circuits 101 include all of the subpixels 20, etc., necessary for one image display device 1. A spacing that is about the scribe line width is located between the circuit 101 that are located next to each other. A circuit element or the like is not located at the end portion or the end portion vicinity of the circuit 101.

The semiconductor layer 1150 is formed so that the end portion of the semiconductor layer 1150 is aligned with the end portion of the crystal growth substrate 1001. Therefore, by disposing and bonding so that the end portion of the semiconductor growth substrate 1194 is aligned with the end portion of the circuit 101, the end portion of the semiconductor layer 1150 and the end portion of the circuit 101 can be aligned after bonding.

When growing the semiconductor layer 1150 on the crystal growth substrate 1001, the crystal quality easily degrades at the end portion and the end portion vicinity of the semiconductor layer 1150. Therefore, by aligning the end portion of the semiconductor layer 1150 and the end portion of the circuit 101, the region at which the crystal quality easily degrades that is at the end portion vicinity of the semiconductor layer 1150 on the semiconductor growth substrate 1194 is not used in the display region of the image display device 1. Here, there are various degree of freedoms in the arrangement method of the crystal growth substrate 1001. It is favorable for the end portion of the semiconductor layer 1150 to be located not to overlap the light-emitting element 150.

Or, conversely, multiple circuit boards 1100 may be prepared, and the multiple circuit boards 1100 may be bonded to the semiconductor layer 1150 that is formed on the crystal growth substrate 1001 of one semiconductor growth substrate 1194.

Figure 13:
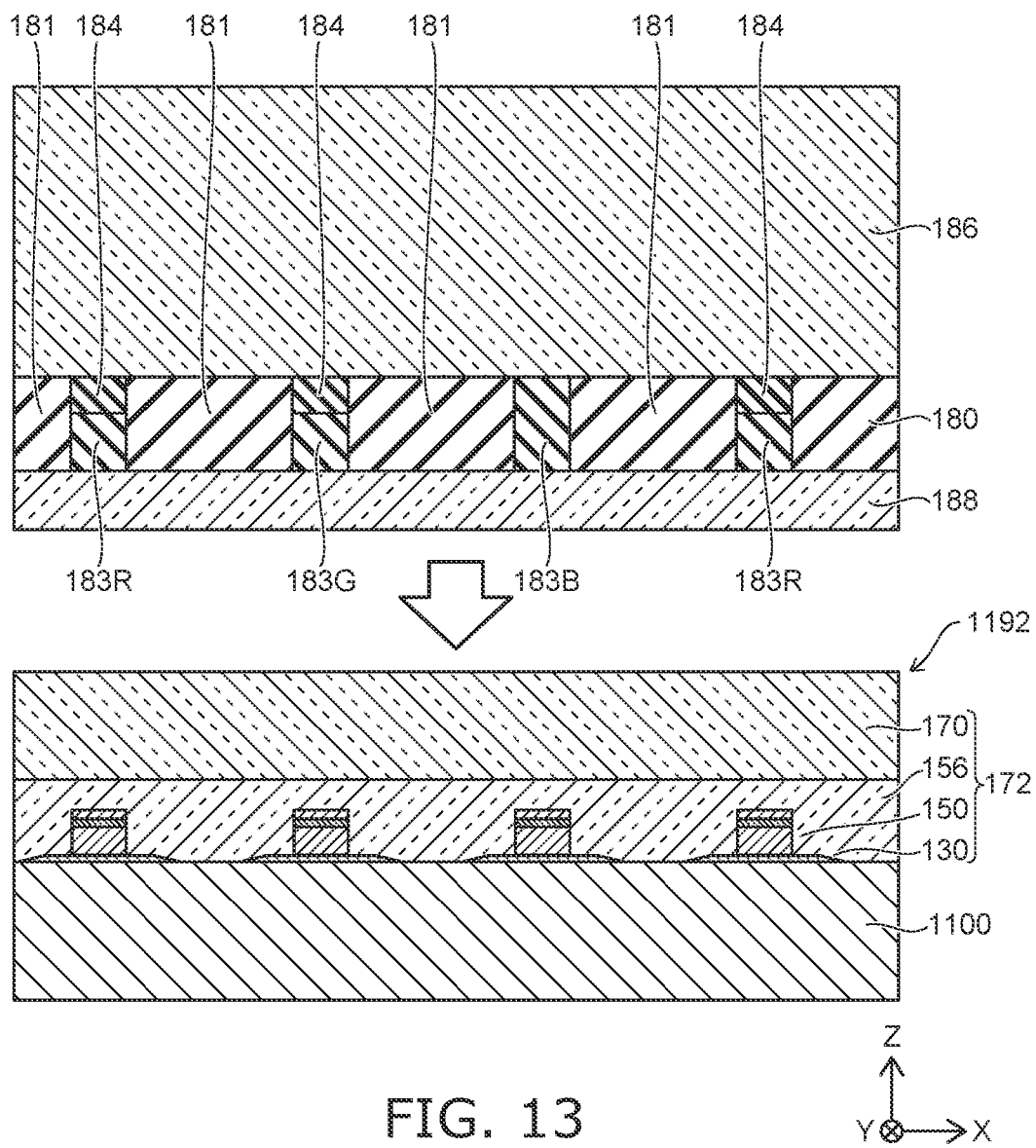
FIG. 13 is a schematic cross-sectional view illustrating the method for manufacturing the image display device of the first embodiment.

FIG. 13 is a schematic cross-sectional view illustrating the method for manufacturing the image display device of the embodiment.

In FIG. 13, the structures in the circuit board 1100, the inter-layer insulating film 112, the vias 161*d* and 161*k*, the wiring layer 160, etc., are not illustrated to avoid complexity. Also, a portion of the color conversion members such as the color filter 180, etc., is displayed in FIG. 13. In FIG. 13, the structural component that includes the conductive layer 130, the light-emitting element 150, the inter-layer insulating film 156, the surface resin layer 170, the not-illustrated vias, etc., is called a light-emitting circuit part 172. Also, the structural component in which the light-emitting circuit part 172 is located on the circuit board 1100 is called a structure body 1192.

As shown in FIG. 13, the color filter (the wavelength conversion member) 180 is bonded to the structure body 1192 at one surface of the color filter 180. The other surface of the color filter 180 is bonded to a glass substrate 186. The transparent thin film adhesive layer 188 is located at the one surface of the color filter 180, and the bonding to the surface of the structure body 1192 at the light-emitting circuit part 172 side is performed via the transparent thin film adhesive layer 188.

In the color filter 180 of the example, the color conversion parts are arranged in the positive direction of the X-axis in the order of red, green, and blue. For red, a red color conversion layer 183R is located in the first layer; for green, a green color conversion layer 183G is located in the first layer, and the filter layer 184 is located in the second layer for both red and green. For blue, a single-layer color conversion layer 183B may be provided, and the filter layer 184 may be provided. The light-shielding part 181 is located between the color conversion parts.

The color filter 180 is adhered to the structure body 1192 so that the positions of the color conversion layers 183R, 183G, and 183B of each color match the positions of the light-emitting elements 150.

FIGS. 14A to 14D are schematic cross-sectional views showing a modification of the method for manufacturing the image display device of the embodiment.

A method in which the color filter is formed by inkjet is shown in FIGS. 14A to 14D.

Figure 14A:
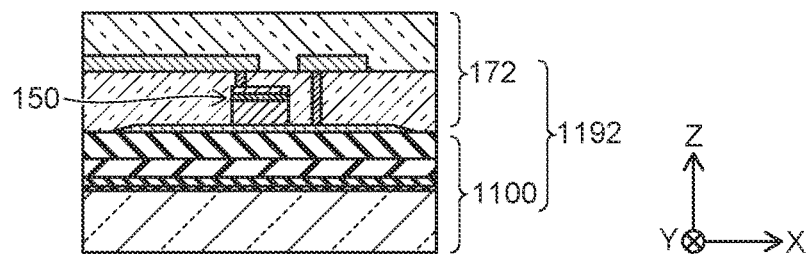
FIG. 14A is a schematic cross-sectional view illustrating the method for manufacturing the image display device of the first embodiment.

As shown in FIG. 14A, the structure body 1192 in which the light-emitting circuit part 172 is adhered to the circuit board 1100 is prepared.

Figure 14B:
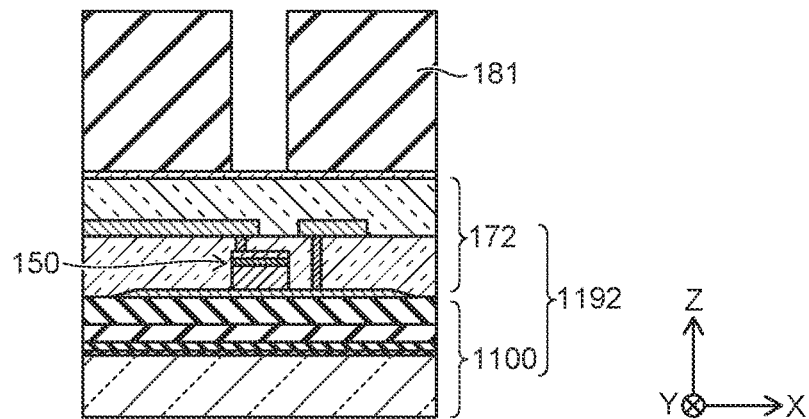
FIG. 14B is a schematic cross-sectional view illustrating the method for manufacturing the image display device of the first embodiment.

As shown in FIG. 14B, the light-shielding part 181 is formed on the structure body 1192. For example, the light-shielding part 181 is formed using screen printing, photolithography technology, etc.

Figure 14C:
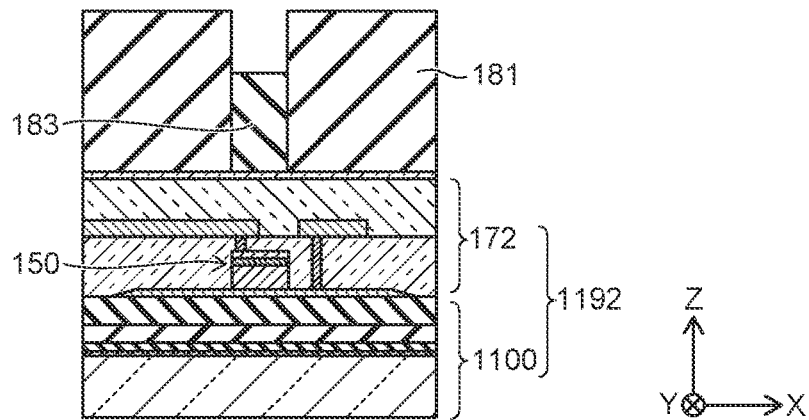
FIG. 14C is a schematic cross-sectional view illustrating the method for manufacturing the image display device of the first embodiment.

As shown in FIG. 14C, the color conversion layer 183 is formed by dispensing a fluorescer that corresponds to the light emission color from an inkjet nozzle. The fluorescer colors the region in which the light-shielding part 181 is not formed. The fluorescer includes, for example, a fluorescent coating material that uses a general fluorescer material, a perovskite fluorescer material, or a quantum dot fluorescer material. It is favorable to use the perovskite fluorescer material or the quantum dot fluorescer material because the light emission colors can be realized, the monochromaticity can be high, and the color reproducibility can be high. After printing by the inkjet nozzle, drying processing is performed using an appropriate temperature and time. The thickness of the coating when coloring is set to be less than the thickness of the light-shielding part 181.

As described above, the fluorescer is not dispensed in the subpixel of the blue light emission when the color conversion part is not formed. Also, when a blue color conversion layer is formed in the subpixel of the blue light emission, and when the color conversion part may be one layer, it is favorable for the thickness of the coating of the blue fluorescer to be about equal to the thickness of the light-shielding part 181.

Figure 14D:
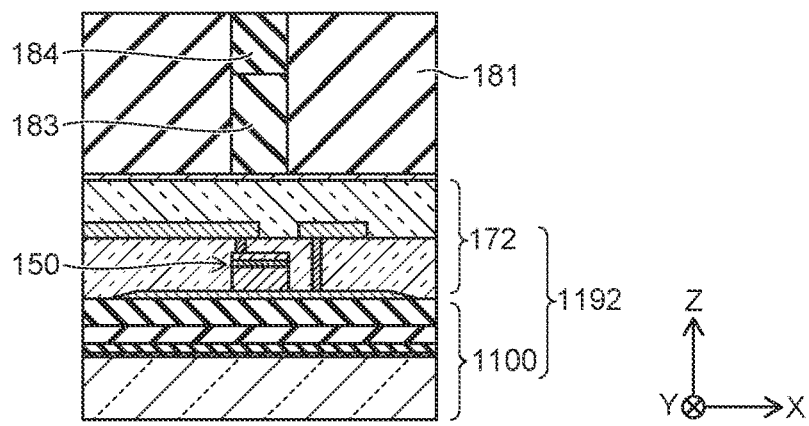
FIG. 14D is a schematic cross-sectional view illustrating the method for manufacturing the image display device of the first embodiment.

As shown in FIG. 14D, a coating material for the filter layer 184 is dispensed from the inkjet nozzle. The coating material is coated to overlap the coating of the fluorescer. The total thickness of the coating of the fluorescer and the coating material is set to be about equal to the thickness of the light-shielding part 181.

Effects of the image display device 1 of the embodiment will now be described.

According to the method for manufacturing the image display device 1 of the embodiment, the semiconductor layer 1150 that includes the light-emitting layer 1152 for forming the light-emitting element 150 is bonded to the circuit board 1100 that includes the circuit elements such as the transistor 103 that drives the light-emitting element 150, etc. Subsequently, the light-emitting element 150 is formed by etching the semiconductor layer 1150. Therefore, compared to individually transferring singulated light-emitting elements onto the circuit board 1100, the process of transferring the light-emitting elements can be markedly shortened.

For example, in an image display device having 4K image quality, the number of subpixels is greater than 24 million, and in the case of an image display device having 8K image quality, the number of subpixels is greater than 99 million. When individually mounting such a large amount of light-emitting elements to a circuit board, an enormous amount of time is necessary, and it is difficult to realize an image display device that uses micro LEDs at a realistic cost. Also, when individually mounting a large amount of light-emitting elements, the yield decreases due to connection defects when mounting, etc., and an even higher cost is unavoidable.

Conversely, according to the method for manufacturing the image display device 1 of the embodiment, the entire semiconductor layer 1150 is adhered to the circuit board 1100 before singulating the semiconductor layer 1150; therefore, the transfer process is completed when performed 1 time.

After directly forming the light-emitting element on the circuit board by etching, etc., the light-emitting element and the circuit element in the circuit board 1100 are electrically connected by via formation; therefore, a uniform connection structure can be realized, and the reduction of the yield can be suppressed.

Also, alignment is unnecessary because the adhering to the circuit board 1100 is performed at the wafer level without pre-singulating the semiconductor layer 1150 or forming electrodes at positions corresponding to the circuit elements. Therefore, the adhesion process can be easily performed in a short period of time. The alignment is unnecessary when adhering, which is favorable for a higher definition display; also, downsizing of the light-emitting element 150 is easy.

According to the embodiment, for example, TFTs that are formed on a glass substrate can be used as the circuit board 1100; therefore, the manufacturing processes and/or plant of an existing flat panel can be utilized.

In the image display device 1 of the embodiment, the subpixels 20, 20a, and 20b include the conductive layer 130. The conductive layer 130 includes the light-reflecting plate 130a, and the light-emitting elements 150 and 150a are located on the light-reflecting plate 130a. A light-emitting surface 153Ss of the light-emitting elements 150 and 150a are located at the side opposite to the inter-layer insulating film 112 at which the light-reflecting plate 130a is located. Therefore, the light that is scattered downward from the light-emitting elements 150 and 150a is reflected by the light-reflecting plate 130a and has a light distribution toward the light-emitting surface 153S side. Therefore, the luminous efficiencies of the light-emitting elements 150 and 150a are substantially improved.

Because the light-reflecting plate 130a can shield the downward-scattered light of the light-emitting elements 150 and 150a, the irradiation of the light toward the circuit elements that are under the vicinities of the light-emitting elements 150 and 150a can be suppressed, and malfunction of the circuit element, etc., can be prevented.

The light-reflecting plate 130a is conductive and has an ohmic connection with the n-type semiconductor layer 151. Therefore, the electrical connection between the light-emitting elements 150 and 150a can be utilized, and it becomes possible to reduce the wiring portions at the light-emitting surface 153S side.

Second Embodiment

Figure 15:
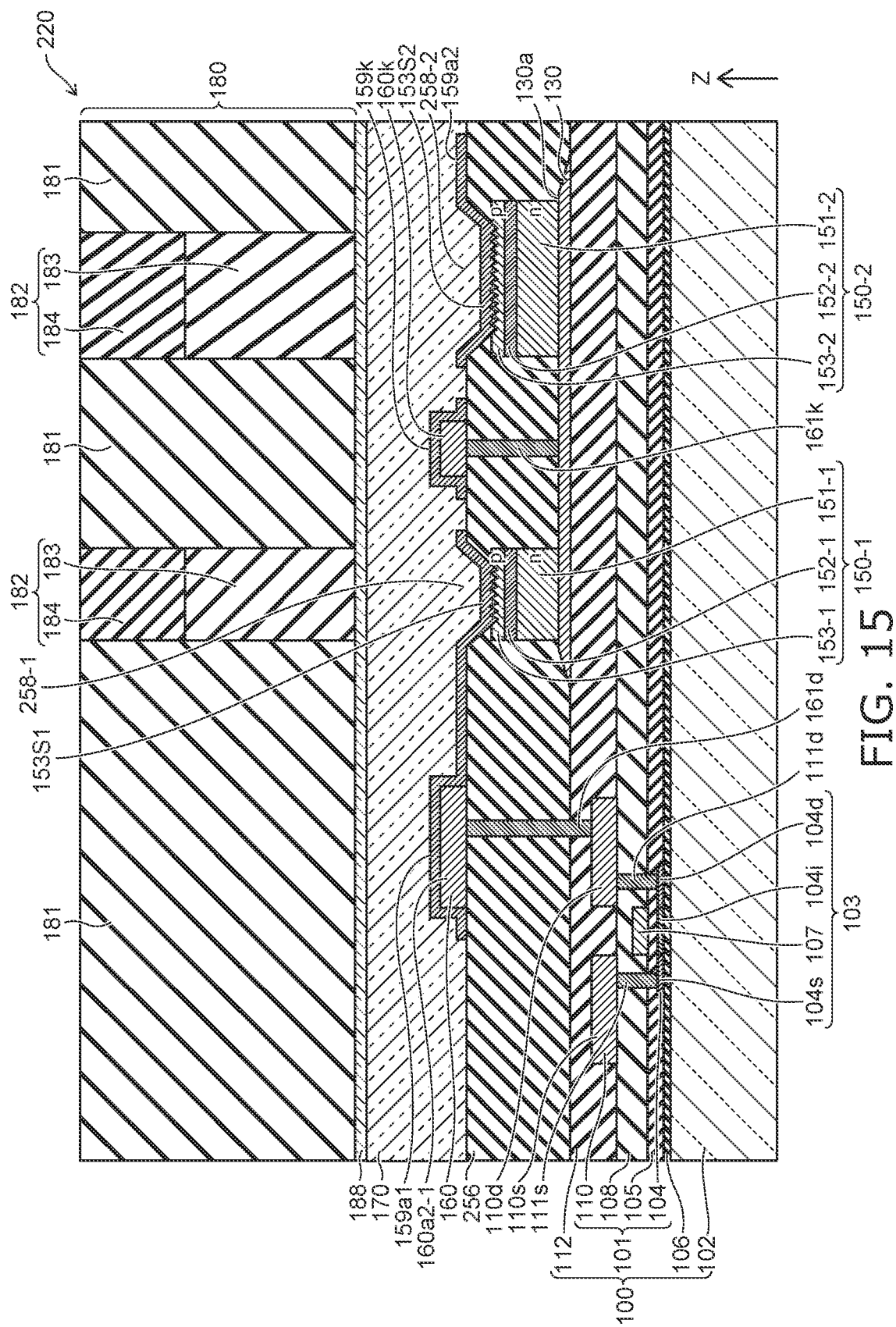
FIG. 15 is a schematic cross-sectional view illustrating a portion of an image display device according to a second embodiment.

FIG. 15 is a schematic cross-sectional view illustrating a portion of an image display device according to the embodiment.

FIG. 15 shows an auxiliary cross section at a position corresponding to line AA' of FIG. 4.

The embodiment differs from the other embodiments described above in that multiple light-emitting elements 150-1 and 150-2 are located on one light-reflecting plate 130a. The same components as those of the other embodiments described above are marked with the same reference numerals, and a detailed description is omitted as appropriate.

In a subpixel 220 of the image display device of the embodiment as shown in FIG. 15, multiple light-emitting elements are located on the light-reflecting plate 130a that is conductive. In the example, the multiple light-emitting elements are the two light-emitting elements 150-1 and 150-2.

The light-emitting element 150-1 includes an n-type semiconductor layer 151-1, a light-emitting layer 152-1, and a p-type semiconductor layer 153-1. The n-type semiconductor layer 151-1, the light-emitting layer 152-1, and the p-type semiconductor layer 153-1 are stacked in this order from the inter-layer insulating film 112 side toward a light-emitting surface 153S1 side.

The light-emitting element 150-2 includes an n-type semiconductor layer 151-2, a light-emitting layer 152-2, and a p-type semiconductor layer 153-2. The n-type semiconductor layer 151-2, the light-emitting layer 152-2, and the p-type semiconductor layer 153-2 also are stacked in this order from the inter-layer insulating film 112 side toward a light-emitting surface 153S2 side.

The surface areas of the two light-emitting elements 150-1 and 150-2 when projected onto the XY plane are different. Hereinbelow, the surface area when projected onto the XY plane is called simply the surface area. In the example, the surface area of the light-emitting element 150-1 is less than the surface area of the light-emitting element 150-2. The surface area of the light-emitting element is set according to the light emission color of the subpixel of red, green, or blue. The surface areas of the light-emitting elements 150-1 and 150-2 are appropriately set by the luminosity factor, the conversion efficiency of the color conversion part 182 of the color filter 180, etc.

The light-reflecting plate 130a is located so that the downward-scattered light of the light-emitting elements 150-1 and 150-2 is reflected toward the side of the light-emitting surfaces 153S1 and 153S2, or so that the downward scattering is shielded. The outer perimeters of the two light-emitting elements 150-1 and 150-2, when projected onto the XY plane, are located within the outer perimeter of the light-reflecting plate 130a.

The light-reflecting plate 130a is conductive. The light-reflecting plate 130a has ohmic connections with the n-type semiconductor layers 151-1 and 151-2. That is, the n-type semiconductor layers 151-1 and 151-2 that are the cathode electrodes of the light-emitting elements 150-1 and 150-2 are electrically connected to each other by the light-reflecting plate 130a.

The first inter-layer insulating film 112, the conductive layer 130, and the light-emitting elements 150-1 and 150-2 are covered with the second inter-layer insulating film 256. The second inter-layer insulating film 256 includes openings 258-1 and 258-2, and the light-emitting surfaces 153S1 and 153S2 are exposed through the openings 258-1 and 258-2.

The via 161k is provided to extend through the inter-layer insulating film 256. One end of the via 161k is connected to the light-reflecting plate 130a. Another end of the via 161k is connected to the wiring portion 160k. For example, the wiring portion 160k is connected to the ground line 4 of the circuit shown in FIG. 3. Accordingly, the n-type semiconductor layers 151-1 and 151-2 that are the cathode electrodes of the light-emitting elements 150-1 and 150-2 are electrically connected to the ground line 4 via the light-reflecting plate 130a, the via 161k, and the wiring portion 160k.

Similarly to the other embodiments described above, the via 161d is provided to extend through the inter-layer insulating films 112 and 256, and the wiring portions 110d and 160a2-1 are connected by the via 161d.

A light-transmitting electrode 159a1 is located over the light-emitting surface 153S1. The light-transmitting electrode 159a1 is located also on the wiring portion 160a2-1. The light-transmitting electrode 159a1 is located between the light-emitting surface 153S1 and the wiring portion 160a2-1, and electrically connects the p-type semiconductor layer 153-1 and the wiring portion 160a2-1. Accordingly, the p-type semiconductor layer 153-1 that is the anode electrode of the light-emitting element 150-1 is electrically connected to the drain electrode of the transistor 103 via the light-transmitting electrode 159a1, the wiring portion 160a2-1, the via 161d, and the wiring portion 110d.

A light-transmitting electrode 159a2 is located over the light-emitting surface 153S2 of the light-emitting element 150-2. The light-emitting element 150-2 is a portion of a subpixel adjacent to the subpixel of the light-emitting element 150-2. Similarly to the electrical connection of the transistor 103 and the light-emitting element 150-1, the light-emitting element 150-2 is electrically connected to a transistor that is different from the transistor 103.

A method for manufacturing the image display device of the embodiment will now be described.

Figure 16A:
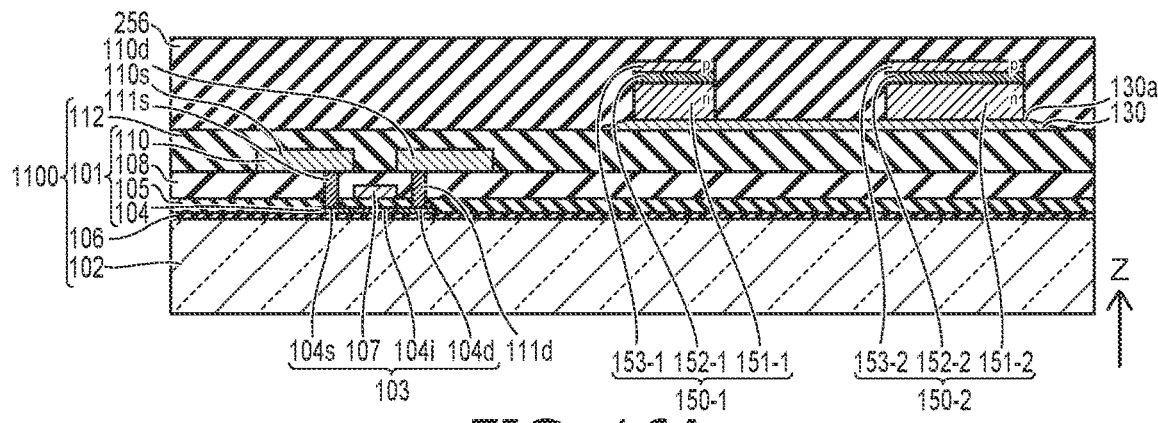
FIG. 16A is a schematic cross-sectional view illustrating a method for manufacturing the image display device of the second embodiment.
Figure 16B:
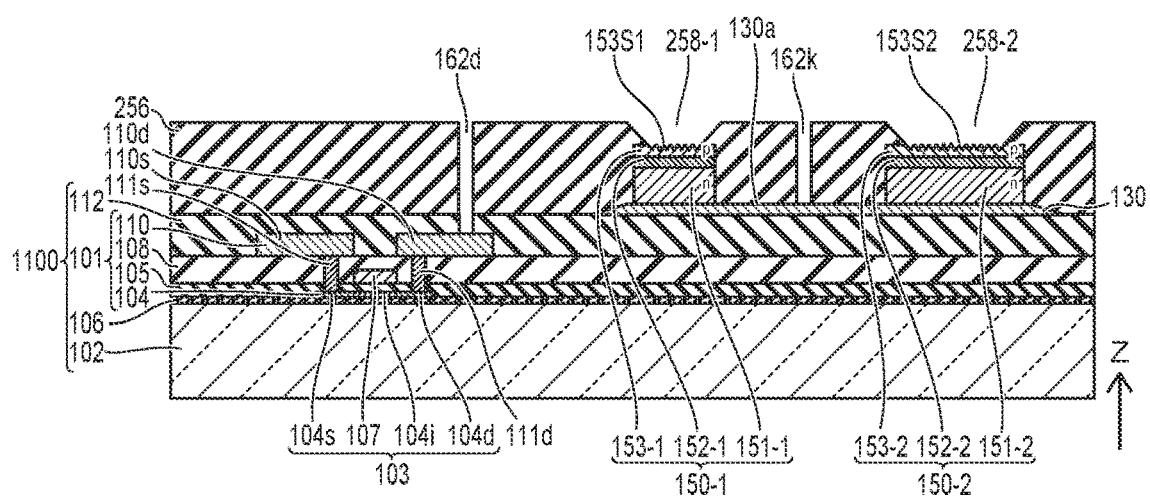
FIG. 16B is a schematic cross-sectional view illustrating the method for manufacturing the image display device of the second embodiment.
Figure 16C:
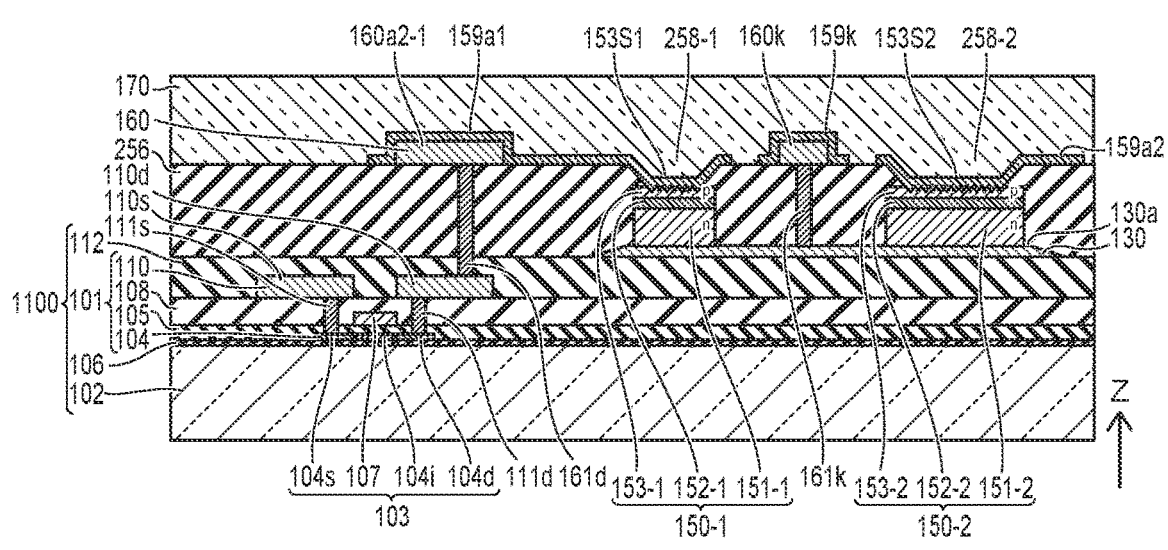
FIG. 16C is a schematic cross-sectional view illustrating the method for manufacturing the image display device of the second embodiment.

FIGS. 16A to 16C are schematic cross-sectional views illustrating the method for manufacturing the image display device of the embodiment.

According to the embodiment, the process of bonding the semiconductor layer 1150 and the circuit board 1100 on which the conductive layer 130 is formed is the same as those of the other embodiments described above. The processes after performing the processing shown in FIG. 8A will now be described.

As shown in FIG. 16A, the light-emitting elements 150-1 and 150-2 are formed by forming the semiconductor layer 1150 into the necessary shape by RIE, etc. Subsequently, the second inter-layer insulating film 256 is formed to cover the first inter-layer insulating film 112, the conductive layer 130, and the light-emitting elements 150-1 and 150-2.

As shown in FIG. 16B, the via hole 162k is formed to extend through the second inter-layer insulating film 256. The via hole 162d is formed to extend through the inter-layer insulating films 112 and 256. Simultaneously with the formation of the via holes 162k and 162d, the light-emitting surfaces 153S1 and 153S2 are exposed by forming the openings 258-1 and 258-2 in the inter-layer insulating film 156. The formation of the openings 258-1 and 258-2 may be before the via hole 162k and the via hole 162d are formed, or may be after the via hole 162k and the via hole 162d are formed.

As shown in FIG. 16C, a conductive material is filled into the via holes 162d and 162k. The second wiring layer 160 is formed subsequently or simultaneously with filling the via hole, etc. The light-transmitting electrode 159a1 is formed over the light-emitting surface 153S1 and the wiring portion 160a2-1, and the p-type semiconductor layer 153-1 and the wiring portion 160a2-1 are electrically connected. Simultaneously, the light-transmitting electrode 159a2 is formed over the light-emitting surface 153S2, and the light-transmitting electrode 159a2 is electrically connected with electrodes for other drive transistors that are different from the transistor 103. The light-transmitting electrode 159k is simultaneously formed also on the wiring portion 160k.

Thereafter, the color filter is formed similarly to the other embodiments.

Thus, the image display device of the embodiment can be manufactured.

Effects of the image display device of the embodiment will now be described.

According to the embodiment as well, effects similar to those of the other embodiments described above are obtained. Namely, the individual light-emitting elements 150-1 and 150-2 are formed by etching after bonding the semiconductor layer 1150 to the circuit board 1100; therefore, the transfer process of the light-emitting elements can be markedly shortened.

In addition to effects similar to those of the other embodiments described above, according to the embodiment, the multiple light-emitting elements 150-1 and 150-2 are located on the light-reflecting plate 130a of the conductive layer 130, and the n-type semiconductor layers 151-1 and 151-2 are electrically connected to each other. Therefore, the multiple light-emitting elements 150-1 and 150-2 are electrically connected to each other by the light-reflecting plate 130a; therefore, the routing of the wiring portions at the side of the light-emitting surfaces 153S1 and 153S2 can be reduced, and the layout efficiency of the circuit can be increased.

Although an example is described above in which two light-emitting elements 150-1 and 150-2 are located in one light-reflecting plate 130a, three or more light-emitting elements may be located on one light-reflecting plate 130a. As described above, the surface area of the light-emitting element may be changed according to the light emission color; therefore, it is possible to further improve the layout efficiency by appropriately setting the number and light emission color of the light-emitting elements located on the light-reflecting plate 130a.

Third Embodiment

Figure 17:
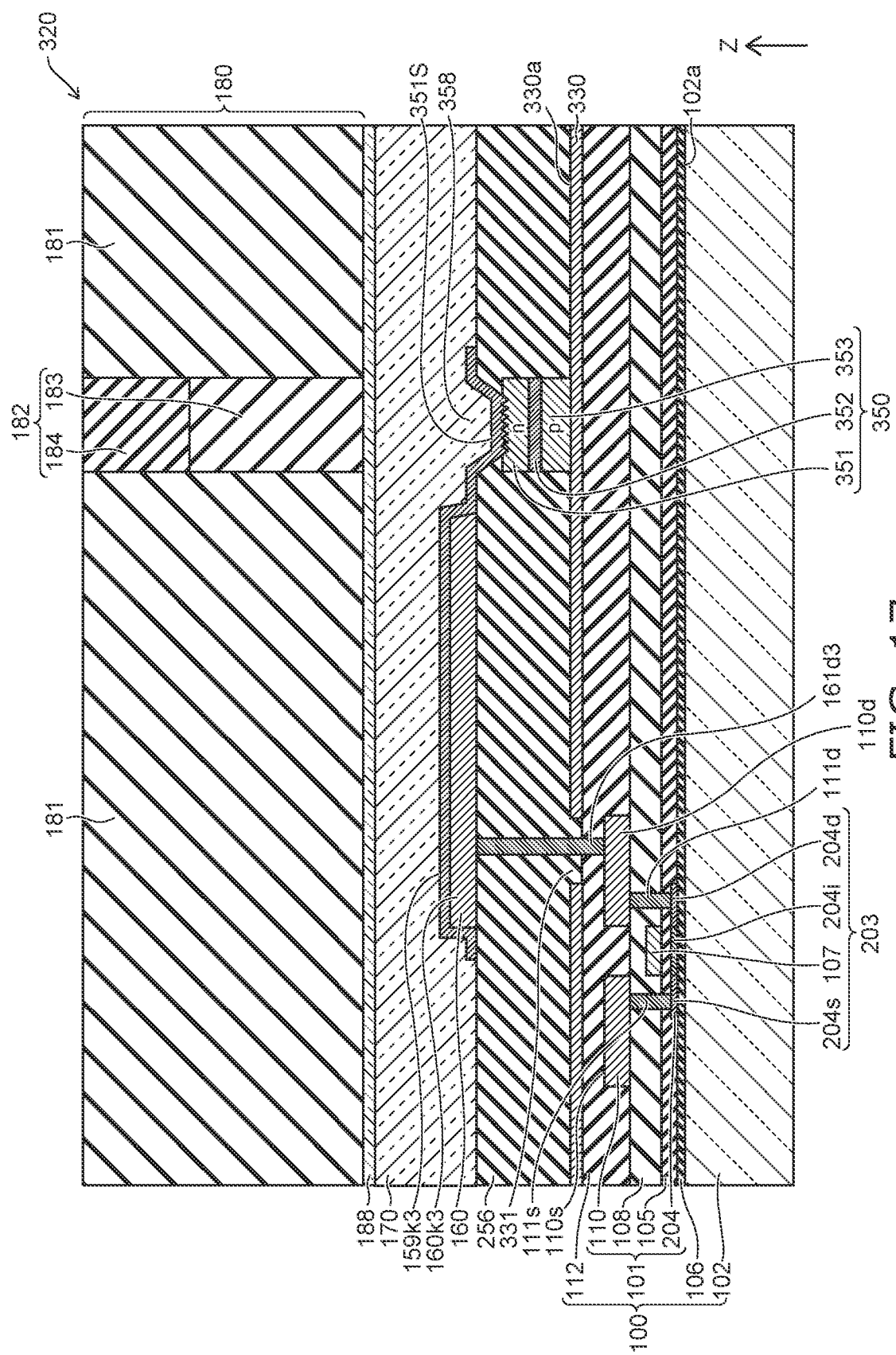
FIG. 17 is a schematic cross-sectional view illustrating a portion of an image display device according to a third embodiment.

FIG. 17 is a schematic cross-sectional view illustrating a portion of an image display device according to the embodiment.

Here, FIG. 17 shows an auxiliary cross section of a position corresponding to line AA' of FIG. 4.

According to the embodiment, the configuration of a light-emitting element 350 and the configuration of a transistor 203 that drives the light-emitting element 350 are different from those of the other embodiments described above. Also, in the example, a conductive layer 330 includes a light-reflecting plate 330a, and the configuration of the light-reflecting plate 330a is different from those of the other embodiments described above. The same components as those of the other embodiments described above are marked with the same reference numerals, and a detailed description is omitted as appropriate.

As shown in FIG. 17, a subpixel 320 of the image display device of the embodiment includes the transistor 203, the light-emitting element 350, and the light-reflecting plate 330a.

In the example, the transistor 203 is an n-channel TFT. The transistor 203 includes a TFT channel 204 and the gate 107. The TFT channel 204 is a region of polycrystalline Si formed on the first surface 102a of the substrate 102 in which a region that is formed as amorphous Si is polycrystallized and activated by annealing by laser irradiation. The TFT channel 204 includes regions 204s, 204i, and 204d. The regions 204s, 204i, and 204d each are located on the TFT lower layer film 106. The region 204i is located between the regions 204s and 204d. The regions 204s and 204d are doped with an n-type impurity such as P, etc., and have ohmic connections with the vias 111s and 111d.

The gate 107 is located on the TFT channel 204 with the insulating layer 105 interposed. A current that flows between the regions 204s and 204d is controlled by a channel that is formed in the region 204i when a potential that is greater than that of the region 204s is applied to the gate 107.

The structure of the upper portion of the transistor 203 and the structure of the wiring layer are the same as those of the other embodiments described above.

The light-reflecting plate 330a is located on the inter-layer insulating film 112. The light-emitting element 350 is located on the light-reflecting plate 330a. In the example, the light-reflecting plate 330a is located over the inter-layer insulating film 112, and the adjacent subpixels and the like and the light-emitting elements for other subpixels also are located on the same light-reflecting plate 330a. In the example, for example, the light-reflecting plate 330a is connected to the power supply line 3 shown in the circuit of FIG. 18 described below. That is, the anode electrode of the light-emitting element 350 included in each subpixel 320 of the image display device of the embodiment is electrically connected to the power supply line 3 via the light-reflecting plate 330a as a common line.

The conductive layer 330 includes a through-hole 331. In the example, the through-hole 331 is located in the light-reflecting plate 330a and is provided for each light-emitting element 350. The through-hole 331 is located at a position that corresponds to the position of a via 161d3 extending through the inter-layer insulating films 112 and 256 when projected onto the XY plane. The through-hole 331 has a diameter that is greater than the diameter of the via 161d3 so that the via 161d3 does not contact the through-hole 331. The material of the inter-layer insulating film 256 is filled between the via 161d3 and the through-hole 331 through which the via 161d3 passes.

The light-emitting element 350 includes a p-type semiconductor layer (a first semiconductor layer) 353, a light-emitting layer 352, and an n-type semiconductor layer (a second semiconductor layer) 351. The p-type semiconductor layer 353, the light-emitting layer 352, and the n-type semiconductor layer 351 are stacked in this order from the first inter-layer insulating film 112 of the circuit board 100 toward a light-emitting surface 351S. Although the light-emitting element 350 has, for example, a substantially square or rectangular shape when projected onto the XY plane, the corners may be rounded. The light-emitting element 350 may have, for example, an elliptical shape or a circular shape when projected onto the XY plane. The degree of freedom of the layout is increased by appropriately selecting the shape, arrangement, and the like of the light-emitting element in a plan view.

The light-emitting element 350 may include the same materials as those of the other embodiments described above. For example, the light-emitting element 350 emits blue light of about 467 nm±20 nm or a bluish-violet light of a wavelength of 410 nm±20 nm.

The second inter-layer insulating film (the second insulating film) 256 covers the first inter-layer insulating film 112 and the light-emitting element 350. The second inter-layer insulating film 256 includes an opening 358. The opening 358 is formed on the light-emitting element 350, and the inter-layer insulating film 256 is not located on the light-emitting surface 351S of the light-emitting element 350. Although it is favorable for the inter-layer insulating film 256 to include a white resin so that the light emitted by the light-emitting element 350 is reflected and effectively radiated from the opening 358, a black resin may be used similarly to the modifications of the other embodiments described above.

The light-emitting surface 351S is a surface of the n-type semiconductor layer 351 that is the surface at the side opposite to the surface contacting the light-emitting layer 352. The light-emitting surface 351S is roughened.

The via 161d3 is provided to extend through the inter-layer insulating films 112 and 256 and the light-reflecting plate 330a. One end of the via 161d3 is connected to the wiring portion 110d.

The wiring layer 160 is located on the inter-layer insulating film 256. The wiring layer 160 includes a wiring portion 160k3. One end of the via 161d3 extending through the second inter-layer insulating film 256 is connected to the wiring portion 110d, and another end of the via 161d3 is connected to the wiring portion 160k3.

The opening 358 is located at a position that corresponds to the light-emitting element 350 of the inter-layer insulating film 256. The light-emitting surface 351S is exposed through the opening 358. A light-transmitting electrode 159k3 is located over the exposed light-emitting surface 351S. The light-transmitting electrode 159k3 is located also on the wiring portion 160k3. The light-transmitting electrode 159k3 is located between the light-emitting surface 351S and the wiring portion 160k3 and connects the n-type semiconductor layer 351 and the wiring portion 160k3. Accordingly, the n-type semiconductor layer 351 is electrically connected to the region 104d corresponding to the drain electrode of the transistor 203 via the light-transmitting electrode 159k3, the wiring portion 160k3, the via 161d3, and the wiring portion 110d.

As described in FIG. 1, FIG. 2A, etc., the connection between the light-emitting element 350 and the wiring portion 160k3 may be a direct connection to the wiring portion 160k3 without going through the light-transmitting electrode 159k3. The wiring portions may be connected without forming the opening 358 by using a transparent resin as the second inter-layer insulating film. In such a case, the roughening process may be omitted.

In the subpixel 320 of the image display device of the embodiment, the surface resin layer 170 is located on the inter-layer insulating film 256 and the wiring layer 160, and the upper structure such as the color filter 180, etc., is formed similarly to those of the other embodiments described above.

Figure 18:
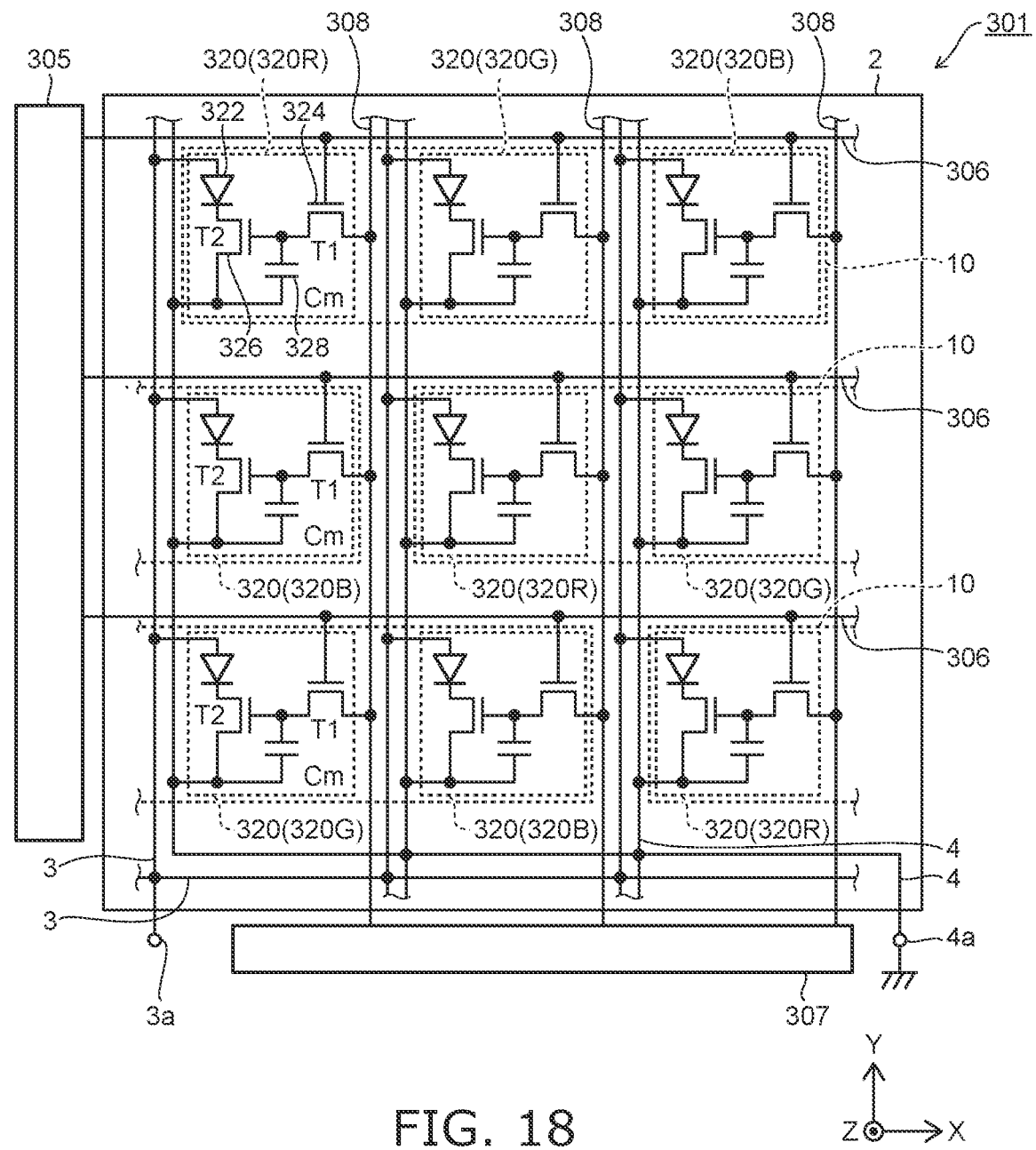
FIG. 18 is a schematic block diagram illustrating the image display device of the third embodiment.

FIG. 18 is a schematic block diagram illustrating the image display device according to the embodiment.

As shown in FIG. 18, the image display device 301 of the embodiment includes the display region 2, a row selection circuit 305, and a signal voltage output circuit 307. Similarly to the other embodiments described above, for example, the subpixels 320 are arranged in a lattice shape in the XY plane in the display region 2.

Similarly to the other embodiments described above, the pixel 10 includes multiple subpixels 320 that emit light of different colors. A subpixel 320R emits red light. A subpixel 320G emits green light. A subpixel 320B emits blue light. The light emission color and luminance of one pixel 10 are determined by the three types of the subpixels 320R, 320G, and 320B emitting light of the desired luminances.

One pixel 10 is made of the three subpixels 320R, 320G, and 320B; for example, the subpixels 320R, 320G, and 320B are arranged in a straight line along the X-axis as in the example. In the pixels 10, subpixels of the same color may be arranged in the same column, or subpixels of different colors may be arranged in each column as in the example.

The subpixel 320 includes a light-emitting element 322, a select transistor 324, a drive transistor 326, and a capacitor 328. In FIG. 18, the select transistor 324 may be displayed as T1; the drive transistor 326 may be displayed as T2, and the capacitor 328 may be displayed as Cm.

According to the embodiment, the light-emitting element 322 is located at the power supply line 3 side, and the drive transistor 326 that is connected in series to the light-emitting element 322 is located at the ground line 4 side. That is, the drive transistor 326 is connected to the side of a lower potential than the light-emitting element 322. The drive transistor 326 is an n-channel transistor.

The select transistor 324 is connected between a signal line 308 and the gate electrode of the drive transistor 326. The capacitor 328 is connected between the ground line 4 and the gate electrode of the drive transistor 326.

The polarities of the signal voltages supplied by the row selection circuit 305 and the signal voltage output circuit 307 to the signal line 308 to drive the drive transistor 326 that is the n-channel transistor are different from those of the other embodiments described above.

According to the embodiment, the polarity of the drive transistor 326 is an n-channel; therefore, the polarities of the signal voltages, etc., are different from those of the other embodiments described above. In other words, the row selection circuit 305 supplies a select signal to a scanning line 306 to sequentially select one row from the arrangement of m rows of the subpixels 320. The signal voltage output circuit 307 supplies signal voltages that have analog voltage values necessary for the subpixels 320 of the selected row. The drive transistors 326 of the subpixels 320 of the selected row cause currents that correspond to the signal voltages to flow in the light-emitting element 322. The light-emitting elements 322 emit light of luminances corresponding to the currents that flow.

A method for manufacturing the image display device of the embodiment will now be described.

FIGS. 19A to 21C are schematic cross-sectional views illustrating the method for manufacturing the image display device of the embodiment.

Figure 19A:
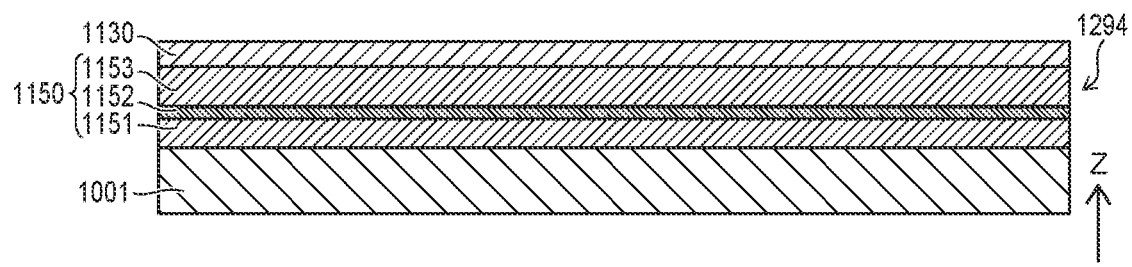
FIG. 19A is a schematic cross-sectional view illustrating a method for manufacturing the image display device of the third embodiment.

According to the embodiment as shown in FIG. 19A, the semiconductor growth substrate 1294 is used. In the semiconductor growth substrate 1294, the semiconductor layer 1150 includes the n-type semiconductor layer 1151, the light-emitting layer 1152, and the p-type semiconductor layer 1153 grown and stacked on the crystal growth substrate 1001 in this order from the crystal growth substrate 1001 side.

A metal layer 1130 is formed at the exposed surface of the p-type semiconductor layer 1153 at the side opposite to the surface at which the light-emitting layer 1152 is located. The metal layer 1130 includes, for example, T1, Al, an alloy of T1 and Sn, etc. Cu, V, or the like, or a highly-light-reflective noble metal such as Ag, Pt, etc., may be included.

It is advantageous to form the metal layer on the surface of the p-type semiconductor layer 1153 because the p-type semiconductor layer 1153 can be protected by the metal layer 1130, and it is easier to store the semiconductor growth substrate 1294 on which the metal layer 1130 is formed. It is also possible to further reduce the drive voltage of the light-emitting element 350 described above by forming a thin film layer that uses a hole-injection material at the interface between the p-type semiconductor layer 1153 and the metal layer 1130. For example, an ITO film or the like may be favorably used as such a hole-injection material.

Figure 19B:
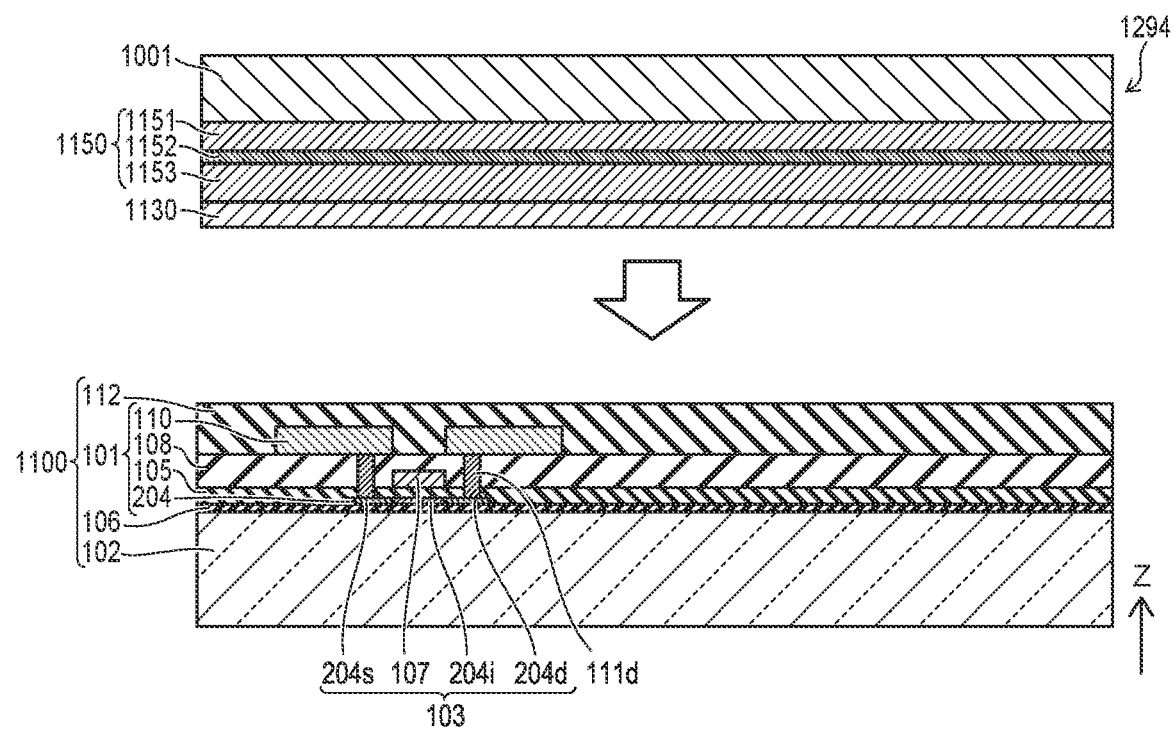
FIG. 19B is a schematic cross-sectional view illustrating the method for manufacturing the image display device of the third embodiment.

As shown in FIG. 19B, the exposed surface of the metal layer 1130 located in the semiconductor growth substrate 1294 and the uncovered surface of the first inter-layer insulating film 112 of the circuit board 1100 are bonded.

In the wafer bonding process, as described in the first embodiment, the bonding may be performed by removing the crystal growth substrate 1001 after transferring the semiconductor growth substrate to a support substrate and after forming the metal layer 1130. In such a case, the semiconductor growth substrate 1194 in which the p-type semiconductor layer 1153, the light-emitting layer 1152, and the n-type semiconductor layer 1151 are grown and stacked on the crystal growth substrate 1001 in this order from the crystal growth substrate 1001 side is used. The semiconductor growth substrate 1194 is already described with reference to FIG. 5A. The metal layer 1130 is formed at the exposed surface of the p-type semiconductor layer 1153 of the semiconductor growth substrate 1194.

Also, similarly to the description of the first embodiment, the semiconductor layer 1150 may be grown on the crystal growth substrate 1001 via a buffer layer.

A metal layer may be located also at the circuit board 1100 side.

Figure 20A:
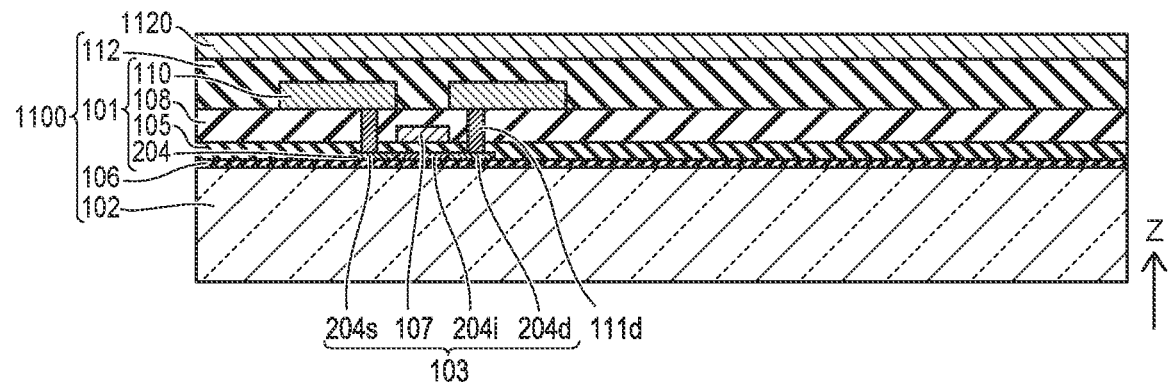
FIG. 20A is a schematic cross-sectional view illustrating the method for manufacturing the image display device of the third embodiment.
Figure 20B:
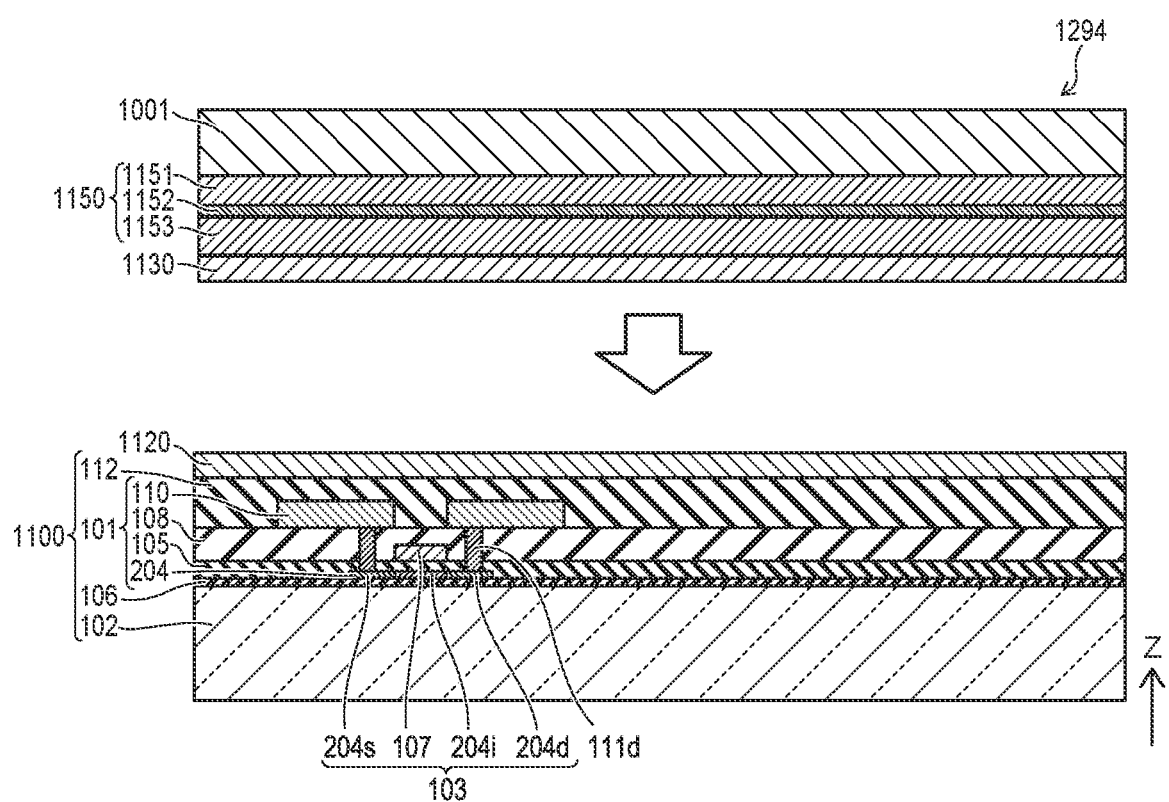
FIG. 20B is a schematic cross-sectional view illustrating the method for manufacturing the image display device of the third embodiment.

A case where a metal layer 1120 is formed also at the circuit board 1100 side is shown in FIGS. 20A and 20B.

As shown in FIG. 20A, the metal layer 1120 is formed on the inter-layer insulating film 112 of the circuit board 1100 that is prepared.

As shown in FIG. 20B, the circuit board 1100 on which the metal layer 1120 is formed is bonded to the semiconductor growth substrate 1294 in which the metal layer 1130 is formed. According to the modification, the metal layers are bonded to each other; therefore, the wafer bonding can be more easily performed by using the same metal material in the metal layers or by using alloys including the same metal material. It is sufficient to provide the metal layer in at least one of the semiconductor growth substrate 1294 side or the circuit board 1100 side.

Figure 21A:
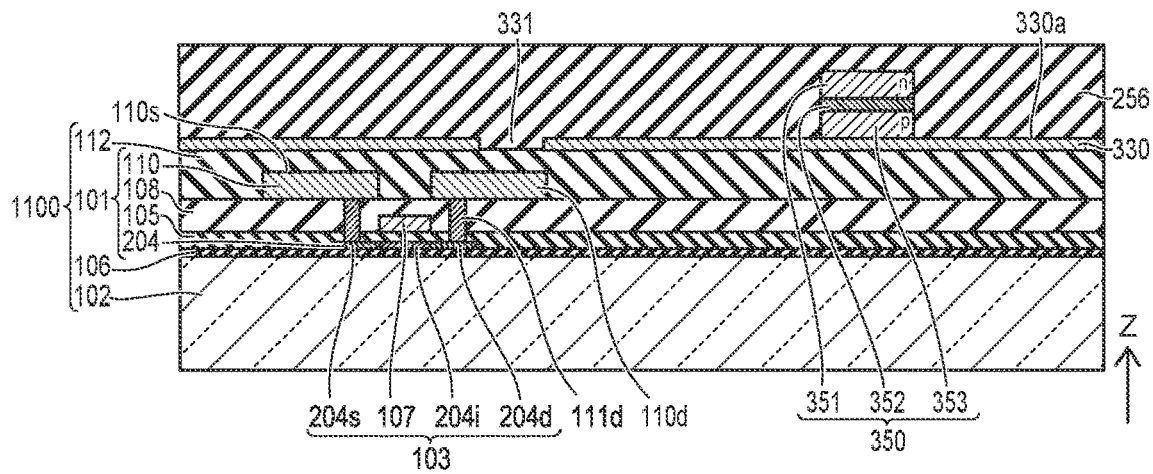
FIG. 21A is a schematic cross-sectional view illustrating the method for manufacturing the image display device of the third embodiment.

As shown in FIG. 21A, after the wafer bonding, the crystal growth substrate 1001 is removed by wet etching, laser lift-off, etc., and the light-emitting element 350 is formed by etching the semiconductor layer 1150 by anisotropic etching, etc. The through-hole 331 is formed in the light-reflecting plate 330a at a position that corresponds to the wiring portion 110d. The second inter-layer insulating film 256 is formed to cover the conductive layer 330, the first inter-layer insulating film 112, and the light-emitting element 350.

Figure 21B:
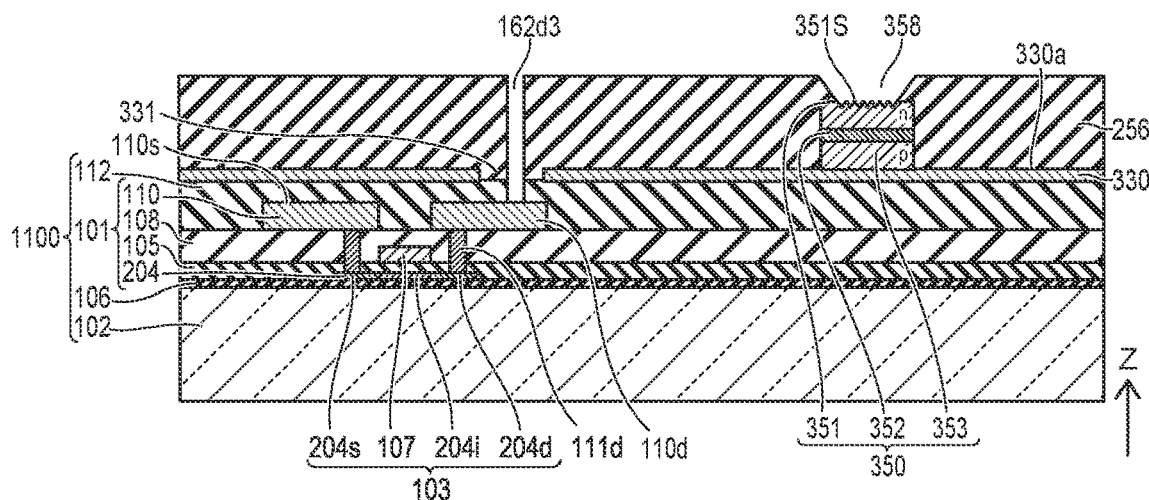
FIG. 21B is a schematic cross-sectional view illustrating the method for manufacturing the image display device of the third embodiment.

As shown in FIG. 21B, a via hole 162d3 is formed in the second inter-layer insulating film 256. RIE or the like is used to form the via hole 162d3. The opening 358 is formed at a location of the inter-layer insulating film 256 corresponding to the light-emitting element 350 when projected onto the XY plane. In the example, the light-emitting surface 351S that is exposed through the opening 358 is roughened.

Figure 21C:
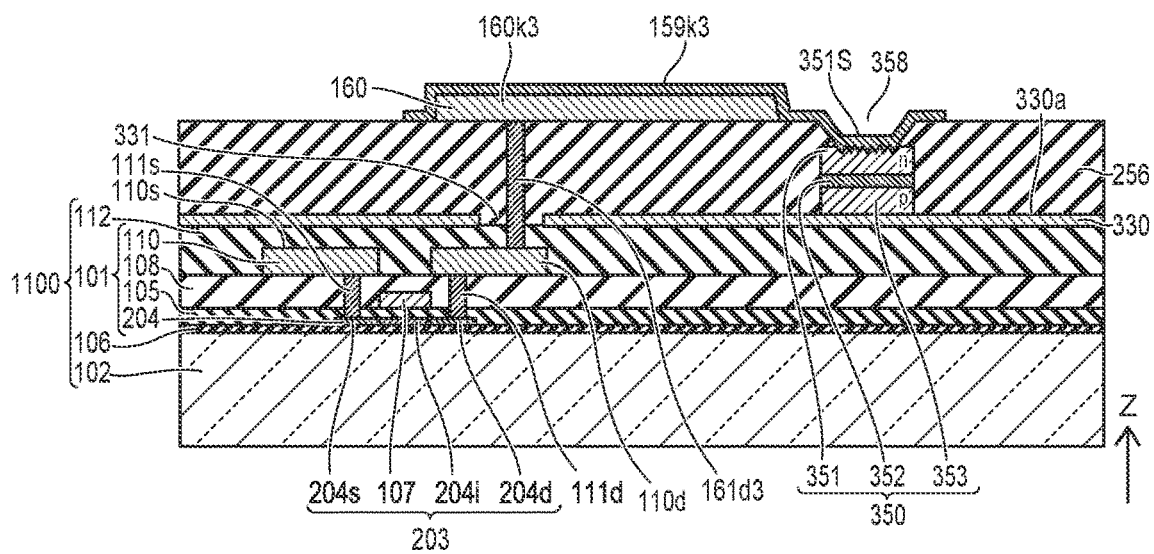
FIG. 21C is a schematic cross-sectional view illustrating the method for manufacturing the image display device of the third embodiment.

As shown in FIG. 21C, a conductive material is filled into the via hole 162d3. The second wiring layer 160 is formed and the wiring portion 160k3 is formed subsequently or simultaneously with filling the via holes, etc. The n-type semiconductor layer 351 and the wiring portion 160k3 are electrically connected by forming the light-transmitting electrode 159k3 on the light-emitting surface 351S and on the wiring portion 160k3.

Thereafter, similarly to the other embodiments described above, the surface resin layer 170 that covers the inter-layer insulating film 256 and the wiring layer 160 is formed; the upper structure such as the color filter, etc., is formed; subsequently, cutting into each image display device 301 is performed. Thus, the image display device 301 can be manufactured.

The light-reflecting plate 330a is not limited to a single light-reflecting plate 330a; multiple light-reflecting plates 330a may be provided in an island configuration for each light-emitting element 350 or for multiple light-emitting elements 350 and electrically connected by wiring portions included in the conductive layer 330.

Although the light-reflecting plate 330a of the conductive layer 330 is connected to the same potential for all of the light-emitting elements 350 corresponding to the subpixels 320 described above, for example, the light-reflecting plate 330a may be connected to different power supply lines 3, that is, separate power supply potentials.

Effects of the image display device 301 of the embodiment will now be described.

According to the embodiment as well, effects similar to those of the other embodiments described above are obtained. Namely, the individual light-emitting elements 350 are formed by etching after bonding the semiconductor layer 1150 to the circuit board 1100; therefore, the transfer process of the light-emitting elements can be markedly shortened.

In addition to the effects of the other embodiments described above, in the image display device of the embodiment, the conductive layer 330 includes a single light-reflecting plate 330a, and a simple pattern that includes only the through-hole 331 can be used; therefore, the pattern design is easier, and the development period of the image display device, etc., can be shortened.

According to the embodiment, the light-emitting surface 351S can be more easily roughened by using the n-type semiconductor layer 351 as the light-emitting surface 351S, and the subpixel that has a high luminous efficiency can be formed by connecting the wiring portion 160k3 to the light-emitting surface 351S. When roughening the light-emitting surface, the etching can be deeper when the thickness of the semiconductor layer to be roughened is thick, and the connection area can be increased. It is easy to reduce the resistance of the n-type semiconductor layer 351, and the n-type semiconductor layer 351 can be formed to be thicker without increasing the resistance value, which is advantageous because the etching can be deeper.

Fourth Embodiment

In an image display device of the embodiment, instead of a glass substrate, circuit elements such as transistors, etc., are formed on a substrate that is flexible. Otherwise, the embodiment is similar to the other embodiments described above; the same components are marked with the same reference numerals, and a detailed description is omitted as appropriate.

Figure 22:
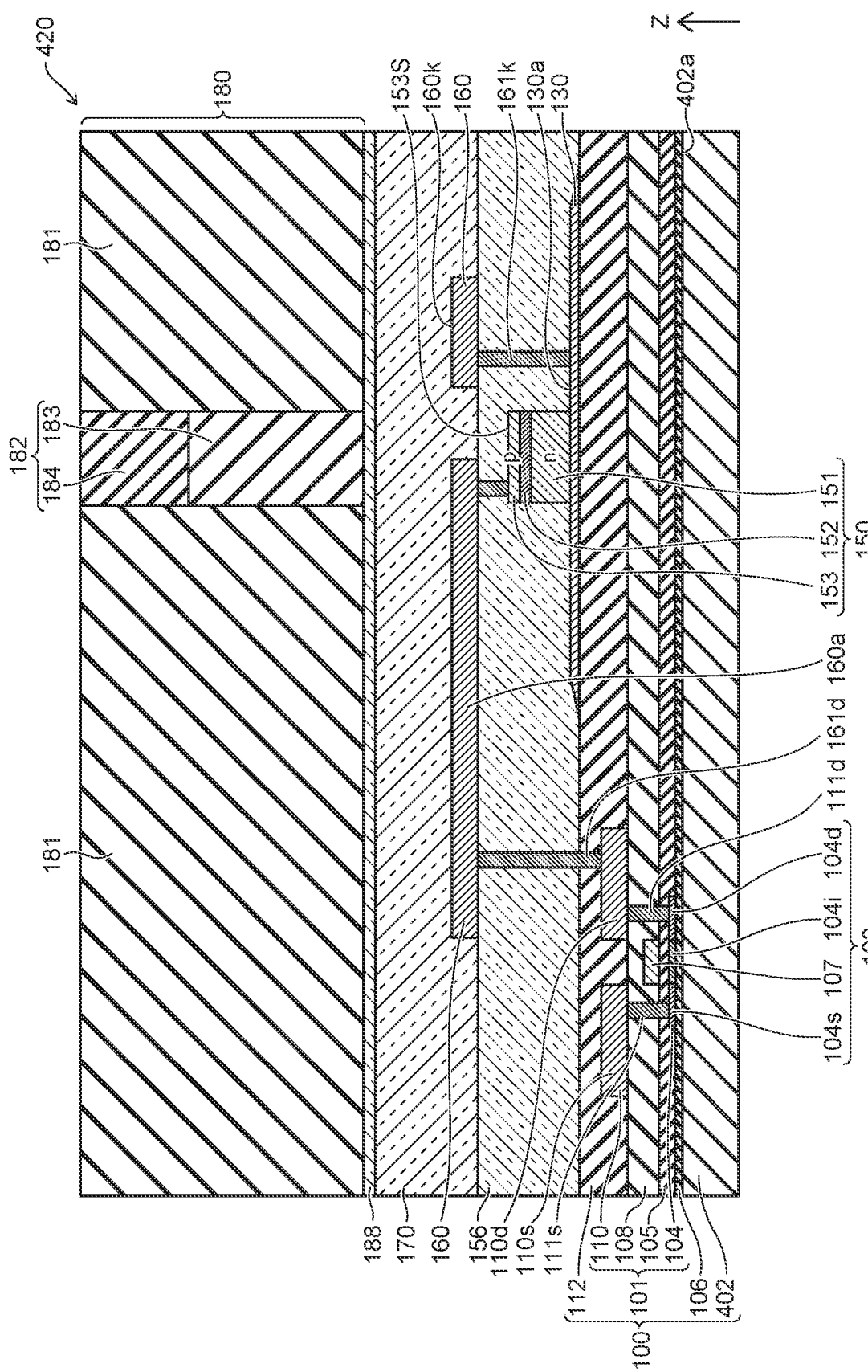
FIG. 22 is a schematic cross-sectional view illustrating a portion of an image display device according to a fourth embodiment.

FIG. 22 is a schematic cross-sectional view illustrating a portion of the image display device according to the embodiment.

FIG. 22 shows an auxiliary cross section at a position corresponding to line AA' shown in FIG. 4.

As shown in FIG. 22, the image display device of the embodiment includes a subpixel 420. The subpixel 420 includes a substrate 402. The substrate 402 includes a first surface 402a. The circuit elements such as the transistor 103, etc., are located on the first surface 402a. In the subpixel 420, the upper structure that includes the circuit element is formed on the first surface 402a.

The substrate 402 is flexible. The substrate 402 is, for example, a polyimide resin, etc. It is favorable for the inter-layer insulating films 112 and 156, the wiring layers 110 and 160, etc., to be formed of materials that are somewhat flexible to correspond to the flexibility of the substrate 402. The wiring layer 110 that has the longest wiring length has the highest risk of damaging when bending. Therefore, it is desirable to adjust the various film thicknesses and film properties to cause the neutral surface that includes the multiple protective films added to the front surface and/or the back surface, etc., to be at the position of the wiring layer 110 as necessary.

In the example, the transistor 103 and the light-emitting element 150 formed on the substrate 402 are similar to those of the first embodiment; for example, the circuit configuration of FIG. 3 is applied. Configurations including the circuit configurations of the other embodiments can be easily applied.

A method for manufacturing the image display device of the embodiment will now be described.

Figure 23A:
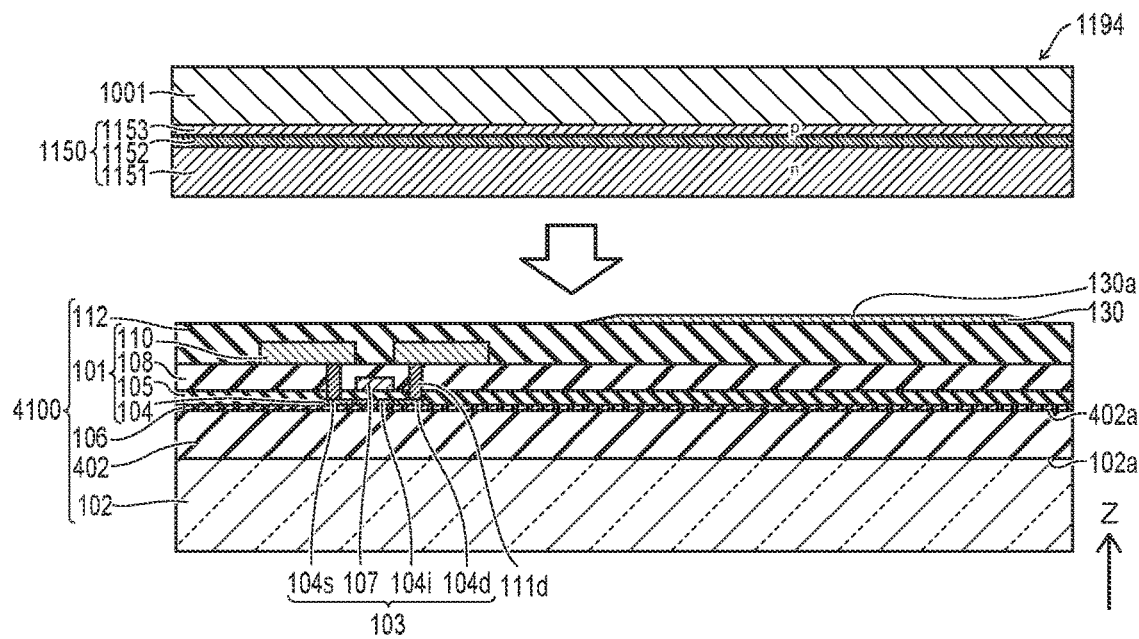
FIG. 23A is a schematic cross-sectional view illustrating a method for manufacturing the image display device of the fourth embodiment.
Figure 23B:
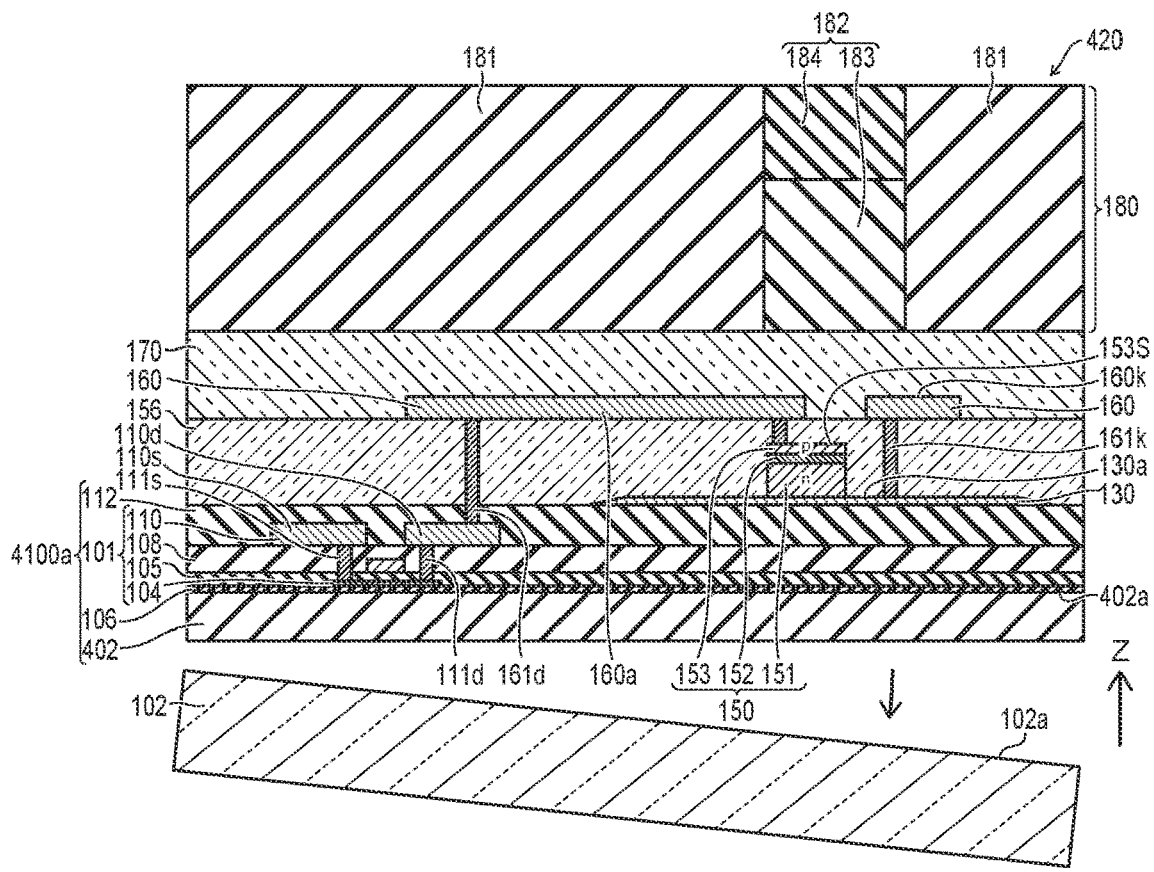
FIG. 23B is a schematic cross-sectional view illustrating the method for manufacturing the image display device of the fourth embodiment.

FIGS. 23A to 23B are schematic cross-sectional views illustrating the method for manufacturing the image display device of the embodiment.

According to the embodiment as shown in FIG. 23A, a circuit board (a third substrate) 4100 that is different from those of the other embodiments described above is prepared. The circuit board 4100 includes the two layers of the substrates 102 and 402. The substrate 402 (the fourth substrate) is located on the first surface 102a of the substrate 102 and is formed by, for example, coating a polyimide material and sintering. An inorganic film of $SiN_x$, etc., also may be sandwiched between the two layers of the substrates 102 and 402. The TFT lower layer film 106, the circuit 101, and the inter-layer insulating film 112 are located on the first surface 402a of the substrate 402. The first surface 402a of the substrate 402 is the surface at the side opposite to the surface at which the substrate 102 is located.

The semiconductor layer 1150 of the semiconductor growth substrate 1194 that is prepared is bonded to such a circuit board 4100. Subsequently, similarly to the other embodiments described above, the light-emitting element 150, the inter-layer insulating film 156, and the second wiring layer 160 are formed, and the upper structure such as the color filter 180, etc., is formed. For example, manufacturing processes that correspond to FIGS. 5A to 14D already described are applied.

As shown in FIG. 23B, the substrate 102 is removed from the structure body in which the upper structure such as the color filter, etc., is formed, and a new circuit board 4100a is formed. For example, laser lift-off or the like is used to remove the substrate 102. The removal of the substrate 102 is not limited to the timing described above and can be performed at another appropriate timing. For example, the substrate 102 may be removed after the wafer bonding or before forming the color filter. By removing the substrate 102 at an earlier timing, discrepancies such as cracking, chipping, etc., in the manufacturing processes can be reduced.

Effects of the image display device of the embodiment will now be described.

Because the substrate 402 is flexible, bending of the image display device is possible; adhering to a curved surface, utilizing in a wearable terminal, etc., can be realized without discomfort.

Fifth Embodiment

According to the embodiment, an image display device that has a higher luminous efficiency is realized by forming multiple light-emitting surfaces that correspond to multiple light-emitting elements in a single semiconductor layer that includes a light-emitting layer. In the following description, the same components as those of the other embodiments described above are marked with the same reference numerals, and a detailed description is omitted as appropriate.

Figure 24:
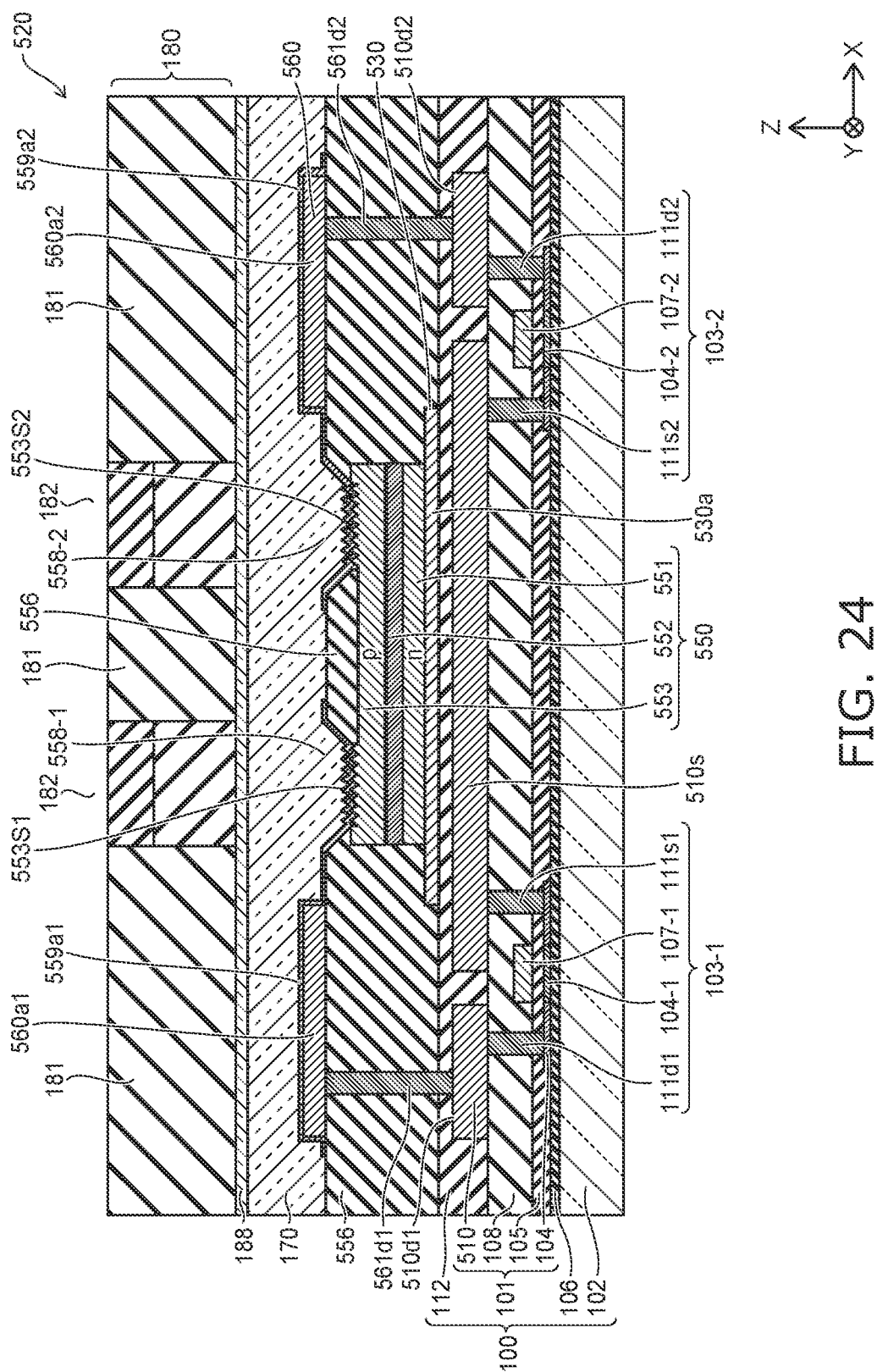
FIG. 24 is a schematic cross-sectional view illustrating a portion of an image display device according to a fifth embodiment.

FIG. 24 is a schematic cross-sectional view illustrating a portion of the image display device according to the embodiment.

The cross-sectional view of FIG. 24 shows a cross section of a surface parallel to the XZ plane.

As shown in FIG. 24, the image display device includes a subpixel group 520. The subpixel group 520 includes transistors 103-1 and 103-2, a first wiring layer 510, the first inter-layer insulating film 112, a conductive layer 530, a semiconductor layer 550, a second inter-layer insulating film 556, a second wiring layer 560, and vias 561d1 and 561d2.

The semiconductor layer 550 includes two light-emitting surfaces 553S1 and 553S2, and the subpixel group 520 substantially includes two subpixels. According to the embodiment, similarly to the other embodiments described above, a display region is formed by arranging the subpixel group 520 that substantially includes two subpixels in a lattice shape.

The transistors 103-1 and 103-2 are formed respectively in TFT channels 104-1 and 104-2. In the example, the TFT channels 104-1 and 104-2 include regions doped to be of the p-type, and includes a channel region between these regions.

The insulating layer 105 is formed on the TFT channels 104-1 and 104-2, and gates 107-1 and 107-2 each are formed with the insulating layer 105 interposed. The gates 107-1 and 107-2 are gates of the transistors 103-1 and 103-2. In the example, the transistors 103-1 and 103-2 are p-channel TFTs.

The insulating film 108 covers the tops of the two transistors 103-1 and 103-2. The first wiring layer 510 is formed on the insulating film 108.

Vias 111s1 and 111d1 are located between the wiring layer 510 and the region of the transistor 103-1 doped to be of the p-type. Vias 111s2 and 111d2 are located between the wiring layer 510 and the region of the transistor 103-2 doped to be of the p-type.

The first wiring layer 510 includes wiring portions 510s, 510d1, and 510d2. The wiring portion 510s is electrically connected to regions that correspond to the source electrodes of the transistors 103-1 and 103-2 by the vias 111s1 and 111s2. For example, the wiring portion 510s is connected to the power supply line 3 of FIG. 3.

The wiring portion 510d1 is connected to a region that corresponds to the drain electrode of the transistor 103-1 by the via 111d1. The wiring portion 510d2 is connected to a region that corresponds to the drain electrode of the transistor 103-2 by the via 111d2.

The first inter-layer insulating film 112 covers the transistors 103-1 and 103-2 and the wiring layer 510. The semiconductor layer 550 is located on the inter-layer insulating film 112. The single semiconductor layer 550 is located between the two drive transistors 103-1 and 103-2 arranged along the X-axis direction. The conductive layer 530 is formed on the first inter-layer insulating film 112.

The conductive layer 530 is located between the semiconductor layer 550 and the first inter-layer insulating film 112. The conductive layer 530 includes a light-reflecting plate (a part) 530a that is conductive and light-reflective, and the semiconductor layer 550 is located on the light-reflecting plate 530a. In the example, for example, the light-reflecting plate 530a is connected to the ground line 4 of the circuit of FIG. 3 described above. The single semiconductor layer 550 is located between the two drive transistors 103-1 and 103-2 arranged along the X-axis direction.

The semiconductor layer 550 includes an n-type semiconductor layer (a first semiconductor layer) 551, a light-emitting layer 552, and a p-type semiconductor layer (a second semiconductor layer) 553. The semiconductor layer 550 includes the n-type semiconductor layer 551, the light-emitting layer 552, and the p-type semiconductor layer 553 stacked in this order from the inter-layer insulating film 112 side toward the side of the light-emitting surfaces 553S1 and 553S2. The light-reflecting plate 530a is electrically connected with the n-type semiconductor layer 551.

The second inter-layer insulating film (the second insulating film) 556 covers the first inter-layer insulating film 112, the conductive layer 530, and the semiconductor layer 550. The inter-layer insulating film 556 covers a portion of the semiconductor layer 550. It is favorable for the inter-layer insulating film 556 to cover the surface of the p-type semiconductor layer 553 other than the light-emitting surfaces 553S1 and 553S2 of the semiconductor layer 550. The inter-layer insulating film 556 covers the side surface of the semiconductor layer 550. It is favorable for the inter-layer insulating film 556 to be a white resin.

Light-transmitting electrodes 559a1 and 559a2 cover the part of the semiconductor layer 550 that is not covered with the inter-layer insulating film 556. The light-transmitting electrodes 559a1 and 559a2 are located on the light-emitting surfaces 553S1 and 553S2 of the p-type semiconductor layer 553 respectively exposed through openings 558-1 and 558-2 of the inter-layer insulating film 556. The light-transmitting electrodes 559a1 and 559a2 are electrically connected to the p-type semiconductor layer 553.

The vias 561d1 and 561d2 are provided to extend through the inter-layer insulating films 556 and 112. One end of each of the vias 561d1 and 561d2 are connected respectively to the wiring portions 510d1 and 510d2.

The second wiring layer 560 is located on the inter-layer insulating film 556. The wiring layer 560 includes interconnects 560a1 and 560a2. The via 561d1 is located between the wiring portion 510d1 and the wiring portion 560a1. The via 561d2 is located between the wiring portion 510d2 and the wiring portion 560a2. Other ends of the vias 561d1 and 561d2 are connected respectively to the wiring portions 560a1 and 560a2.

The light-transmitting electrode 559a1 is located on the wiring portion 560a1, and is electrically connected to the wiring portion 560a1 and the light-transmitting electrode

559a1. The light-transmitting electrode 559a1 extends to the opening 558-1. The light-transmitting electrode 559a1 is located over the entire surface of the light-emitting surface 553S1 exposed through the opening 558-1, and is electrically connected to the p-type semiconductor layer 553 via the light-emitting surface 553S1.

The light-transmitting electrode 559a2 is located on the wiring portion 560a2, and is electrically connected to the wiring portion 560a2 and the light-transmitting electrode 559a2. The light-transmitting electrode 559a2 extends to the opening 558-2. The light-transmitting electrode 559a2 is located over the entire surface of the light-emitting surface 553S2 exposed through the opening 558-2, and is electrically connected to the p-type semiconductor layer 553 via the light-emitting surface 553S2.

The inter-layer insulating film 556 is located between the openings 558-1 and 558-2. The openings 558-1 and 558-2 are located between the wiring portions 560a1 and 560a2. The openings 558-1 and 558-2 have, for example, square or rectangular shapes when projected onto the XY plane. The shapes are not limited to rectangular and may be circular, elliptical, polygonal such as hexagonal, etc. The light-emitting surfaces 553S1 and 553S2 also are square, rectangular, another polygon, circular, etc., when projected onto the XY plane. The shapes of the light-emitting surfaces 553S1 and 553S2 may be similar to the shapes of the openings 558-1 and 558-2, or may be different shapes.

As described above, the light-transmitting electrodes 559a1 and 559a2 are connected respectively to the light-emitting surfaces 553S1 and 553S2 exposed through the openings 558-1 and 558-2. When the transistor 103-1 is switched on, holes are injected into the light-transmitting electrode 559a1 via the wiring portion 560a1, the via 561d1, and the wiring portion 510d1. When the transistor 103-2 is switched on, holes are injected into the light-transmitting electrode 559a2 via the wiring portion 560a2, the via 561d2, and the wiring portion 510d2. On the other hand, electrons are injected into the n-type semiconductor layer 551 via the light-reflecting plate 530a connected to the ground line 4.

The transistors 103-1 and 103-2 are drive transistors of adjacent subpixels, and are sequentially driven. Accordingly, holes that are injected from one of the two transistors 103-1 and 103-2 are injected into the light-emitting layer 552; electrons that are injected from the light-reflecting plate 530a are injected into the light-emitting layer 352, and the light-emitting layer 352 emits light. The light-emitting surface 553S1 emits light when the transistor 103-1 is switched on, and the light-emitting surface 553S2 emits light when the transistor 103-2 is switched on. Thus, the localize of the light emission in the light-emitting layer 552 is because the drift current that flows in a direction parallel to the XY plane in the semiconductor layer 550 is suppressed by the resistances of the p-type semiconductor layer 553 and the n-type semiconductor layer 551.

A method for manufacturing the image display device of the embodiment will now be described.

FIGS. 25A to 26B are schematic cross-sectional views illustrating the method for manufacturing the image display device of the embodiment.

Figure 25A:
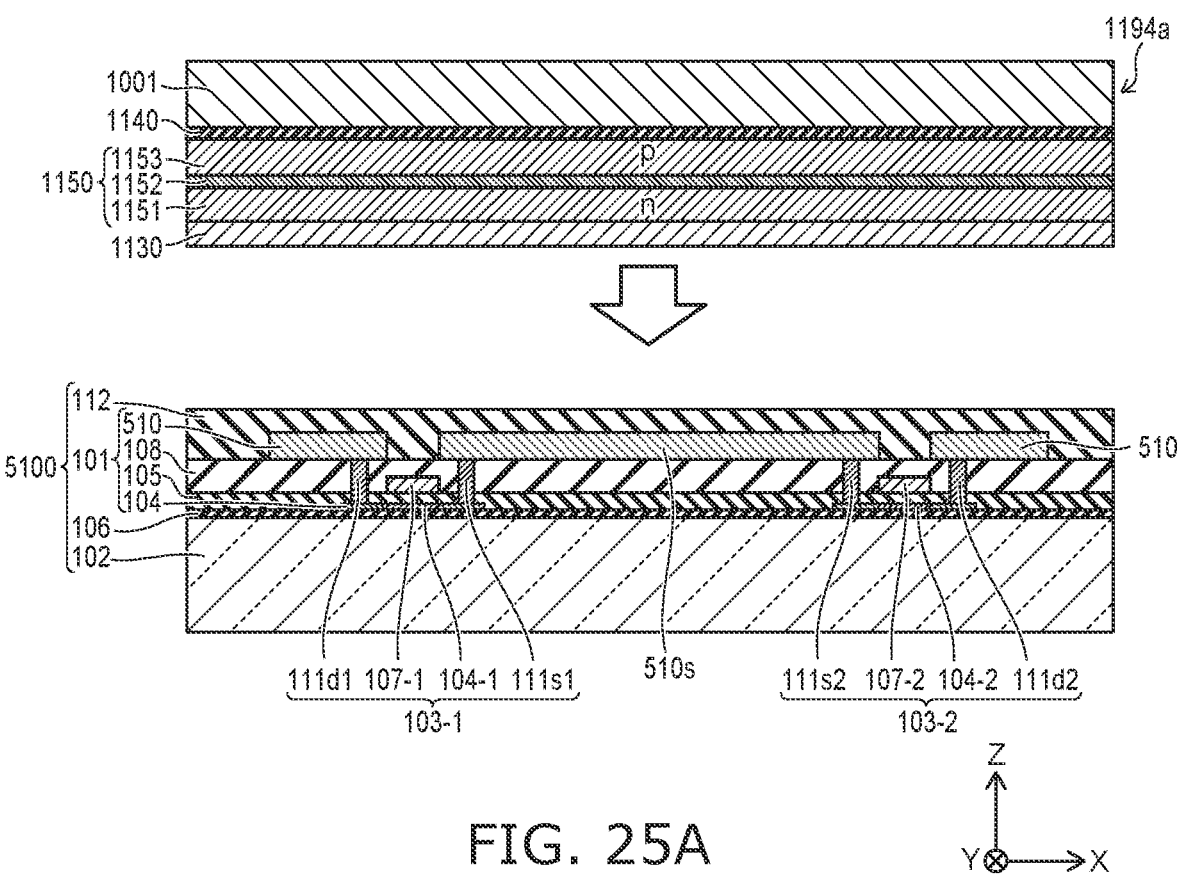
FIG. 25A is a schematic cross-sectional view illustrating a method for manufacturing the image display device of the fifth embodiment.

The semiconductor growth substrate 1194a is prepared as shown in FIG. 25A. The semiconductor growth substrate 1194a includes the p-type semiconductor layer 1153, the light-emitting layer 1152, and the n-type semiconductor layer 1151 stacked on the crystal growth substrate 1001 side with the buffer layer 1140 interposed. The metal layer 1130 is formed at the exposed surface of the n-type semiconductor layer 1151 of the semiconductor growth substrate 1194a. The semiconductor growth substrate 1194a in which the metal layer 1130 is formed is bonded to a circuit board 5100 that is prepared. In the circuit board 5100, the transistors 103-1 and 103-2, the wiring layer 510, and the inter-layer insulating film 112 are formed on the substrate 102 that is made of glass. Similarly to the first embodiment described above, etc., the semiconductor layer 1150 may be grown on the semiconductor growth substrate without providing the buffer layer 1140.

The formation of the semiconductor growth substrate, etc., is similar to that already described for the other embodiments described above and the modifications of the other embodiments, and a detailed description is omitted. For the circuit board 5100 as well, although the configuration of the circuit may be different from those of the other embodiments described above, nearly all of the other parts are similar to the structures already described. Hereinbelow, only the reference numerals are replaced, and a detailed description is omitted as appropriate.

Figure 25B:
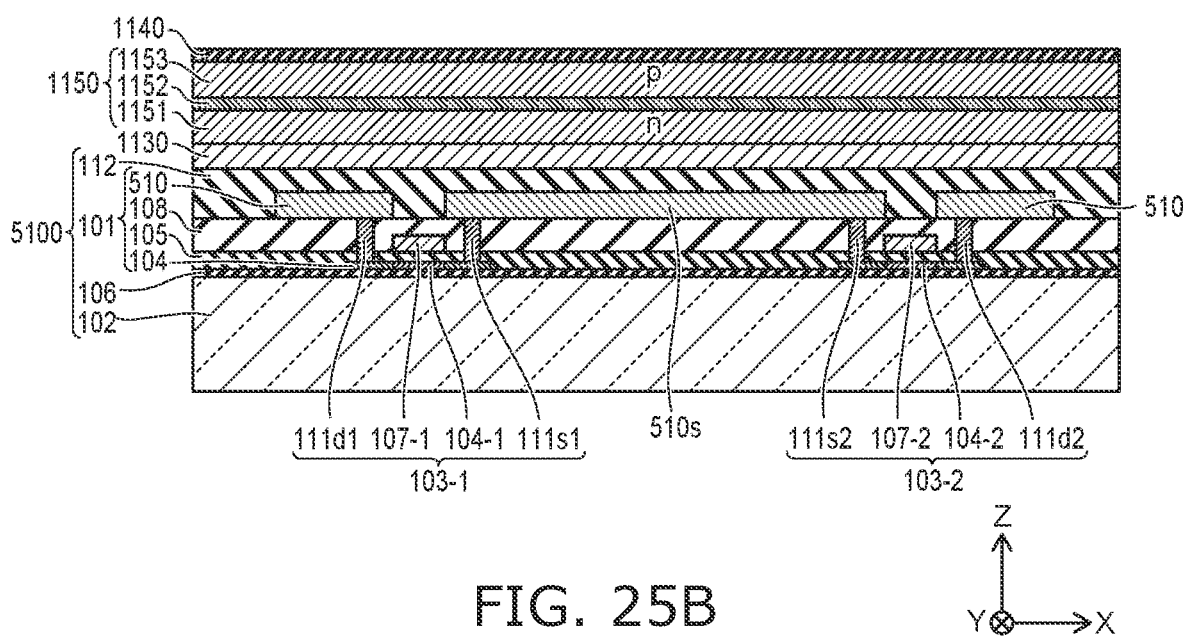
FIG. 25B is a schematic cross-sectional view illustrating the method for manufacturing the image display device of the fifth embodiment.

As shown in FIG. 25B, after wafer bonding of the circuit board 5100 and the semiconductor growth substrate 1194a in which the metal layer 1130 is formed, the crystal growth substrate 1001 is removed by wet etching, laser lift-off, etc.

Figure 26A:
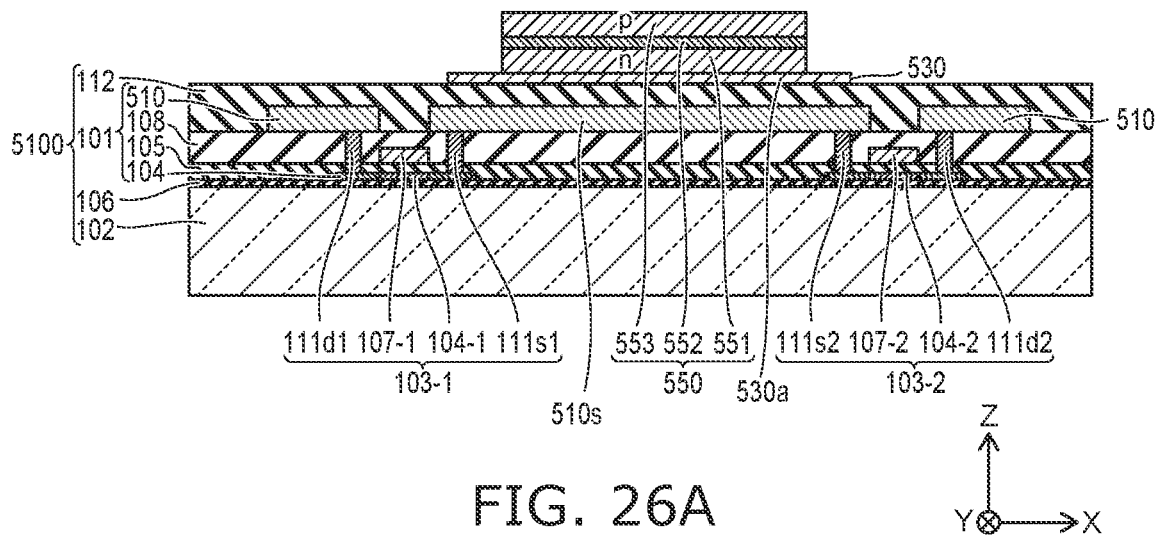
FIG. 26A is a schematic cross-sectional view illustrating the method for manufacturing the image display device of the fifth embodiment.

As shown in FIG. 26A, the buffer layer 1140 shown in FIG. 25B is removed, and the semiconductor layer 550 is formed by etching the semiconductor layer 1150. The semiconductor layer 1150 may be etched with the buffer layer 1140 as-is, and the buffer layer 1140 may be subsequently removed. Also, the conductive layer 530 that includes the light-reflecting plate 530a is formed by also etching the metal layer 1130. The outer perimeter of the semiconductor layer 1150, when projected onto the XY plane, is located within the outer perimeter of the light-reflecting plate 530a.

Figure 26B:
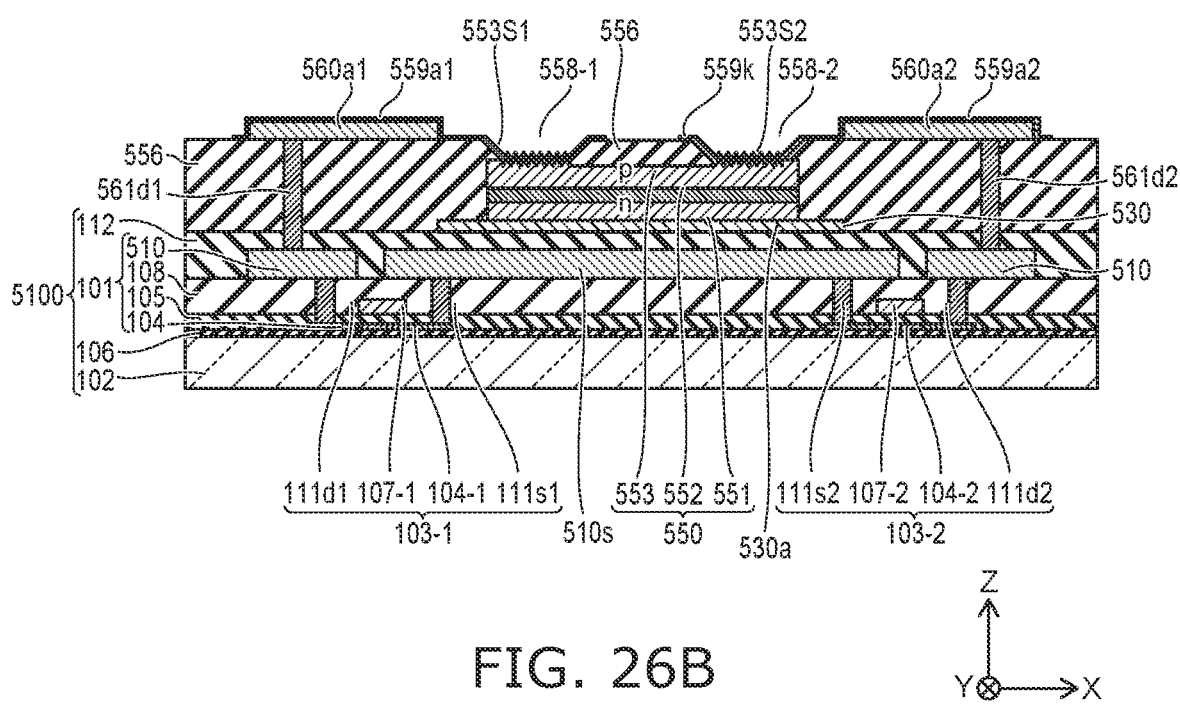
FIG. 26B is a schematic cross-sectional view illustrating the method for manufacturing the image display device of the fifth embodiment.

As shown in FIG. 26B, the second inter-layer insulating film 556 is formed on the first inter-layer insulating film 112 and the semiconductor layer 550. The vias 561d1 and 561d2 are formed in the inter-layer insulating film 556. Also, the wiring layer 560 is formed, and the wiring portions 560a1 and 560a2, etc., are formed.

Subsequently, the openings 558-1 and 558-2 are formed between the wiring portions 560a1 and 560a2. The light-emitting surfaces 553S1 and 553S2 of the p-type semiconductor layer exposed through the openings 558-1 and 558-2 each are roughened. Subsequently, the light-transmitting electrodes 559a1 and 559a2 are formed.

Thus, the subpixel group 520 that includes the semiconductor layer 550 that shares the two light-emitting surfaces 553S1 and 553S2 is formed.

Although the two light-emitting surfaces 553S1 and 553S2 are located in one semiconductor layer 550 according to the example, the number of light-emitting surfaces is not limited to two; it is also possible to provide three or more light-emitting surfaces in one semiconductor layer 550. As an example, one column or two columns of subpixels may be realized in a single semiconductor layer 550. As described below, the recombination current that does not contribute to the light emission per light-emitting surface is reduced thereby, and the effect of realizing a finer light-emitting element can be increased.

(Modification)

Figure 27:
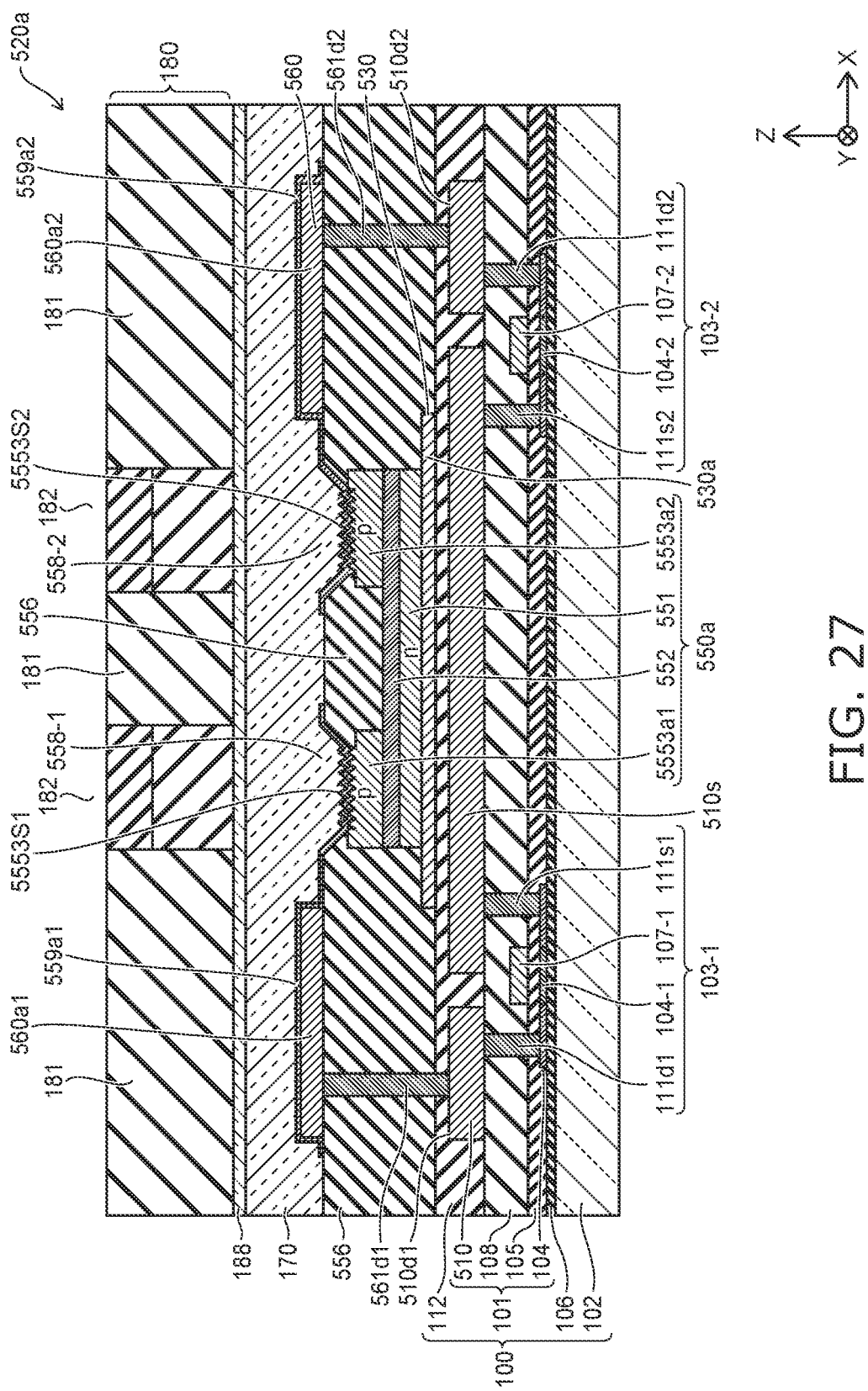
FIG. 27 is a schematic cross-sectional view illustrating a portion of an image display device according to a modification of the fifth embodiment.

FIG. 27 is a schematic cross-sectional view illustrating a portion of an image display device according to a modification of the embodiment.

The modification differs from the fifth embodiment described above in that two p-type semiconductor layers 5553a1 and 5553a2 are located on the light-emitting layer 552. Otherwise, the modification is the same as the fifth embodiment.

As shown in FIG. 27, the image display device of the modification includes a subpixel group 520a. The subpixel group 520a includes a semiconductor layer 550a. The semiconductor layer 550a includes the n-type semiconductor layer 551, the light-emitting layer 552, and the p-type semiconductor layers 5553a1 and 5553a2. The n-type semiconductor layer 551, the light-emitting layer 552, and the p-type semiconductor layers 5553a1 and 5553a2 are stacked in this order from the inter-layer insulating film 112 toward the side of light-emitting surfaces 5553S1 and 5553S2.

The p-type semiconductor layers 5553a1 and 5553a2 are arranged to be separated along the X-axis direction on the light-emitting layer 552. The inter-layer insulating film 556 is located between the p-type semiconductor layers 5553a1 and 5553a2, and the p-type semiconductor layers 5553a1 and 5553a2 are separated by the inter-layer insulating film 556.

The p-type semiconductor layers 5553a1 and 5553a2 have substantially the same shape when projected onto the XY plane, and the shape is a substantially square or rectangular shape, and may be another polygonal shape, circular, etc.

The p-type semiconductor layers 5553a1 and 5553a2 respectively include the light-emitting surfaces 5553S1 and 5553S2. The light-emitting surfaces 5553S1 and 5553S2 are surfaces of the p-type semiconductor layers 5553a1 and 5553a2 exposed respectively through the openings 558-1 and 558-2.

Similarly to the shape of the light-emitting surface according to the fifth embodiment, the shapes of the light-emitting surfaces 5553S1 and 5553S2 when projected onto the XY plane are substantially the same shape, and are a shape such as substantially square, etc. The shapes of the light-emitting surfaces 5553S1 and 5553S2 are not limited to rectangular such as that of the embodiment, and may be circular, elliptical, polygonal such as hexagonal, etc. The shapes of the light-emitting surfaces 5553S1 and 5553S2 may be similar to the shapes of the openings 558-1 and 558-2, and may be different shapes.

The light-transmitting electrode 559a1 is located on the light-emitting surface 5553S1. The light-transmitting electrode 559a2 is located also on the light-emitting surface 5553S2. The p-type semiconductor layer 5553a1 that is connected to the light-emitting surface 5553S1 via the light-transmitting electrode 559a1 is connected to the wiring portion 560a1. The p-type semiconductor layer 5553a2 that is connected to the light-emitting surface 5553S2 via the light-transmitting electrode 559a2 is connected to the wiring portion 560a2.

Figure 28A:
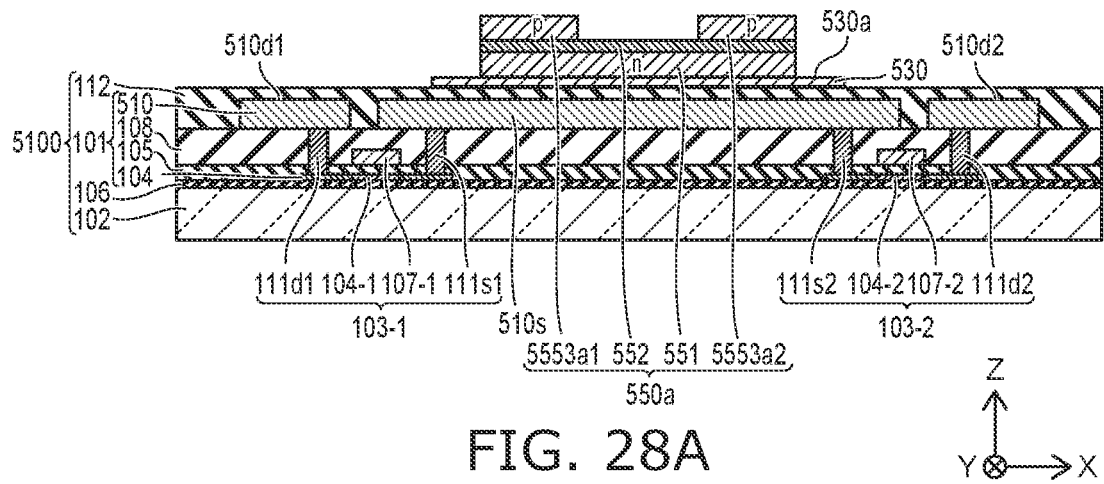
FIG. 28A is a schematic cross-sectional view illustrating a method for manufacturing the image display device of the modification of the fifth embodiment.
Figure 28B:
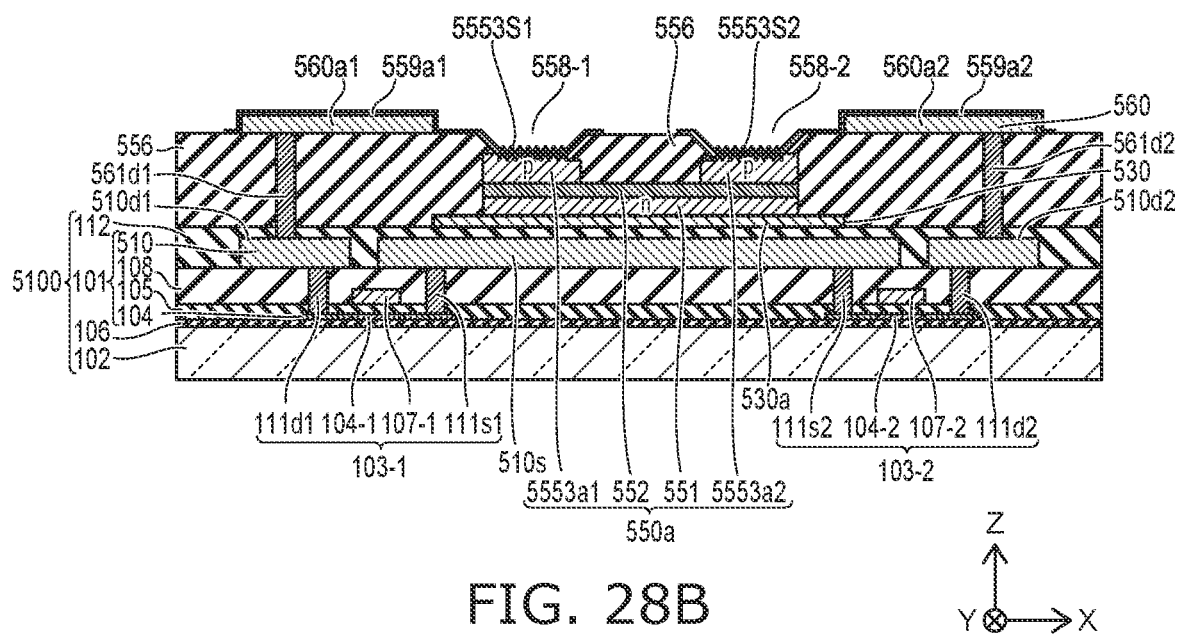
FIG. 28B is a schematic cross-sectional view illustrating the method for manufacturing the image display device of the modification of the fifth embodiment.

FIGS. 28A and 28B are schematic cross-sectional views illustrating a method for manufacturing the image display device of the modification.

According to the modification, processes similar to the processes described in reference to FIGS. 25A to 25B according to the fifth embodiment are employed up to the formation of the semiconductor layer 1150. Subsequent processes will now be described.

According to the modification as shown in FIG. 28A, the light-emitting layer 552 and the n-type semiconductor layer 551 are formed by etching the buffer layer 1140, the n-type semiconductor layer 1151, the light-emitting layer 1152, and the p-type semiconductor layer 1153; subsequently, the two p-type semiconductor layers 5553a1 and 5553a2 are formed by further etching. The buffer layer 1140 may be removed after forming the p-type semiconductor layers 5553a1 and 5553a2.

In FIG. 28A, the etching of the p-type semiconductor layers 5553a1 and 5553a2 is stopped when the light-emitting layer 552 is reached. The etching of the p-type semiconductor layers 5553a1 and 5553a2 may be performed to a deeper position. For example, the etching for forming the p-type semiconductor layers 5553a1 and 5553a2 may be performed to a depth that reaches the interior of the light-emitting layer 552 and the interior of the n-type semiconductor layer 551. Thus, when the p-type semiconductor layer is deeply etched, it is desirable for the light-emitting surfaces 5553S1 and 5553S2 of the p-type semiconductor layer described below to be inward of the end portions of the etched p-type semiconductor layers 5553a1 and 5553a2 by not less than 1 μm. The recombination current can be suppressed by the positions of the end portions of the p-type semiconductor layers 5553a1 and 5553a2 formed by the etching being distant to the light-emitting surfaces 5553S1 and 5553S2.

As shown in FIG. 28B, the inter-layer insulating film 556 that covers the inter-layer insulating film 112 and the semiconductor layer 550a is formed; subsequently, the vias 561d1 and 561d2 are formed. Also, the wiring layer 560 is formed, and the wiring portions 560a1 and 560a2, etc., are formed.

The semiconductor layer 1150 may be etched with the buffer layer 1140 as-is,

The openings 558-1 and 558-2 each are formed in the inter-layer insulating film 556. The light-emitting surfaces 5553S1 and 5553S2 of the p-type semiconductor layer exposed through the openings 558-1 and 558-2 each are roughened. Subsequently, the light-transmitting electrodes 559a1 and 559a2 are formed.

Thus, the subpixel group 520a that includes the two light-emitting surfaces 5553S1 and 5553S2 is formed.

According to the modification as well, similarly to the fifth embodiment, the number of light-emitting surfaces is not limited to two; three or more light-emitting surfaces may be provided in one semiconductor layer 550a.

Effects of the image display device of the embodiment will now be described.

Figure 29:
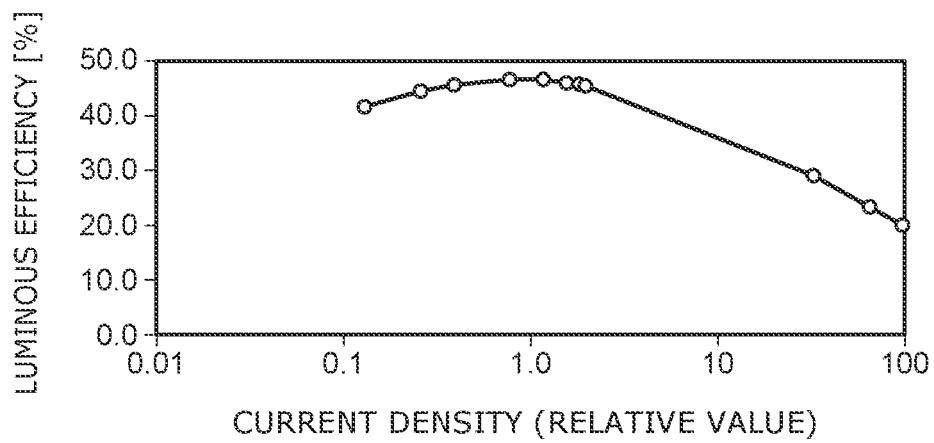
FIG. 29 is a graph illustrating a characteristic of a pixel LED element.

FIG. 29 is a graph illustrating a characteristic of a pixel LED element.

The vertical axis of FIG. 29 illustrates the luminous efficiency (%). The horizontal axis illustrates the current density of the current caused to flow in the pixel LED element as a relative value.

As shown in FIG. 29, the luminous efficiency of the pixel LED element is substantially constant or monotonously increases in the region in which the relative value of the current density is less than 1.0. The luminous efficiency monotonously decreases in the region in which the relative value of the current density is greater than 1.0. That is, an appropriate current density at which the luminous efficiency has a maximum exists in the pixel LED element.

It may be expected that a highly efficient image display device is realized by suppressing the current density so that a sufficient luminance is obtained from the light-emitting element. However, it is shown by FIG. 29 that there is a tendency for the current density to decrease and for the luminous efficiency to decrease for a low current density.

As described in the other embodiments described above, the light-emitting elements 150, 150a, 150-1, 150-2, and 350 are formed by individually singulating by etching or the like of all of the layers of the semiconductor layer 1150 that includes the light-emitting layers 152, 152-1, 152-2, and 352. At this time, the bonding surfaces between the light-emitting layers 152, 152-1, 152-2, and 352 and the n-type semiconductor layers 151, 151-1, 151-2, and 351 are exposed at the end portions. Similarly, the bonding surfaces between the light-emitting layers 152, 152-1, 152-2, and 352 and the p-type semiconductor layers 153, 153a, 153-1, 153-2, and 353 are exposed at the end portions.

When such end portions exist, electrons and holes recombine at the end portions. On the other hand, such recombination does not contribute to the light emission. The recombination at the end portions occurs substantially regardless of the current caused to flow in the light-emitting element. It is considered that the recombination occurs according to the lengths of the bonding surfaces that contribute to the light emission at the end portions.

When two light-emitting elements that have cubic shapes of the same dimensions emit light, the end portions are formed at four sides for each light-emitting element; therefore, recombination may occur at a total of eight end portions.

Conversely, according to the embodiment, there are four end portions in the semiconductor layers 550 and 550a that include two light-emitting surfaces. The region between the openings 558-1 and 558-2 substantially does not contribute to the light emission because few electrons and holes are injected; therefore, the end portions that contribute to the light emission can be considered to be six. Thus, according to the embodiment, by substantially reducing the number of end portions of the semiconductor layer, the recombination that does not contribute to the light emission can be reduced, and the reduction of the recombination current makes it possible to reduce the drive current.

When shortening the distance between the subpixels for higher definition or the like, when the current density is relatively high, etc., the distance between the light-emitting surfaces 553S1 and 553S2 becomes short in the subpixel group 520 of the fifth embodiment. In such a case, when the p-type semiconductor layer 553 is shared, there is a risk that a portion of the electrons injected into the adjacent light-emitting surface side may shunt, and the light-emitting surface at the side that is not driven may have a micro light emission. According to the modification, the p-type semiconductor layers 5553a1 and 5553a2 are separated for each of the light-emitting surfaces 5553S1 and 5553S2; therefore, the occurrence of a micro light emission at the light-emitting surface at the side that is not driven can be reduced.

According to the embodiment, the semiconductor layer that includes the light-emitting layer includes the n-type semiconductor layer, the light-emitting layer, and the p-type semiconductor layer stacked in this order from the inter-layer insulating film 112 side, and is favorable from the perspective of increasing the luminous efficiency by roughening the exposed surface of the p-type semiconductor layer. Similarly to the other embodiments described above, the p-type semiconductor layer, the light-emitting layer, and the n-type semiconductor layer may be stacked in this order by replacing the stacking order of the n-type semiconductor layer and the p-type semiconductor layer.

In all of the embodiments and modifications described above, the stacking order of the light-emitting element can be modified and applied according to the appropriate manufacturing procedure described above. For example, in the light-emitting element of the first embodiment, the p-type semiconductor layer, the light-emitting layer, and the n-type semiconductor layer can be stacked in this order from the first inter-layer insulating film 112 toward the light-emitting surface. Similarly, in the light-emitting element of the third embodiment, the n-type semiconductor layer, the light-emitting layer, and the p-type semiconductor layer can be stacked in this order from the first inter-layer insulating film 112 toward the light-emitting surface.

Sixth Embodiment

The image display device described above can be used as an image display module having the appropriate number of pixels in, for example, a computer display, a television, a portable terminal such as a smartphone, car navigation, etc.

Figure 30:
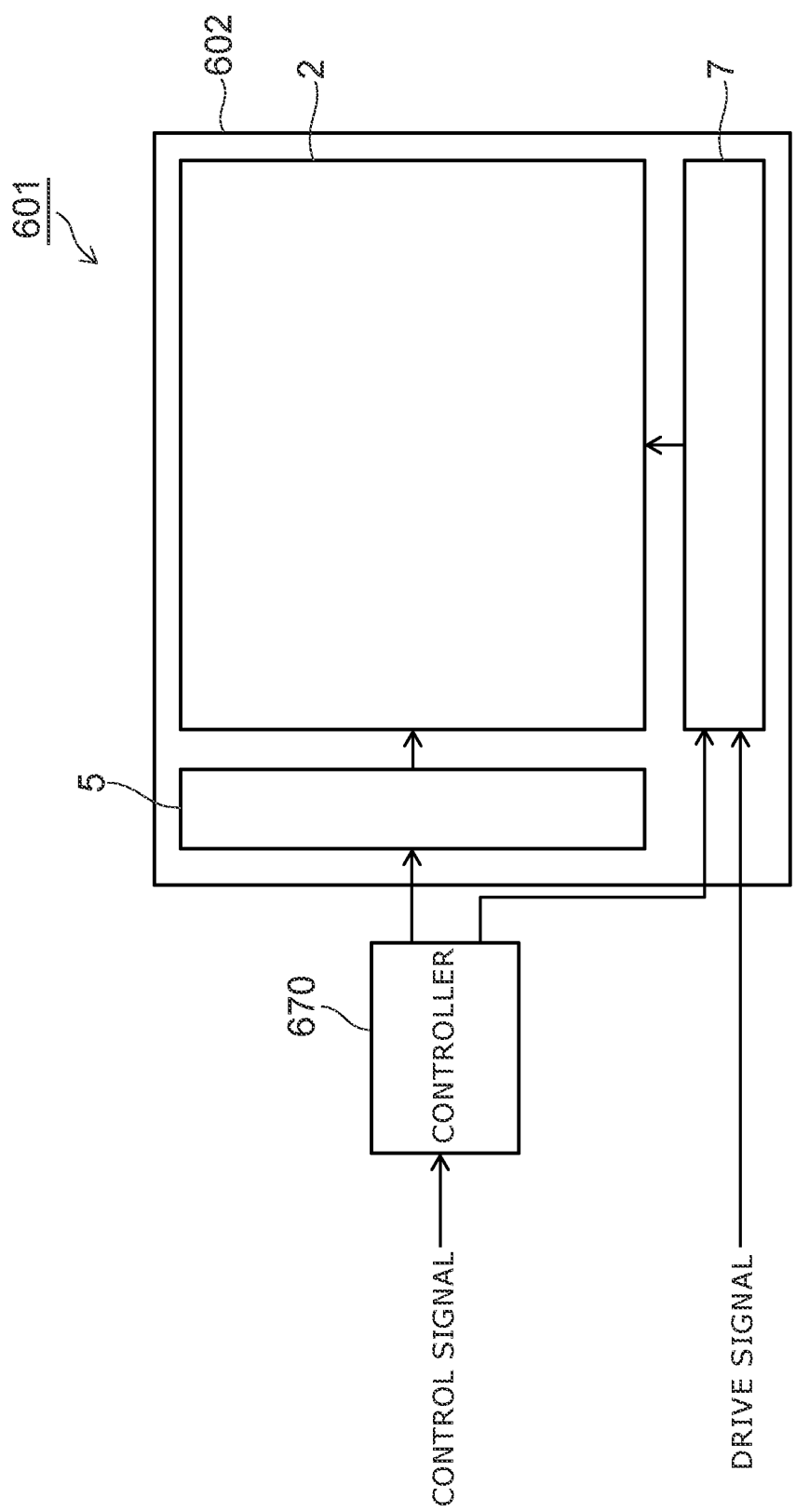
FIG. 30 is a block diagram illustrating an image display device according to a sixth embodiment.

FIG. 30 is a block diagram illustrating the image display device according to the embodiment.

Major parts of the configuration of a computer display are shown in FIG. 30.

As shown in FIG. 30, the image display device 601 includes an image display module 602. The image display module 602 is, for example, an image display device that includes the configuration according to the first embodiment described above. The image display module 602 includes the display region 2 in which the subpixels 20 are arranged, the row selection circuit 5, and the signal voltage output circuit 7. The image display device 601 may include the configuration according to any of the second to fifth embodiments.

The image display device 601 further includes a controller 670. The controller 670 receives input of control signals that are separated and generated by not-illustrated interface circuitry, and controls the driving and the drive sequence of the subpixels in the row selection circuit 5 and the signal voltage output circuit 7.

(Modification)

Figure 31:
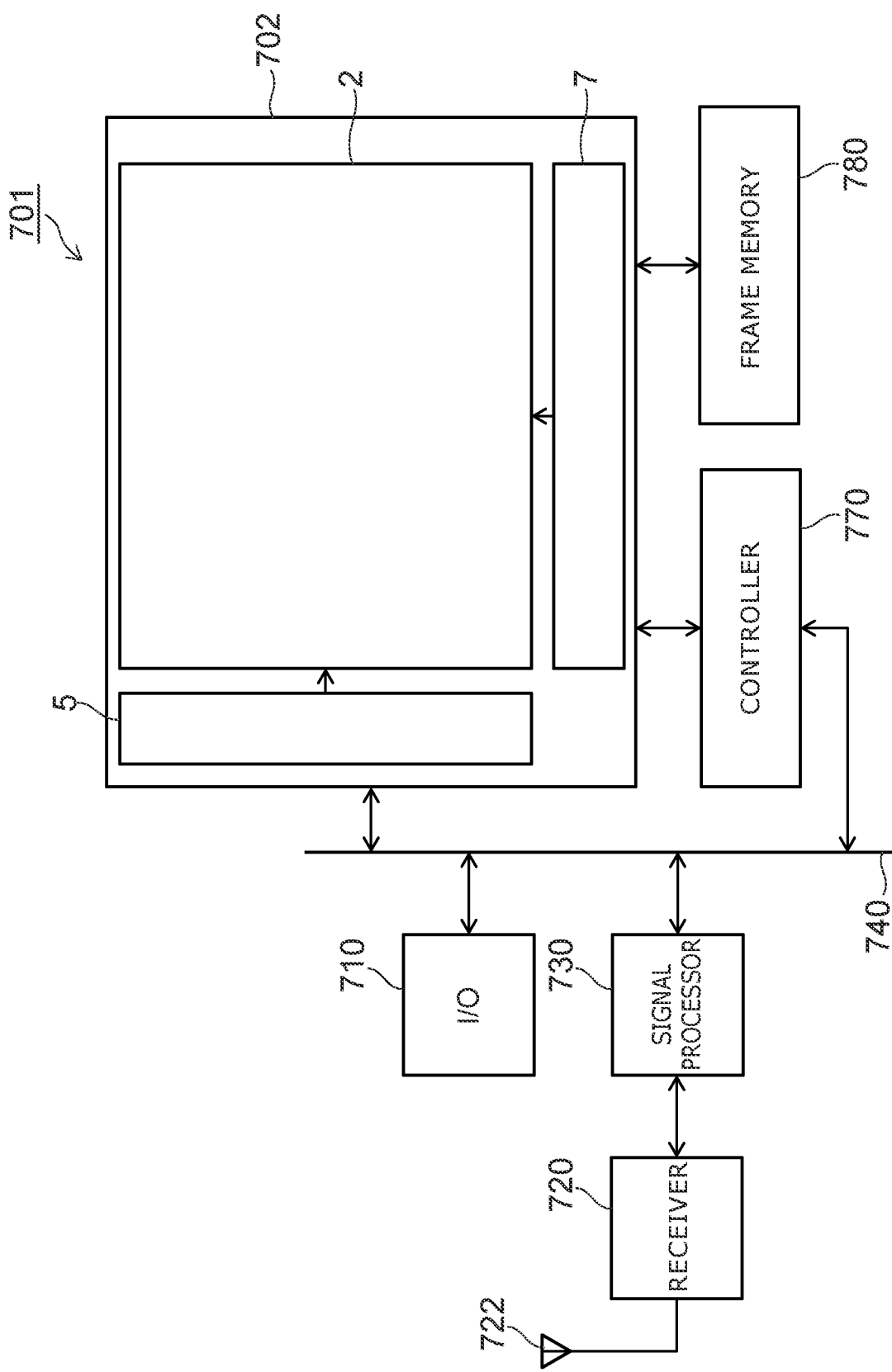
FIG. 31 is a block diagram illustrating an image display device according to a modification of the sixth embodiment.

FIG. 31 is a block diagram illustrating an image display device of the modification.

The configuration of a high-definition thin television is shown in FIG. 31.

As shown in FIG. 31, the image display device 701 includes an image display module 702. The image display module 702 is, for example, the image display device 1 that includes the configuration according to the first embodiment described above. The image display device 701 includes a controller 770 and a frame memory 780. Based on a control signal supplied by a bus 740, the controller 770 controls the drive sequence of the subpixels of the display region 2. The frame memory 780 stores one frame of display data and is used for smooth processing such as video image reproduction, etc.

The image display device 701 includes an I/O circuit 710. The I/O circuit 710 provides interface circuitry and the like for connecting with external terminals, devices, etc. The I/O circuit 710 includes, for example, a USB interface that connects an external hard disk device or the like, an audio interface, etc.

The image display device 701 includes a receiver 720 and the signal processor 730. An antenna 722 is connected to the receiver 720, and the necessary signal is separated and generated from the radio wave received by the antenna 722. The signal processor 730 includes a DSP (Digital Signal Processor), a CPU (Central Processing Unit), etc., and the signal that is separated and generated by the receiver 720 is separated and generated into image data, audio data, etc., by the signal processor 730.

Other image display devices also can be made by using the receiver 720 and the signal processor 730 as a high frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module according to the embodiment is not limited to the configuration of the image display device according to the first embodiment; modifications of the first embodiment or other embodiments may be used.

According to embodiments described above, a method for manufacturing an image display device and an image display device can be realized in which the transfer process of the light-emitting elements is shortened, and the yield is increased.

Figure 32:
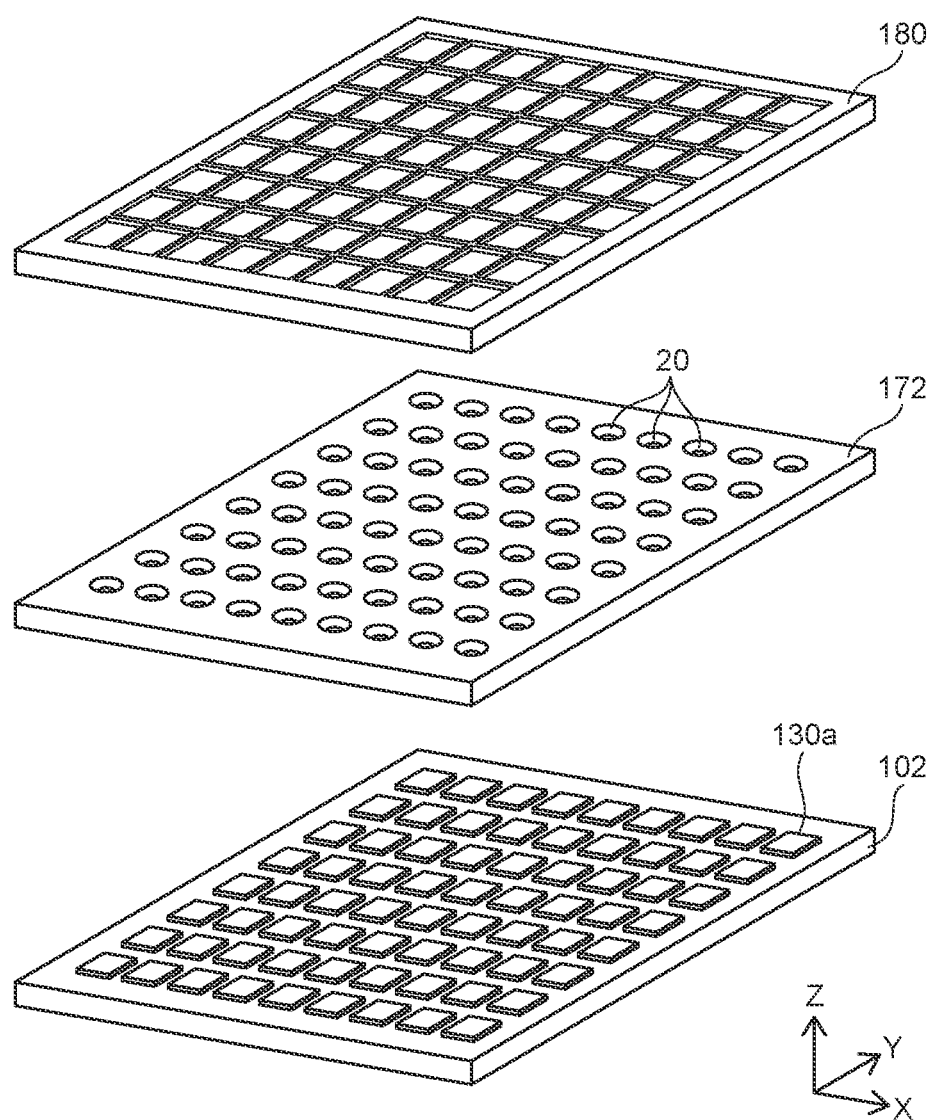
FIG. 32 is a perspective view schematically illustrating the image display device of the first to fifth embodiments and modifications of the first to fifth embodiments.

FIG. 32 is a perspective view schematically illustrating the image display device of the first to fifth embodiments and modifications of the first to fifth embodiments.

As shown in FIG. 32, the light-emitting circuit part 172 that includes many subpixels 20 is located on the substrate 102. The conductive layer 130 shown in FIG. 13 includes the light-reflecting plate 130a. The light-reflecting plate 130a is located in each of the subpixels 20 on the substrate 102. The color filter 180 is located on the light-emitting circuit part 172. According to the fifth embodiment, the structural component that includes the circuit board 100, the light-emitting circuit part 172, and the color filter 180 is used as the image display modules 602 and 702 and is embedded in the image display devices 601 and 701.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are within the scope and spirit of the inventions, and are within the scope of the inventions and equivalents recited in the claims. Also, embodiments described above can be implemented in combination with each other.

What is claimed is:

1. A method for manufacturing an image display device, the method comprising:
providing a second substrate that comprises a first substrate, and a semiconductor layer grown on the first substrate, the semiconductor layer comprising a light-emitting layer;
providing a third substrate comprising:
a circuit comprising a circuit element formed on a light-transmitting substrate,
a first insulating film covering the circuit, and
a conductive layer comprising a light-reflective part formed on the first insulating film;
bonding the semiconductor layer to the third substrate;
forming a light-emitting element from the semiconductor layer;
forming a second insulating film covering the conductive layer, the light-emitting element, and the first insulating film;
forming a via extending through the first and second insulating films; and
electrically connecting the light-emitting element and the circuit element by the via; wherein:
the light-emitting element is located on the light-reflective part; and
in a plan view, an outer perimeter of the light-emitting element, when projected onto the light-reflective part, is located within an outer perimeter of the light-reflective part.

2. The method according to claim 1, wherein:
the third substrate further includes a fourth substrate located between the light-transmitting substrate and the circuit;
the fourth substrate is flexible; and
the method further comprises removing the light-transmitting substrate after the step of bonding the semiconductor layer to the third substrate.

3. The method according to claim 2, wherein:
the light-transmitting substrate is a glass substrate.

4. The method according to claim 1, further comprising:
removing the first substrate before the step of bonding the semiconductor layer to the third substrate.

5. The method according to claim 1, further comprising:
removing the first substrate after the step of bonding the semiconductor layer to the third substrate.

6. The method according to claim 1, further comprising:
exposing, from under the second insulating film, a light-emitting surface of the light-emitting element opposite to a surface of the light-emitting element at a first insulating film side.

7. The method according to claim 6, the method further comprising:
forming a light-transmitting electrode at the exposed light-emitting surface.

8. The method according to claim 1, wherein:
the first substrate comprises silicon or sapphire.

9. The method according to claim 1, wherein:
the semiconductor layer comprises a gallium nitride compound semiconductor.

10. The method according to claim 1, the method further comprising:
forming a wavelength conversion member on the light-emitting element.

* * * * *